(12) United States Patent
Ichige et al.

(10) Patent No.: US 7,498,630 B2
(45) Date of Patent: Mar. 3, 2009

(54) NONVOLATILE SEMICONDUCTOR MEMORY

(75) Inventors: Masayuki Ichige, Yokohama (JP); Koji Hashimoto, Yokohama (JP); Tatsuaki Kuji, Fukaya (JP); Seiichi Mori, Ota-ku (JP); Riichiro Shirota, Fujisawa (JP); Yuji Takeuchi, Yokohama (JP); Koji Sakui, Setagaya-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/559,785

(22) Filed: Nov. 14, 2006

(65) Prior Publication Data

US 2007/0070708 A1    Mar. 29, 2007

Related U.S. Application Data

(60) Continuation of application No. 11/008,531, filed on Dec. 10, 2004, now Pat. No. 7,141,474, which is a division of application No. 10/359,216, filed on Feb. 6, 2003, now Pat. No. 6,845,042.

(30) Foreign Application Priority Data

Feb. 5, 2003    (JP)    ............................. 2003-028413

(51) Int. Cl.
    *H01L 29/76*    (2006.01)
(52) U.S. Cl. ...................... 257/314; 257/316; 257/319; 257/E21.069; 257/E21.103; 438/258; 438/593; 365/185.17
(58) Field of Classification Search ......... 257/314–319, 257/E21.682, E27.103; 438/257, 593
    See application file for complete search history.

(56) References Cited

U.S. PATENT DOCUMENTS 5,680,347 A    10/1997    Takeuchi et al.

(Continued)

FOREIGN PATENT DOCUMENTS

JP    4-163797    6/1992

(Continued)

OTHER PUBLICATIONS

K. -D. Suh, et al., IEEE Journal of Solid State Circuits, vol. 30, No. 11, pp. 1149-1165, "A 3.3 V 32 Mb NAND Flash Memory With Incremental Step Pulse Programming Scheme", Nov. 1995.

(Continued)

*Primary Examiner*—Dung A. Le
(74) *Attorney, Agent, or Firm*—Oblon, Spivak, McClelland, Maier & Neustadt, P.C.

(57) ABSTRACT

A nonvolatile semiconductor memory which is configured to include a plurality of word lines disposed in a row direction; a plurality of bit lines disposed in a column direction perpendicular to the word lines; memory cell transistors having a charge storage layer, provided in the column direction and an electronic storage condition of the memory cell transistor configured to be controlled by one of the plurality of the word lines connected to the memory cell; a plurality of first select transistors, each including a gate electrode, selecting the memory cell transistors provided in the column direction, arranged in the column direction and adjacent to the memory cell transistors at a first end of the memory cell transistors; and a first select gate line connected to each of the gate electrodes of the first select transistors.

20 Claims, 51 Drawing Sheets

U.S. PATENT DOCUMENTS

| | | |
|---|---|---|
| 5,698,879 A | 12/1997 | Aritome et al. |
| 5,936,887 A | 8/1999 | Choi et al. |
| 6,147,911 A | 11/2000 | Takeuchi et al. |
| 6,512,263 B1 * | 1/2003 | Yuan et al. .................. 257/316 |
| 2002/0175364 A1 | 11/2002 | Ichige et al. |
| 2003/0094635 A1 | 5/2003 | Yaegashi |
| 2003/0206443 A1 | 11/2003 | Sakui et al. |

FOREIGN PATENT DOCUMENTS

| | | |
|---|---|---|
| JP | 6-230855 | 8/1994 |
| JP | 7-302499 | 11/1995 |
| JP | 8-64699 | 3/1996 |
| JP | 8-115987 | 5/1996 |
| JP | 9-91971 | 4/1997 |
| JP | 9-139483 | 5/1997 |
| JP | 11-54732 | 2/1999 |
| JP | 11-163303 | 6/1999 |
| JP | 11-186528 | 7/1999 |
| JP | 2000-114498 | 4/2000 |
| JP | 2000-188384 | 7/2000 |
| JP | 2000-223596 | 8/2000 |
| JP | 2001-15615 | 1/2001 |
| JP | 2001-24163 | 1/2001 |
| JP | 2002-56369 | 2/2002 |
| JP | 2002-176114 | 6/2002 |
| WO | WO 99/17294 | 4/1999 |

OTHER PUBLICATIONS

Y. Iwata, et al., IEEE Journal of Solid State Circuits, vol. 30, No. 11, pp. 1157-1164, "A 35 NS Cycle Time 3.3 V Only 32 Mb NAND Flash EEPROM", Nov. 1995.

* cited by examiner

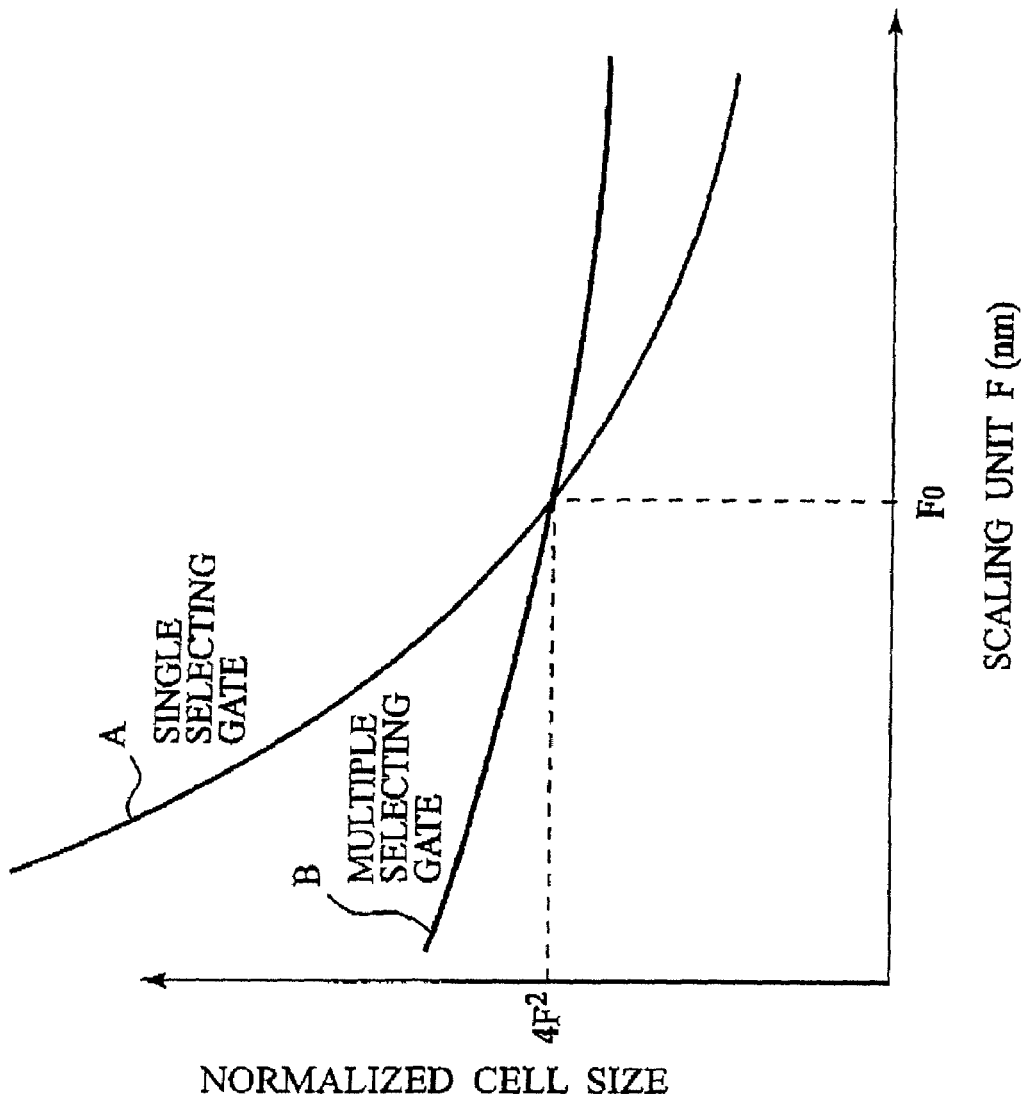

FIG. 5A
FIG. 5B
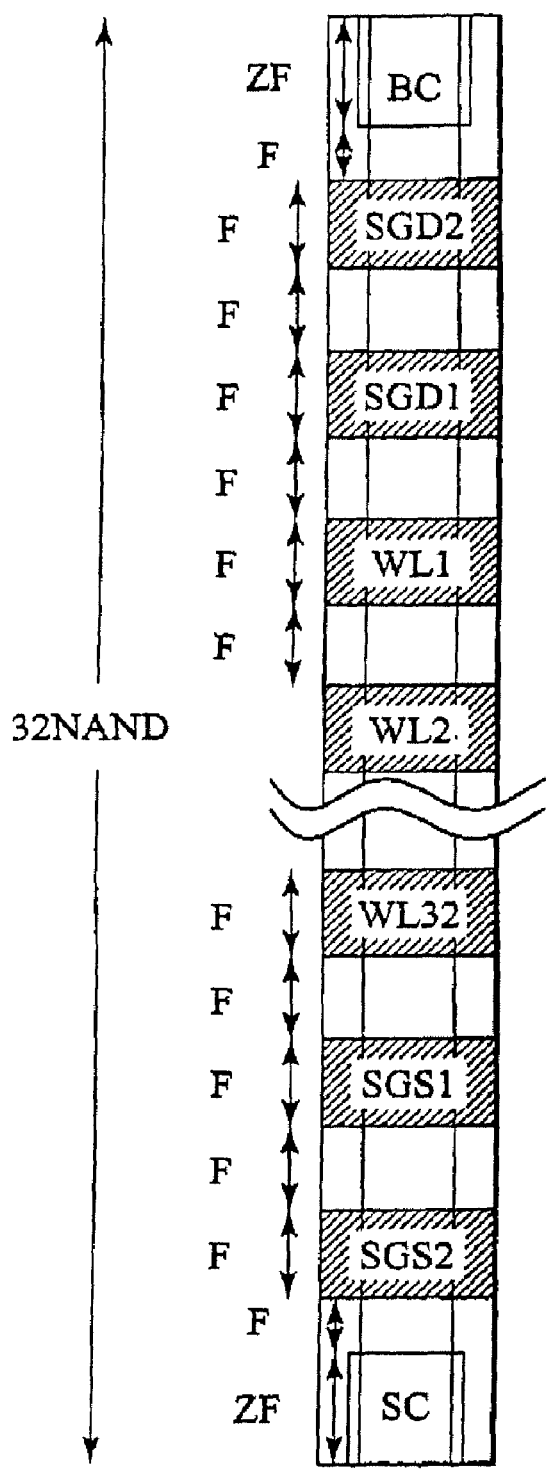
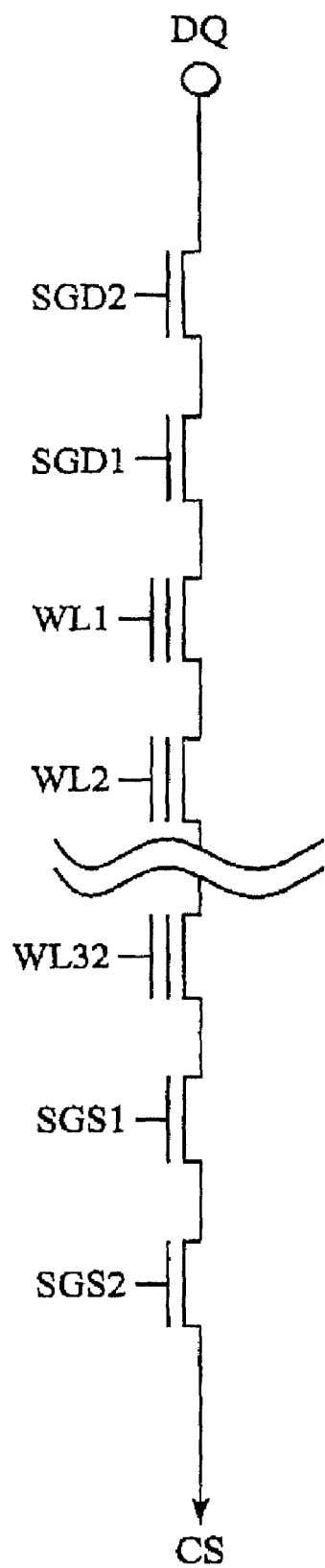

MEMORY CARD 60
OR CARD HOLDER 80

US 7,498,630 B2

NONVOLATILE SEMICONDUCTOR MEMORY

CROSS REFERENCE TO RELATED APPLICATIONS

The present application is a continuation of U.S. application Ser. No. 11/008,531, now U.S. Pat. No. 7,141,474, filed Dec. 10, 2004, which is a divisional of U.S. application Ser. No. 10/359,216, filed on Feb. 6, 2003, which is now U.S. Pat. No. 6,845,042. This application is also based upon and claims the benefit of prior Japanese Patent Applications P2003-28413 filed on Feb. 5, 2003 and P2001-238674 filed on Aug. 7, 2001; the entire contents of which are incorporated by reference herein.

BACKGROUND OF THE INVENTION

1. Field of the Invention

The present invention relates to a semiconductor memory device. In particular, the invention relates to a minute nonvolatile semiconductor memory device, fabrication method for the same, semiconductor integrated circuits and systems which include a memory cell unit (NAND cell) that is configured with a plurality of memory cells connected to each other, and select transistors doped with impurities in their respective channel regions.

2. Description of the Related Art

Conventionally, for example, an electrically erasable programmable read-only memory (EEPROM), which electrically writes and erases data, is known as a nonvolatile semiconductor memory device. In the EEPROM, in particular when it is a NAND type, a memory cell array is configured by arranging memory cells at the respective points of intersecting column lines and row lines. A MOS transistor having a stacked gate structure configured by stacking layers of a floating gate and a control gate is used as a memory cell.

The EEPROM includes an electrically erasable flash memory. Much of the flash memory in use is NAND flash memory with highly increased integration.

A representative memory cell of a NAND flash memory is described, for example, in R. Shirota, "A Review of 256 M-bit NAND Flash Memories and NAND Flash Future Trend", Non-Volatile Semiconductor Memory Workshop (NVSMW) 2000, pp 22-31.

The nonvolatile semiconductor memory device has a circuit configuration such as that shown in the circuit diagram of FIG. 1. As shown in FIG. 1, in the memory cell unit of the NAND flash memory, a plurality of, for example, sixteen memory cell transistors M0 to M15 form a memory block 70, which is indicated by the region enclosed by the dotted line. The memory cells are connected in series with a bit line side select transistor SG1 connected to one side and a source line side select transistor SG2 connected to the other.

Each word line WL0 to WL15 makes a one-to-one connection to the gates of memory cell transistors M0 to M15, respectively. A select gate line SGD is connected to the gate of the bit line side select transistor SG1. A select gate line SGS is connected to the gate of the source line side select transistor SG2.

The source of the bit line side select transistor SG1 is connected to a bit line DQ which functions as a data line. The source of the source line side select transistor SG2 is connected to a common source line CS.

While not shown in the figures, a plurality of NAND strings 70 are connected in the direction in which the bit line DQ extends. In addition, a plurality of NAND strings 70 with the same circuit configuration are formed for every bit line DQ in the direction in which word line WL0, WL1, WL2, . . . , WL15 extend.

A plurality of NAND strings 70 are vertically connected in series with contacts provided at the respective ends of the NAND strings to give a plurality of consecutive configurations where memory cell transistors are connected via the bit line side select transistor SG1 and the source line side select transistor SG2, on both ends.

A plurality of word lines WL0, WL1, WL2, . . . , WL15 for memory cell gates are arranged in lines parallel to each other. At each end of the plurality of memory cell gates, respective select gate lines SGD and SGS are formed in lines parallel to each other, and parallel to the word lines WL0, WL1, WL2, . . . , WL15 for memory cell gates. In this case, the memory cell transistors M0, M1, M2, . . . , M15 have equal gate lengths, respectively. In addition, each of the pairs of the select gate transistors SG1, SG2 on both sides of the memory cell transistors M0, M1, M2, . . . , M15 have the same gate length, and the gate length of the select gate transistors SG1, SG2 is generally formed so as to be longer than the gate length of the memory cell transistor.

Spaces F (F being the minimum fabrication dimension) having the same width are formed between a plurality of word lines WL0, WL1, WL2, . . . , WL15 for memory cell gates. This space F is equal to the gate length of the memory cell gate. Moreover, the spaces F, which equal the spaces F between the memory cell gates, are formed between the select gate and memory cell gate adjacent to the select gate.

Device activation regions are formed parallel to each other and perpendicular to the direction in which the memory cell transistors M0, M1, M2, . . . , M15 extend. Such device activation regions are segmented into multiple regions by a plurality of device isolation regions formed parallel to each other and perpendicular to the memory cell gate.

In this case, one NAND string is configured by forming a pair of individual select gates at each end of a plurality of, for example, sixteen memory cell gates. Another NAND string is formed on the end of this NAND string providing a space of approximately 2F, which is approximately twice the space F formed between the memory cell gates. In this case, contacts are formed above the device activation regions between neighboring select gates of the NAND strings.

In this manner, all gate lengths are formed with uniform lines and spaces, and arranged with the same pitch within the memory cell unit. In addition, the channel length of the select gate is miniaturized so as to be the same size as that of the memory cell gate. The select gate is configured from two adjacent gates and functions as a select transistor. In this case, in the conventional nonvolatile semiconductor memory device, since the select gate length itself is approximately 2F and is on both the source side and drain side, which provides a space of approximately 4F, then adding the space separating the neighboring select gates of another memory cell gate of approximately 2F to this gives a total space of approximately 6F. Generally, the select gate is longer than the gate length of the memory cell transistor, effectively preventing degradation in the cut-off characteristics of a transistor due to a short-channel effect.

As shown in FIG. 1, a plurality of memory cell transistors connected in series can provide a NAND cell (a memory cell unit). The source and drain regions of each memory cell are connected in series through diffused regions fabricated in the memory device substrate region.

However, there are problems with the above conventional nonvolatile semiconductor memory device. The configuration described above results in the NAND strings having irregular lines/spaces in their select gate sections, which causes fabrication margins to decrease when patterning the select gates with lithography, as micro- and/or nano-fabrication continues to progress. When designed with irregular patterns, there may be limits placed on miniaturization. In other words, if the minimum line width based on the limits of microscopic processing technology is given as F, the gate lengths of memory cell transistors, gate intervals of memory cell transistors, and spaces between the gates of the memory cell transistors and the gates of the select transistors are all formed so as to have the width F. However, the gate width of the select transistors is formed so as to be wider than F, such as 2F, to improve cut-off characteristics. This results in the presence of irregular line widths and space widths. In other words, in the case where the lines/spaces of the memory cell gates are 1F and the gate length of the lines/spaces of the select gates is approximately 2F, the gate length for the memory cell gates adjacent to the select gates is over-etched during lithography in the manufacturing process. Accordingly, the memory cell gates cannot be formed to the desired length, and the required characteristics cannot be obtained. Therefore, there is no other option except to design all gate lengths with a value larger than the minimum line width F, which results in an increased surface area for the memory cell transistor region.

Moreover, there are times when the result is a NAND flash memory cell unit structure where the control gates (word lines) adjacent to the select transistors are fabricated longer or shorter than the desired value. This is because the regular pattern of word line gate lengths and spaces, being broken near the select transistor, makes uniform processing impossible. That is, if the control gates (word lines) near the select transistor are longer or shorter than the desired value, the characteristics of that memory cell differ from the characteristics of other memory cells, which affects write/erase/read operations and invites problems in terms of reliability.

In addition, if the regular patterns are broken, problems, such as a breakdown of the resist during the developing process of the resist after photolithography processing, can give rise to an electrical shorting problem between the adjacent gate electrodes.

SUMMARY OF THE INVENTION

In order to solve the above problems, a first aspect of the present invention inheres in a nonvolatile semiconductor memory comprising: a plurality of word lines disposed in a row direction; a plurality of bit lines disposed in a column direction perpendicular to the word lines; memory cell transistors having a source region, a drain region, a gate electrode and a charge storage layer, provided in the column direction and an electronic storage condition of the memory cell transistor configured to be controlled by one of the plurality of the word lines connected to the memory cell; a plurality of first select transistors, each including a gate electrode, selecting the memory cell transistors provided in the column direction, arranged in the column direction and adjacent to the memory cell transistors at a first end of the memory cell transistors; and a first select gate line connected to each of the gate electrodes of the first select transistors.

A second aspect of the present invention inheres in a semiconductor integrated circuit, comprising, a semiconductor chip; a semiconductor memory mounted on the semiconductor chip comprising: a plurality of word lines disposed in a row direction; a plurality of bit lines disposed in a column direction perpendicular to the word lines; memory cell transistors having a charge storage layer, disposed in the column direction and an electronic storage condition of the memory cell transistor configured to be controlled by one of the plurality of the word lines connected to the memory cell; a plurality of first select transistors selecting the memory cell transistors, arranged in the column direction and adjacent to the memory cell transistors at a first end of the memory cell transistors; and a first select gate line connected to each of the gate electrode of the first select transistors; and a logic circuit mounted on the semiconductor chip to control the semiconductor memory.

A third aspect of the present invention inheres in a system for storing information and for accessing a storage medium comprising: a memory card including a semiconductor memory comprises, a plurality of word lines disposed in a row direction; a plurality of bit lines disposed in a column direction perpendicular to the word lines; memory cell transistors having a charge storage layer, disposed in the column direction and an electronic storage condition of the memory cell transistor configured to be controlled by one of the plurality of the word lines connected to the memory cell; a plurality of first select transistors selecting the memory cell transistors, arranged in the column direction and adjacent to the memory cell transistors at a first end of the memory cell transistors; and a first select gate line connected to each of the gate electrode of the first select transistors.

A fourth aspect of the present invention inheres in a system for storing information and for accessing a storage medium comprising: an IC card board; a semiconductor memory disposed on the IC card board, comprising: a plurality of word lines disposed in a row direction; a plurality of bit lines disposed in a column direction perpendicular to the word lines; memory cell transistors having a charge storage layer, disposed in the column direction and an electronic storage condition of the memory cell transistor configured to be controlled by one of the plurality of the word lines connected to the memory cell; a plurality of first select transistors selecting the memory cell transistors disposed in the column direction, arranged in the column direction and adjacent to the memory cell transistors at a first end of the memory cell transistors disposed in the column direction; and a first select gate line connected to each of the gate electrodes of the first select transistors.

A fifth aspect of the present invention inheres in a method for fabricating a nonvolatile semiconductor memory comprising: sequentially forming a gate insulating layer and a first conductive layer of a floating gate on a semiconductor substrate after forming a channel ion implantation layer near a surface of the semiconductor substrate; depositing an inter-gate insulating layer with an ONO layer structure; forming a select transistor channel diffused layer by an ion implantation process after patterning part of a planned channel region of a plurality of select transistors by utilizing a lithography process and forming an opening; depositing a control gate electrode material after etching of the inter-gate insulating layer in the opening; and forming a source/drain diffused layer by an ion implantation process of implanting impurity ions into the semiconductor substrate after patterning a stacked gate layer by utilizing a lithography process and etching the stacked gate layer and forming a gate electrode of a memory cell transistor and a gate electrode of the plurality of the select transistors.

BRIEF DESCRIPTION OF DRAWINGS

FIG. 4 is a graph illustrating the relationship between a normalized cell size and the scaling unit F (nm) when taking scaling rules into consideration, that is, a comparative diagram comparing an example of a single select gate (line A) and an example of multiple select gates (line B) in the NAND flash memory;

FIG. 5A is a schematic block diagram showing the planar layout pattern of a NAND flash memory according to a first embodiment of the present invention;

FIG. 5B is a circuit diagram of the NAND flash memory configuration in FIG. 5A;

DETAILED DESCRIPTION OF THE INVENTION

Figure 1:
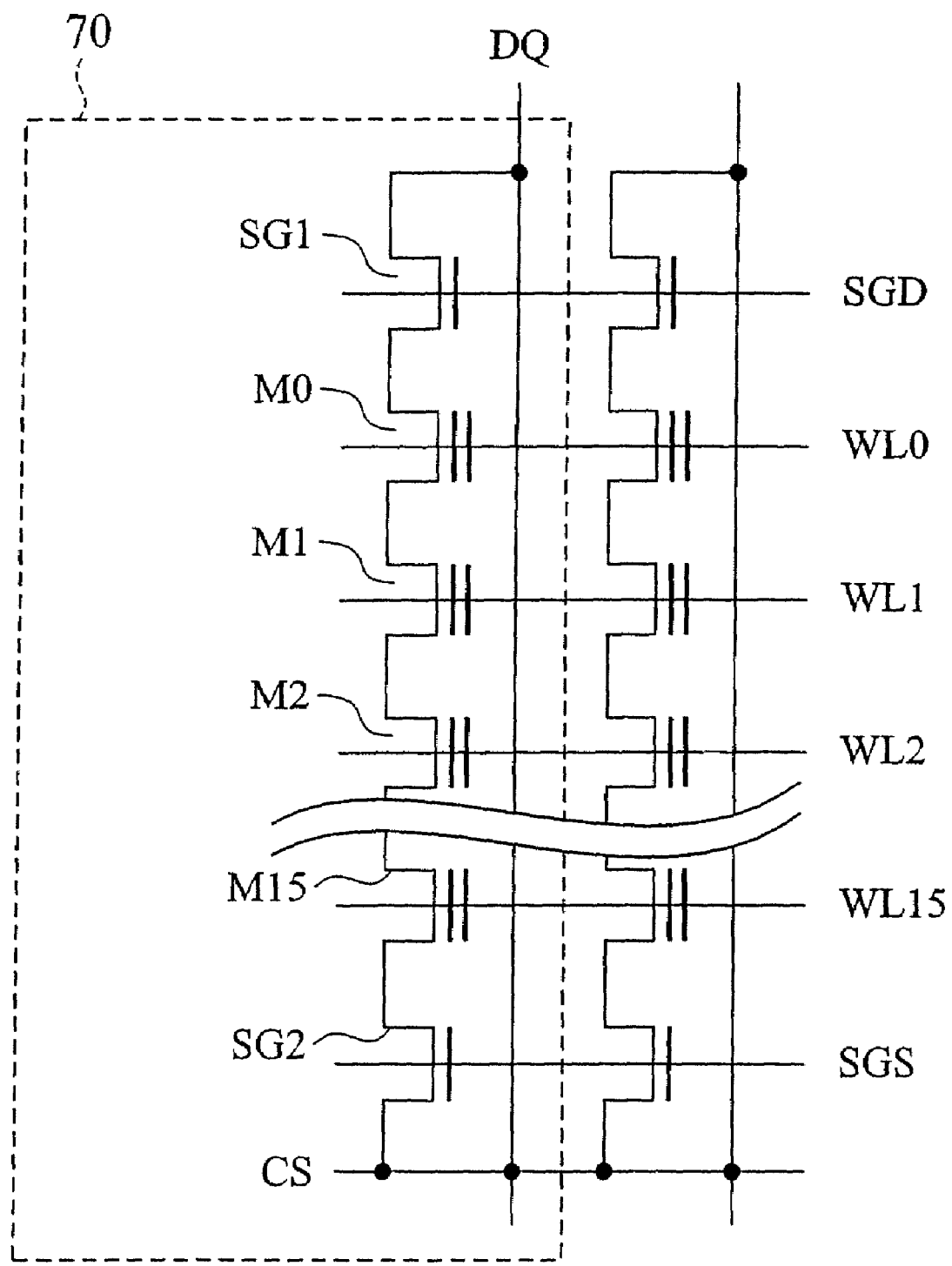
FIG. 1 is a schematic circuit diagram of a NAND flash memory given as an example of a conventional nonvolatile semiconductor memory device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Next, a description will be given of the embodiments of the present invention with reference to the drawings. The same or similar reference numerals are given for the same or similar parts in the following drawings. The embodiments shown below exemplify an apparatus or a method for embodying technical ideas of the present invention. The technical ideas are not intended to be limited by the structures, arrangements, or the like of the components described below. Various modifications can be added to the technical ideas of the present invention within the scope of claims.

Comparative Example

Figure 2:
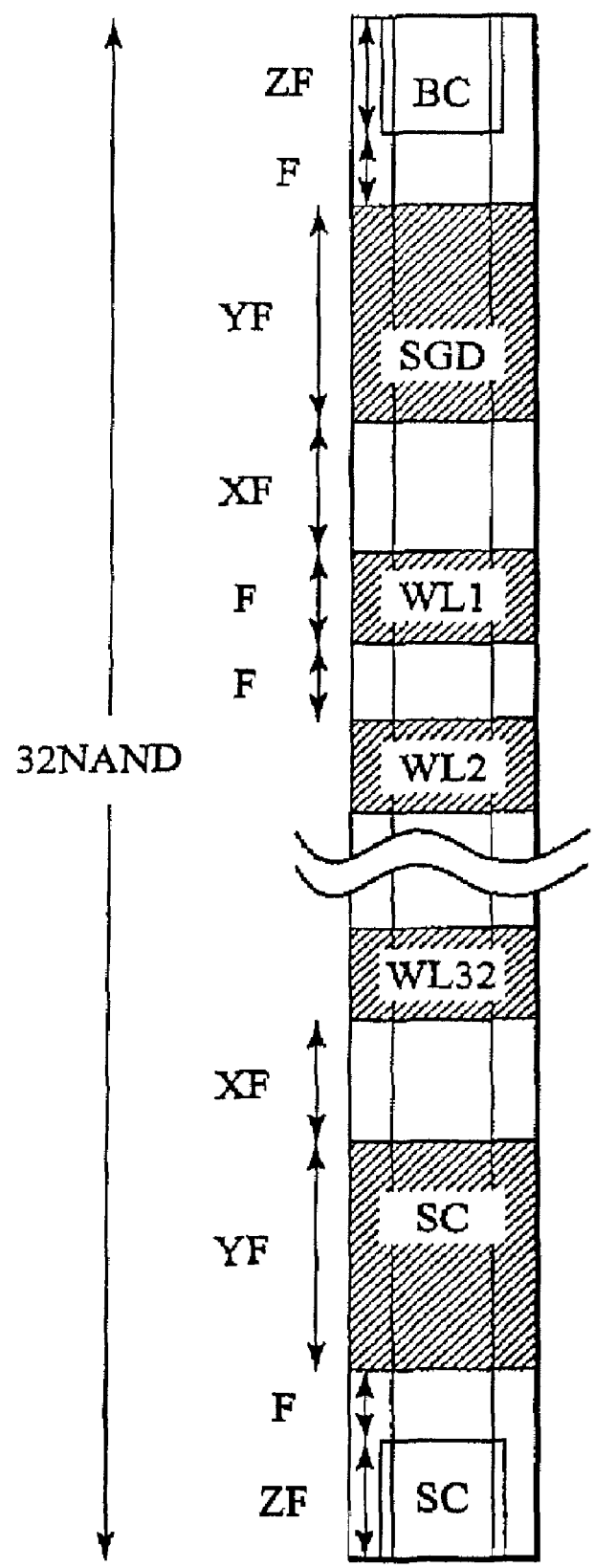
FIG. 2 is a schematic planar layout pattern configuration of an NAND flash memory given as a comparative example of the present invention.

A scaling or design rule for NAND flash memory is described forthwith. When miniaturizing such NAND flash memory cells, for instance taking as an example the case where the design rule F is set to 0.09 μm as shown in FIG. 2, the gate length of the bit line side select gate line SGD is Y F, and the gate length of the source line side select gate line SGS is also Y F. Accordingly, these gate lengths are longer than the gate lengths F of the control gates (word lines) WL1 through WL32. In addition, the space X F between the word line WL1, which is located closest to the bit line DQ, and the bit line side select gate line SGD, and the space X F between the word line WL32, which is located closest to the source line CS, and the source line side select gate line SGS are wider than the space F between the word lines.

This is because the gate lengths Y F of the bit line side select gate line SGD and source line side select gate line SGS are longer than the gate lengths F of the control gates (word lines) WL1 through WL32 in order to improve the punch-through immunity of both select transistors SG1 and SG2. This is also to prevent the channel electric potential, which has caused the NAND strings from becoming write-restricted, from increasing due to capacitive coupling during a write-in and from decreasing as a result of a leakage current flowing through the select transistors SG1 and SG2. If the select transistors SG1 and SG2 cause punch-through and the write-restricted electric potential is decreased, erroneous write-in may occur in a cell that should not be written. In addition, the space X F between the word line WL1, which is located closest to the bit line DQ, and the bit line side select gate line SGD, and the space X F between the word line WL32, which is located closest to the source line CS, and the source line side select gate line SGS are each wider than the space F between the word lines. This is so that the fabrication margins for the non-periodical layout pattern of the word lines can be improved so as to obtain a sufficient cut-off characteristic of the select gate transistors. Thereby, a tendency that the gate lengths of the bit line side select gate line SGD and source line side select gate line SGS are longer than the control gates (word lines) WL1 through WL32, and a space between the word line WL1 which is located nearest to the bit line DQ and the bit line side select gate line SGD and a space between the word line WL32 which is located nearest to the source line CS and the source line side select gate line SGS are wider than the space between the word lines is more pronounced. It should be noted that BC and SC are a bit line contact hole and source line contact hole, respectively.

Figure 3:
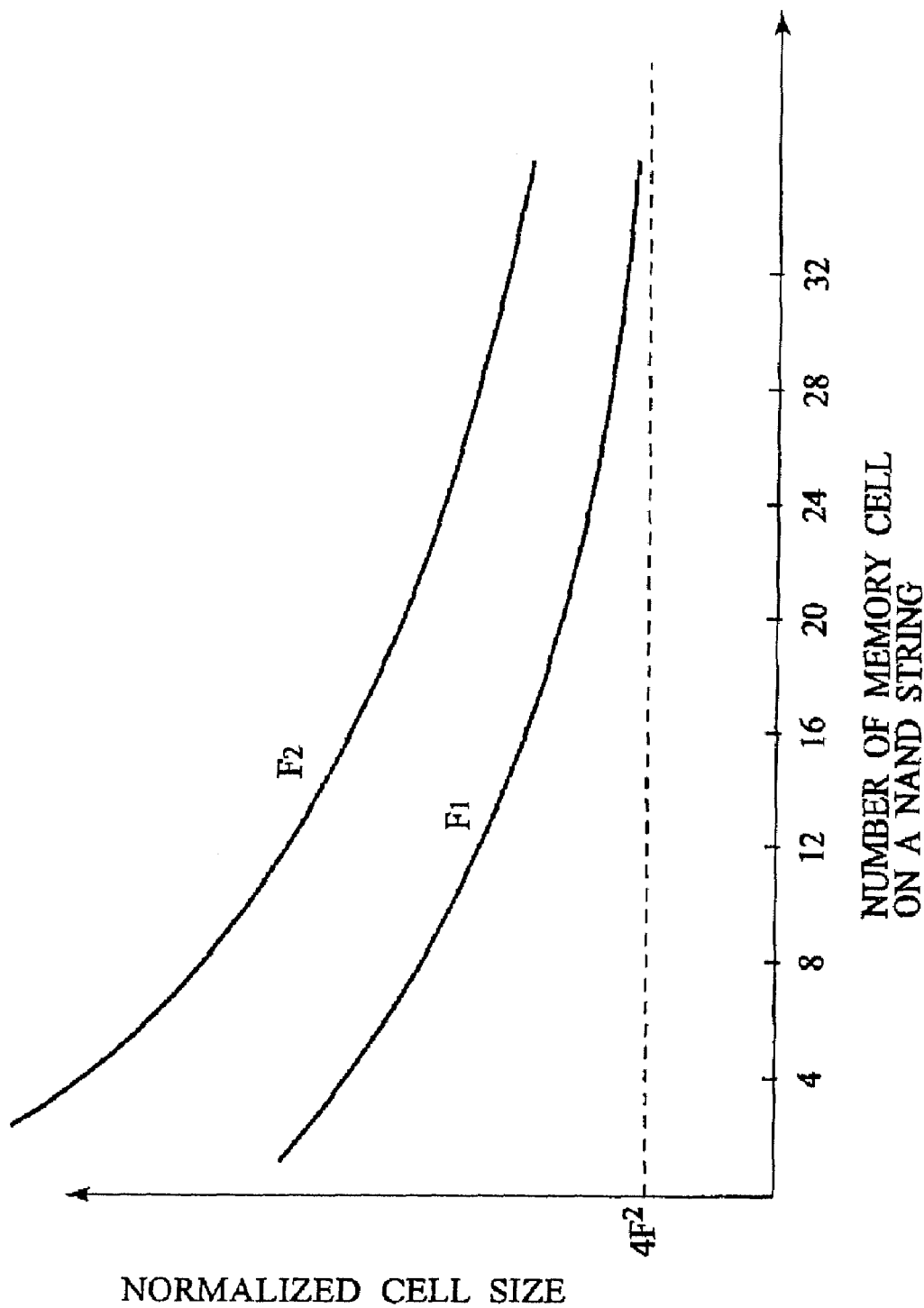
FIG. 3 is a graph illustrating the relationship between a normalized cell size and the number of NAND strings in the NAND flash memory taking into consideration scaling rules.

The relationship between normalized cell size and the number of memory cells in a NAND string that is generally found in NAND flash memory is shown in FIG. 3. A cell size of one transistor is 4 $F^2$, where the value of F indicates a scaling unit for the minimum fabrication dimension. $F_1$ and $F_2$ refer to scaling rules, wherein $F_2$ is greater than $F_1$. For example, the value of $F_1$ and $F_2$ is equal to 0.4 μm and 0.13 μm, respectively. Since the select gate region cannot be formed with the same design rule as the memory cell region, the surface area of the select gate region is relatively larger in comparison with miniaturization of the memory cell region. Accordingly, further miniaturization of the scaling rule, causes the surface area effect to be manifestly more pronounced in the select gate.

In addition, in the case where there are many memory cells on the NAND string, a tendency of one transistor to approach the cell size 4 $F^2$ may be seen because of the surface area effect in the select gate region being low in comparison with that in the memory cell region. Nevertheless, if the number of memory cells in the NAND strings decrease and miniaturization progresses further, the normalized cell size increases drastically.

Therefore, in the first embodiment of the present invention, a technology to suppress an increase in memory cell size is discussed using a structure where two select gate lines, and different electric potential is supplied to each, respectively. The second embodiment of the present invention corresponds to a case where two select gate lines, and equal electric potential is supplied to each, respectively. The third embodiment of the present invention corresponds to a case where there are three select gates, and equal electric potential or different electric potential is supplied to each. Moreover, the fourth embodiment of the present invention corresponds to system application examples of the nonvolatile semiconductor memory devices of the first through third embodiment of the present invention, such as memory cards and IC (interface circuit) cards etc.

First Embodiment

The first embodiment corresponds to a case where there are two select gates, and different electric potential is supplied to each gate.

FIG. 5A and FIG. 5B show a planar view of an NAND flash memory cell unit according to an embodiment of the present invention and an equivalent circuit, respectively. In this example, 0.09 μm is used as the design rule F. The gate lengths of bit line side select gate lines SGD1 and SGD2, source line side select gate lines SGS1 and SGS2, and control gates (word lines) WL1 through WL32 are identically equal to F (=90 nm). Identically, the spaces of lines among the bit line side select gate lines SGD1 and SGD2, source line side select gate lines SGS1 and SGS2, and control gates (word lines) WL1 through WL32 are also F (=90 nm). In this case, the present invention is also applicable when the gate lengths and the space between lines are different by setting the gate lengths of the bit line side select gate lines SGD1, SGD2, source line side select gate lines SGS1, SGS2, control gates (word lines) WL1 through WL32 to 100 nm, and the space between the lines to 80 nm. FIG. 5A and FIG. 5B show an example of connecting thirty-two memory cells in series. The length of this thirty-two NAND string is 6.59 μm, which is approximately the same size as the conventional case of 6.58 μm where the select transistors are integrated as one (FIG. 2). Nevertheless, as further miniaturization advances and the design rule becomes for example 0.07 μm or 0.055 μm, the present invention, where the gate of the select transistor is divided into two—is shorter as far as the length of the NAND strings is concerned. As a result, the chip size may be minimized, and achieve cost reductions in addition to process and reliability improvements. Moreover, a contact hole BC for the bit line DQ is opened at an upper side of the bit line select gate line SGD2, and a contact hole SC for the source line CS is opened at a lower side of the source line select gate line SGS2

In addition, since the select transistors on both the bit line side and source line side are configured with two gates, the punch-through immunity may be improved even if the gate length is not increased. That is because the voltage is divided for the first and second select transistors since the two select transistors are substantially connected in series, and therefore a high electric field is not applied between the drain and source of each select transistor. As a result, there is no need to increase the gate lengths of the first and second select transistors respectively, which allows the gate lengths to be the same length as the gate length of the control gate.

As described above, it is possible to form the first and second select transistors with the same pitch (gate length and space) as the control gate with the surface area reduction results being more pronounced as the design rule decreases.

Figure 6:
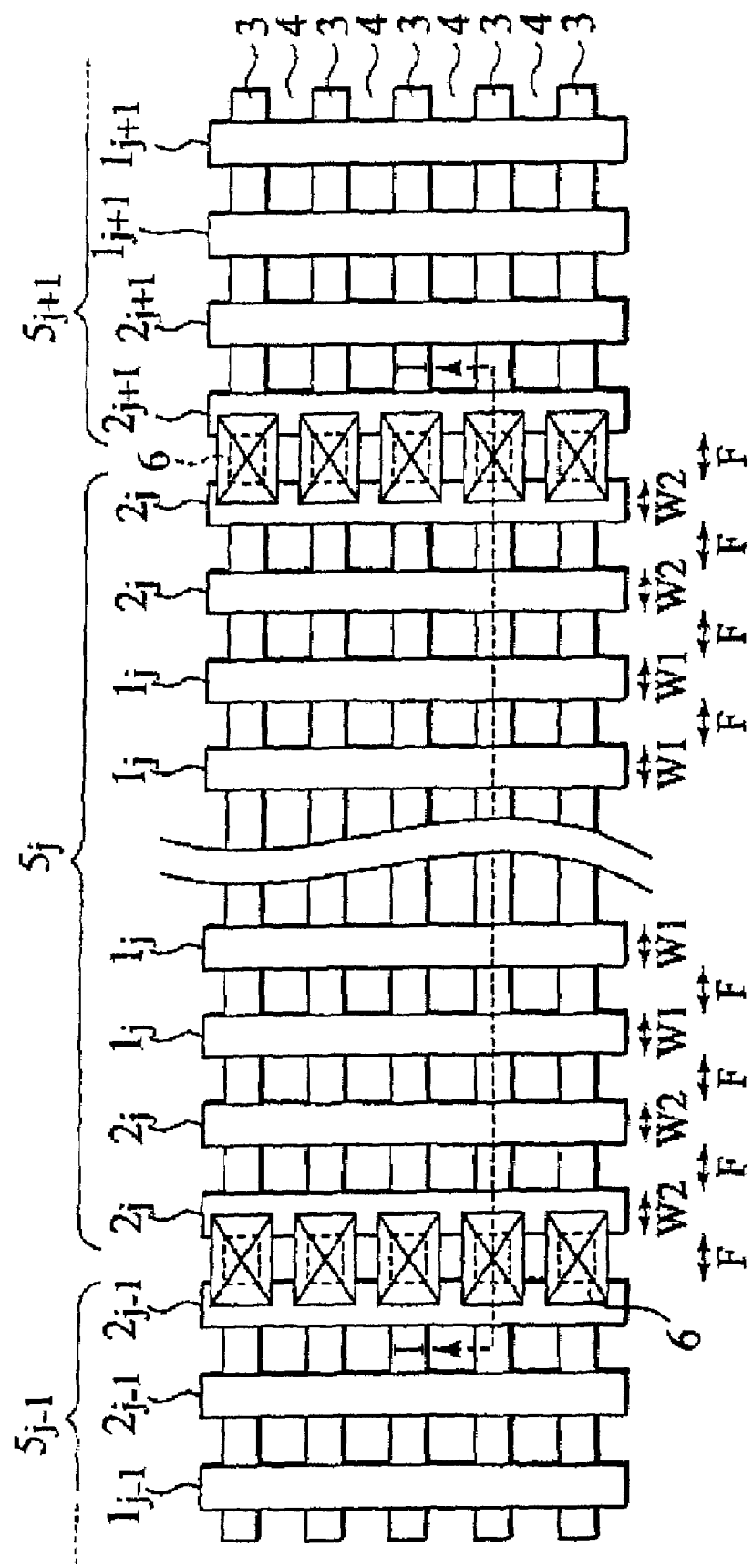
FIG. 6 is a planar view showing the structure of a nonvolatile semiconductor memory device according to the first embodiment of the present invention.

A planar configuration of a memory cell unit of a NAND nonvolatile semiconductor memory device according to the first embodiment of the present invention is shown in FIG. 6. As shown in FIG. 6, a plurality of memory cell gates 1j are arranged in lines parallel to each other. On each end of such a plurality of memory cell gates 1j . . . 1j, two select gates 2j, 2j are formed parallel to each other, and in lines parallel to the memory cell gates 1j. In this case, a plurality of memory cell gates 1j have respectively equal gate lengths W1. It should be noted that the plurality of memory cell gates 1j may be configured in numbers such as eight, sixteen, or the like. In addition, two select gates 2j 2j have respectively equal gate lengths W2. The gate length W2 may be equal to the gate lengths W1 of the individual memory cell gates 1j, or may be formed with differing dimensions.

Spaces F (F being the minimum fabrication dimension) having the same width are formed between the memory cell gates 1j. This space F is equal to the gate length W1 of the memory cell gate 1j. The gate length of the select gate 2j is equal to W2. Moreover, spaces F, which are equal to the spaces F between the memory cell gates 1j, are formed between the select gate 2j and the memory cell gate 1j adjacent to the select gate 2j.

Device activation regions 3 are formed parallel to each other and in a direction perpendicular to the lines of memory cell gates 1j. Such device activation regions 3 are segmented into multiple regions by a plurality of device isolating regions 4 formed parallel to each other and in a direction perpendicular to the lines of memory cell gates 1j. In this case, one NAND string 5j is configured by forming two select gates 2j, 2j on both ends of a plurality of, for example, sixteen memory cell gates 1j. On the ends of this NAND string 5j, another NAND string 5j+1 is formed providing a space F which is identical to the space F between the memory cell gates 1j. In this case, contact plugs 6 are formed above the device activation regions 3 between the select gates 2j and 2j−1 adjacent to each other on the NAND strings 5j and 5j−1. The contact plugs 6 are formed above the device activation regions 3 between the select gates 2j and 2j+1 adjacent to each other on the NAND strings 5j and 5j+1.

In this manner, all gate lengths are formed with uniform lines and spaces, and arranged with the same pitch within the memory cell unit which is configured from a plurality of the NAND strings 5j, 5j+1, 5j+2, . . . . In addition, the channel length of the select gate may be miniaturized to the same size as the memory cell gate 1j−1, 1j, 1j+1. The select gate 2j−1, 2j, 2j+1 is configured from a plurality of adjacent gates and functions as a select transistor.

Figure 7:
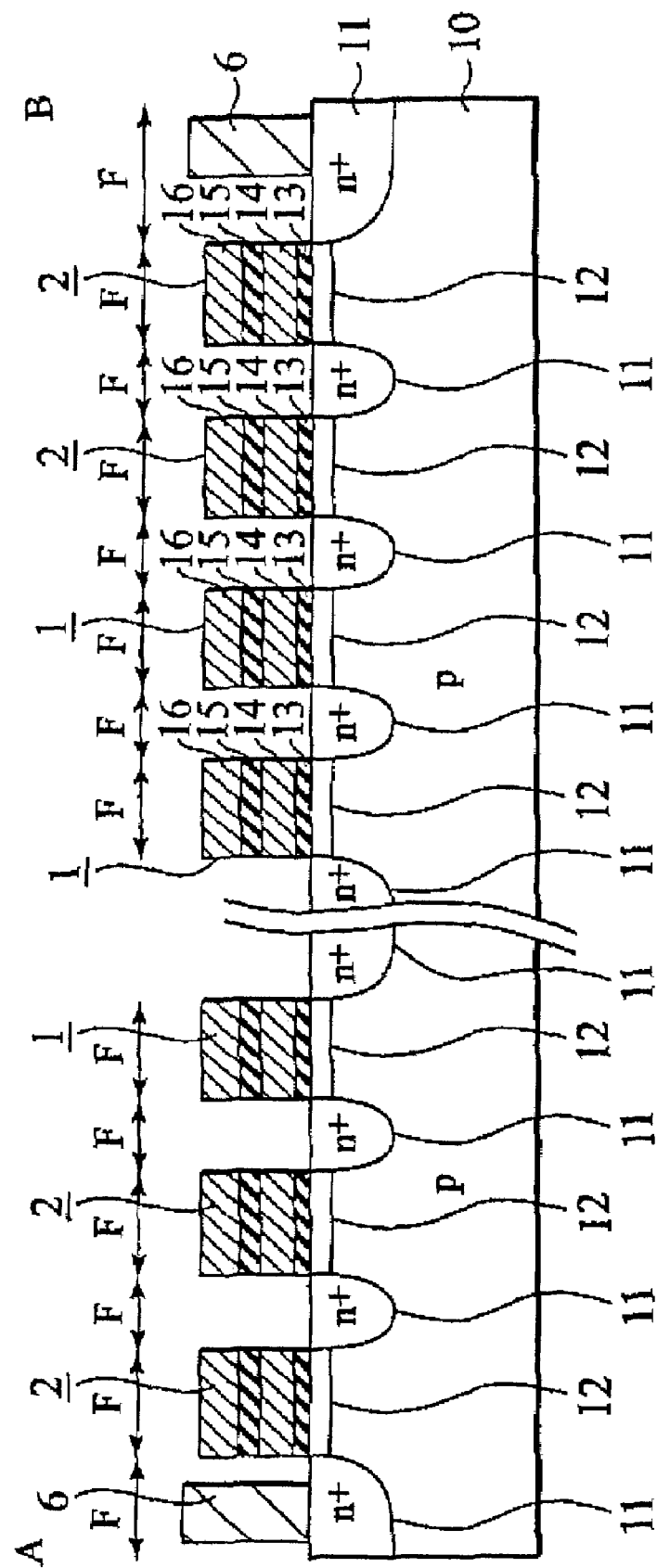
FIG. 7 is a cross-sectional diagram showing the structure of a nonvolatile semiconductor memory device according to the first embodiment of the present invention.

A cross-sectional diagram of a NAND string 5j cut along line I-I in FIG. 6 is shown in FIG. 7. As shown in FIG. 7, memory cell gates 1j and select gates 2j are formed in a p well region formed in a semiconductor substrate 10. Source/drain diffused layers 11 are formed in the semiconductor substrate 10 surrounding such memory cell gates 1j and select gates 2j. Channel ion implantation layers 12 are formed under respective memory cell gates 1j and select gates 2j in the semiconductor substrate 10. In addition, contact plugs 6 are connected to the source/drain diffused layer 11 outside of the select gate 2j at the end of the NAND string 5j.

First conductive layers 14 which function as a floating gate, or a charge storage layer, is formed on the semiconductor substrate 10 via gate insulating layers 13 under respective memory cell gates 1j and select gates 2j. On the for going structure, a first conductive layer 14 and second conductive layer 16, which function as a control gate, are formed via inter-gate insulating layers 15. The inter-gate insulating layer 15 is, for example, made of an ONO layer which has a stacked silicon oxide layer-silicon nitride layer-silicon oxide layer configuration.

In this case, in the select gates 2j, due to the existence of this inter-gate insulating layer 15, electric potential is applied only to the lower charge storage layer 14 while the upper control gate 16 is kept insulated.

Unlike the memory cell gate 1j, in the select gate 2j, electric potential is supplied only to the first conductive layer 14 of the first layer. In this case, electric potential is supplied independent of the second conductive layer 16 by extending the first conductive layer 14 above the device isolating region 4 as shown in FIG. 6.

Since a pair of two select gates 2j, 2j is used on each end of the respective NAND strings 5j, a length of 3F is required for the select gate region. In other words, since the gate length of a select gate 2j is F and there are two select gates, the total gate length occupies 2F plus the space F between the two gates so as to require a total of 3F.

Accordingly, the space between select gates 2j is F. If it had been assumed that the gate length of the select gate 2j in the conventional method was 2F, the total length would be 6F in the conventional method, as compared with the nonvolatile semiconductor memory device of the present embodiment, where the required space is 7F. Accordingly, the device causes some increase in chip surface area. However, since the fabrication margins may be improved, the result provides substantial merit towards the reduction of chip surface area if it is possible to miniaturize the design rule to the degree that the small incremental increase is cancelled.

In other words, in the nonvolatile semiconductor memory device in the first embodiment of the present invention, since the space between select gates is F, the length of two select gates 2j is 2F, and then if the space F between the select gates is added to 2F, a space of 3F is obtained, which is on both the source side and drain side so as to produce a space of 6F. Then, the addition of the space separating another memory cell provides the total space of 7F.

In this manner, even in a case where lengths other than the memory cell portion of the memory unit formed with the NAND strings 5j are enlarged from 6F to 7F by providing the select gate 2j with the same pitch and gate length as the memory cell gate 1j, miniaturization of the memory cell unit may be achieved. The miniaturization can occur if F can be minimized to such a degree that the combined total space can overcome the foregoing incremental increase.

For example, in a case where F can only be minimized down to 0.1 μm in the conventional irregular pattern, but can be minimized down to 0.09 μm when the first embodiment of the present invention is applied, the length other than the memory cell section of the memory cell unit is 0.6, which is a product obtained by multiplying 6 by 0.1, of the conventional configuration. In contrast, with the nonvolatile semiconductor memory device in the first embodiment of the present invention, the length is 0.63, which is the product obtained by multiplying 7 by 0.09. This means that a smaller surface area could be achieved by the present embodiment if F could be further minimized.

Comparing a case of having a single select gate and a case of having a plurality of select gates, when the relationship between normalized cell size and the scaling unit F in NAND flash memory is shown, as in FIG. 4, the graphs for when there is a single select gate and when there is a plurality of select gates intersect at point F0. While a large increase in normalized cell size may be seen in the case of single gate structure (line A) as miniaturization progresses, the increase in cell size is suppressed when there is a plurality of select gates (line B). The value of F0 is, for example, given as being somewhere around 0.09 μm. In the NAND flash memory with a plurality of select gate lines such as shown in a line B in FIG. 4, even if a scaling unit F is miniaturized to less than 0.09 μm, an increase in the normalized cell size can be suppressed and the intrinsic performance of the NAND flash memory can be achieved.

In addition, in the NAND strings 5j of the conventional nonvolatile semiconductor memory device, margins for patterning the irregular patterns decrease if the space between the select gate 2j and memory cell gate 1j is F. Moreover, in the case where all units are arranged with the same pitch, such as the nonvolatile semiconductor memory device in the first embodiment of the present invention, there is no need to fear degradation in localized lithography margins. Thus, all the patterns of the memory cell gate lines 1j are selected to have the same lines and spaces, and all the patterns of the select gate lines 2j are selected to have the same gate length with the memory cell gates 1j so as to provide a fabrication margin, the improvement can be expected in the fabrication margins relative to the miniaturization.

In this case, it is possible to control the two select gates 2j, 2j formed adjacent to each other with the same signal line. In addition, the cut-off characteristics of each select gate 2j may be changed by controlling two select gates 2j, 2j independently with different timing depending on the circumstances of operation. In this case, a control circuit is provided in order to control the respective select gates 2j.

In addition, the number of gates of the select gates 2j on the source side in the NAND strings 5j may be one, and the number of the gates of the select gates 2j on the drain side may be two, depending on the circumstances of operation. In this case, even if a leakage should occur on the source side, there is no problem as long as the leakage falls within an allowable range.

Moreover, the number of gates of the select gates 2j on the source side in the NAND strings 5j may be two, and the number of gates of the select transistors on the drain side may be one, depending on the circumstances of operation. In this case, even if a leakage should occur on the drain side, there is no problem as long as the leakage falls within an allowable range.

With the nonvolatile semiconductor memory device in the first embodiment of the present invention, miniaturization may be achieved by improving the cut-off characteristics of the select transistors, and the select transistors and memory cell transistors may obtain respective channel length dependency with respectively different transistor threshold voltages.

Figure 8:
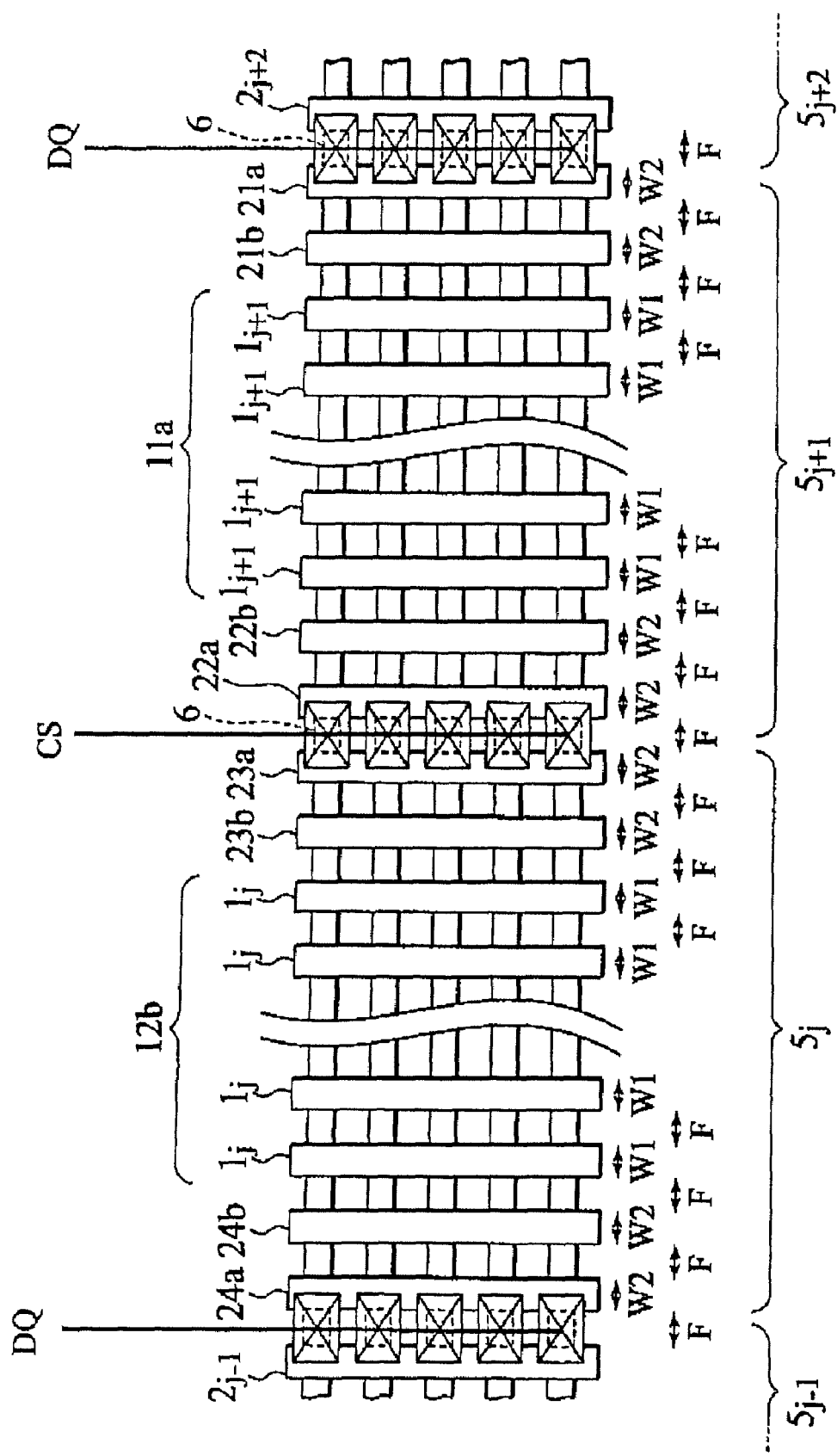
FIG. 8 is a planar view describing a pattern configuration which is configured by extending the planar view shown in FIG. 6 along the direction of the NAND string, and repeating along the direction of the bit line.

FIG. 8 is a planar view describing a pattern configuration which is configured by extending the planar view shown in FIG. 6 along the NAND strings 5j, 5j+1, . . . , repeating along the bit lines. A first memory cell gate group 11a in the NAND string 5j+1 includes first select gate groups 21a and 21b adjacent to the drain side, and second select gate groups 22a and 22b adjacent to the source side. A second memory cell gate group 12b in the NAND string 5j includes third select gate groups 23a and 23b adjacent to the source side, and fourth select gate groups 24a and 24b adjacent to the drain side. Thus the NAND strings 5j, 5j+1, . . . , are arranged in a pattern configuration that repeats about the drain side bit line DQ or source side source line CS as shown in FIG. 8.

Figure 9:
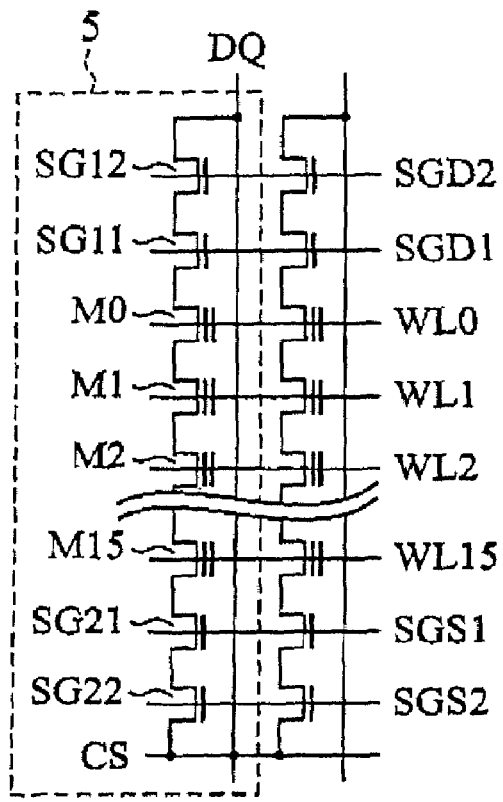
FIG. 9 is a circuit diagram showing an example of a flash memory cell unit configured with the NAND flash memory of the nonvolatile semiconductor memory device according to the first embodiment of the present invention.

In this case, a nonvolatile semiconductor memory device having the cross-sectional configuration shown in FIG. 7 has a circuit configuration as shown in the circuit diagram of FIG. 9. As shown in FIG. 9, in the memory cell unit of the NAND flash memory, a plurality of, for example, sixteen memory cell transistors M0 to M15 form a NAND string 5j in a memory block 5, which is indicated by the region enclosed by the dotted line, and the transistors being connected in series with two bit line side select transistors SG11 and SG12 connected to one side and two source line side select transistors SG21 and SG22 to the other.

The NAND cell (memory cell unit) is a memory cell array formed by connecting a plurality of memory cells in series. The source and drain of each memory cell transistors H0, M1, M2, . . . , M15 is interconnected in series via the diffused layer region formed in the device region.

Each word line WL0, WL1, WL2, . . . , WL15 makes a one-to-one connection to the gates of memory cell transistors M0, M1, M2, . . . , M15, respectively. A first bit line side select gate line SGD1 is connected to the gate of the first bit line side select transistor SG11, and a second bit line side select gate line SGD2 is connected to the gate of the second bit line side select transistor SG12. A first source line side select gate line SGS1 is connected to the gate of the first source line side select transistor SG21, and a second source line side select gate line SGS2 is connected to the gate of the second source line side select transistor SG22.

The source of the second bit line side select transistor SG12 is connected to a bit line DQ which is a data line. The source of the second source line side select transistor SG22 is connected to common source line CS.

While not shown in the figure, a plurality of NAND strings 5j are connected in the direction in which the bit line DQ extends. In addition, a plurality of NAND strings 5*j* with the same circuit configuration, are formed for every bit line DQ in the direction in which the word line WL0, WL1, WL2, ..., WL15 extends.

It should be noted that it is acceptable for the bit line side select transistors SG11, SG12 and source line side select transistors SG21, SG22 for selecting the memory cell block to be arranged on not only both sides but only one side of the memory cell transistors M0, M1, M2, ..., M15.

The NAND strings 5*j* are vertically connected in series, and there are a plurality of sequential configurations where the contact plugs 6 are respectively formed at the ends of the NAND strings, and memory cell transistors are connected via the select transistors at both ends.

Figure 10:
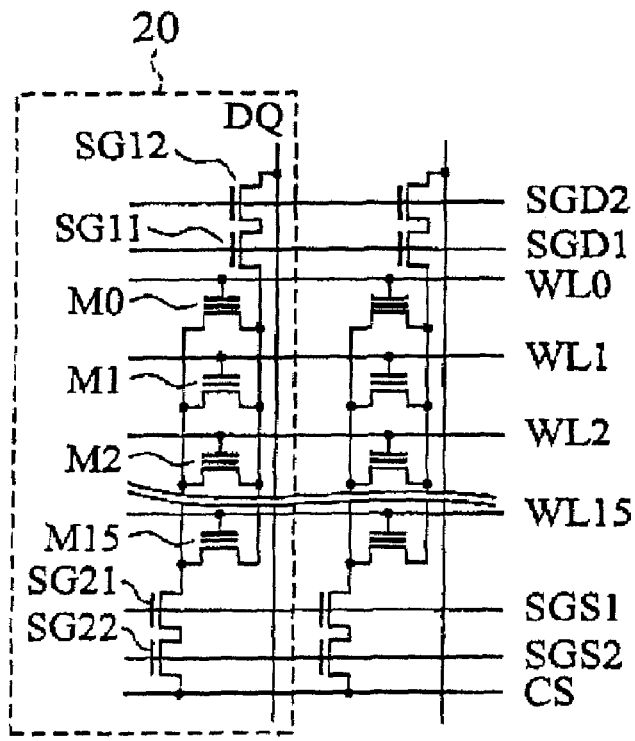
FIG. 10 is a circuit diagram showing an example of a flash memory cell unit configured with AND flash memory of the nonvolatile semiconductor memory device according to the first embodiment of the present invention.

The first embodiment of the present invention is not limited to a NAND flash memory, and may also be applied to an AND flash memory, a circuit diagram of a memory cell unit of which is shown in FIG. 10. In this case as well, the memory cell transistors configure a nonvolatile memory cell array configured with one or more transistors structured having a floating gate as a charge storage layer.

In other words, as shown in FIG. 10, in the memory cell unit of the AND flash memory, a plurality of, for example, sixteen memory cell transistors M0, M1, M2, ..., M15 that form the memory block 20, which is indicated by the region enclosed by the dotted line, and the transistors being connected in parallel with two bit line side select transistors SG11 and SG12 connected to one side and two source line side select transistors SG21 and SG22 to the other side.

The AND cell (memory cell unit) is a memory cell array formed by connecting a plurality of memory cell transistors M0, M1, M2, ..., M15 in parallel. The source and drain of each memory cell transistors M0, M1, M2, ..., M15 are interconnected in parallel via the diffused layer region formed in the device region.

Each word line WL0, WL1, WL2, ..., WL15 makes a one-to-one connection to the gates of memory cell transistors M0, M1, M2, ..., M15, respectively. A first bit line side select gate line SGD1 is connected to the gate of the first bit line side select transistor SG11, and a second bit line side select gate line SGD2 is connected to the gate of the second bit line side select transistor SG12. A first source line side select gate line SGS1 is connected to the gate of the first source line side select transistor SG21, and a second source line side select gate line SGS2 is connected to the gate of the second source line side select transistor SG22.

The source of the second bit line side select transistor SG12 is connected to the bit line DQ which function as a data line. The source of the second source line side select transistor SG22 is connected to a common source line CS.

While not shown in the figure, a plurality of such memory blocks 20 are connected in the direction in which the bit line DQ extends. In addition, a plurality of similar memory blocks are formed for every bit line DQ in the direction in which the word line WL0, WL1, WL2, ..., WL15 extends.

It should be noted that it is acceptable for the bit line side select transistors SG11, SG12 and source line side select transistors SG21, SG22 for selecting the memory cell block to be arranged on not only both sides but only one side of the memory cell transistors M0, M1, M2, ..., M15.

In this manner, this embodiment may be applied to not only a NAND flash memory but also an AND flash memory. In other words, by setting the gate length of the select gates to be the same as that of the memory cell, and arranging select gates with the same pitch, it is possible to implement a memory cell configuration that facilitates lithographic micro-fabrication of flash memory cells having select gates.

The first embodiment of the present invention achieves a memory cell array that has a high exposure margin and is down-scalable for miniaturization. In the case of having the same gate length as that of the memory transistor, it is impossible to obtain desired transistor characteristics of the select transistor due to the short-channel effects of the select gate and the like, but favorable transistor characteristics can be achieved by coupling two select gates.

In the nonvolatile semiconductor memory device of the first embodiment of the present invention, by connecting two transistors having an F gate length in series, it is possible to obtain the same characteristics as the transistors having a 2F gate length, and cut-off characteristics equivalent to the cut-off characteristics of a transistor having a gate length of 2F.

Modified Example 1 of the First Embodiment

Figure 11:
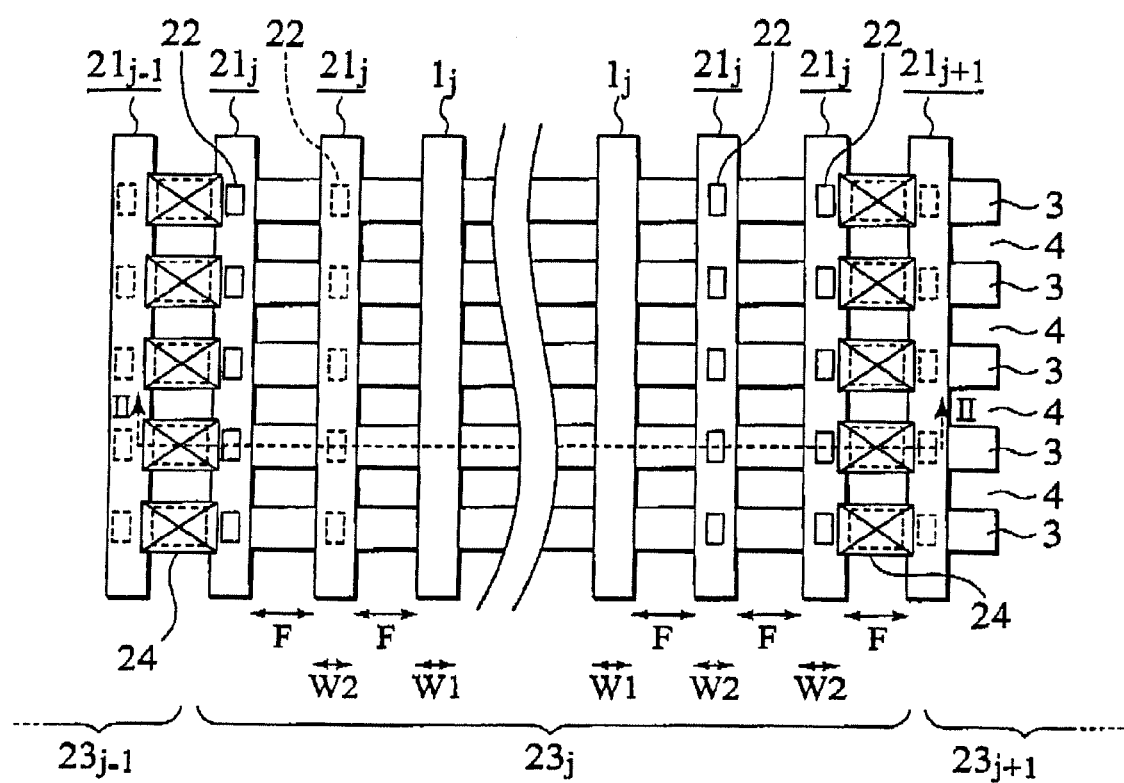
FIG. 11 is a planar view showing the structure of a nonvolatile semiconductor memory device according to the first embodiment of the present invention.

The planar configuration of a memory cell unit in the modified example 1 of the first embodiment of the present invention is shown in FIG. 11.

As shown in FIG. 11, a plurality of memory cell gates 1 are formed in lines parallel to each other. On one end of such plurality of memory cell gates 1*j*, two respective select gates 21*j*, 21*j* are formed in lines parallel to each other, and parallel to the lines of memory cell gates 1*j*. In this case, the plurality of memory cell gates 1*j* have equal gate lengths W1, respectively. It should be noted that the plurality of memory cell gates 1*j* may be configured in groups such as of eight, sixteen, or the like. In addition, the pair of two select gates 21*j* have respectively equal gate lengths W2. The gate length W2 may be equal to the gate lengths W1 of the individual memory cell gates 1*j*, or may be formed with different dimensions.

Spaces F (F being the minimum fabrication dimension) having the same width are formed between the memory cell gates 1*j*. The space F may be formed equal to the gate lengths W1 of the individual memory cell gates 1*j*, or may be formed with different dimensions. The space F may also be formed equal to the gate lengths W2 of the individual select gates 21*j*, or may be formed with different dimensions. Moreover, spaces F which equal the spaces F between the memory cell gates 1*j*, are formed between the select gate 21*j* and memory cell gate 1*j* adjacent to this select gate 21*j*.

Device activation regions 3 are formed parallel to each other and in a direction perpendicular to the lines of memory cell gates 1*j*. Such device activation regions 3 are segmented into multiple regions by a plurality of device isolating regions 4 formed parallel to each other and in a direction perpendicular to the lines of memory cell gates 1*j*.

Upon each device activation region 3 of each select gate 21*j*, an opening 22 for performing ion implantation into the select transistor channel sections is formed.

Moreover, in the planar view of FIG. 11, a self-aligned impurity implantation is performed into the opening 22 indicated by a dotted line substantially centered about the intersection of the device activation region 3 and select gate 21*j*. As a result, although the select gate lines 21*j* and memory cell gates 1*j* are provided in a high density arrangement, it is possible to individually form respective self-aligned impurity densities at different channel sections.

The source and drain of each cell are interconnected in series via the active region 3.

In this case, one NAND string 23*j* is configured by forming a pair of two select gates 21*j*, 21*j* on each end of the plurality of, for example, sixteen memory cell gates 1*j*. On the ends of NAND string 23*j*, yet another NAND string 23*j*−1, 23*j*+1 is formed providing a space F which is identical to the space F between the memory cell gates 1*j*. In this case, contact plugs 24 are formed above the device activation regions 3 between the select gates 21j−1, 21j adjacent to each other in the NAND strings 23j−1, 23j.

In this manner, all gate lengths are formed with uniform lines and spaces, and arranged with the same pitch within the memory cell unit. In addition, the channel length of the select gate 21j is miniaturized to the same size as that of the memory cell transistor. The select gate 21j is configured with two gates, and functions as a select transistor.

Figure 12:
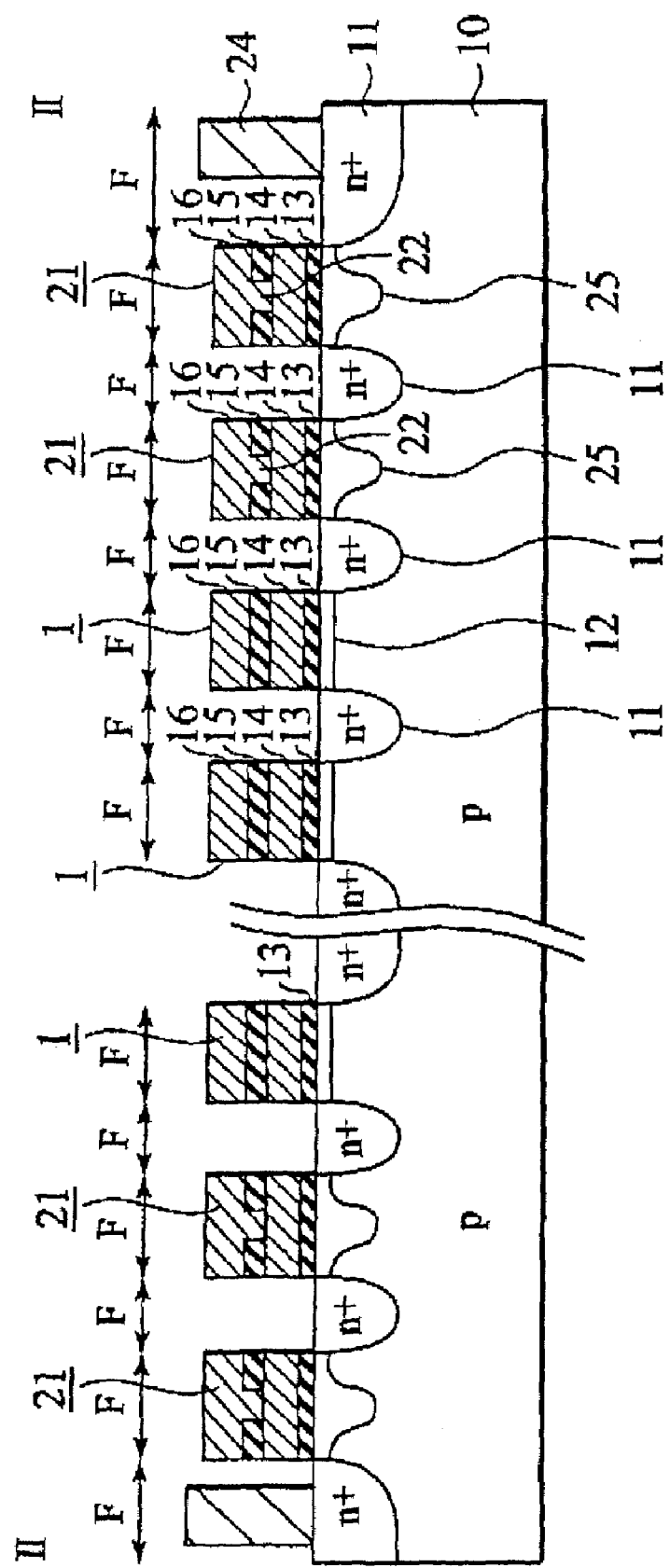
FIG. 12 is a cross-sectional diagram showing the structure of a nonvolatile semiconductor memory device according to the first embodiment of the present invention.

A cross-sectional diagram cut along line II-II in FIG. 11 is shown in FIG. 12. As shown in FIG. 12, memory cell gates 1 and select gates 21 are formed on a semiconductor substrate 10. Source/drain diffused layers 11 are formed in the semiconductor substrate 10 surrounding such memory cell gates 1 and select gates 21. The channel ion implantation layers 12 are formed under respective memory cell gates 1 in the semiconductor substrate 10. In addition, in the semiconductor substrate 10 below the select gate 21, a channel ion implantation layer 25, which is implanted via an opening 22 is formed. Moreover, contact plugs 24 are formed in the source/drain diffused layer 11 outside of the select gate 21 at the end of the NAND string 23.

First conductive layer 14 which functions as a floating gate, or charge storage layer, is formed on the semiconductor substrate 10 via the gate insulating layer 13 in each memory cell gate 1. Upon this first conductive layer 14, a second conductive layer 16 which functions as control gate is formed via inter-gate insulating layer 15. The inter-gate insulating layers 15 are, for example, made of an ONO layer which has a stacked silicon oxide layer-silicon nitride layer-silicon oxide layer configuration.

In this case, the first conductive layer 14 which functions as a floating gate, or charge storage layer, is formed on the semiconductor substrate 10 via the gate insulating layer 13 in each select gate 21. Upon this first conductive layer 14, the inter-gate insulating layer 15 is formed. In that inter-gate insulating layer 15, openings 22 are formed. Upon the inter-gate insulating layer 15 and openings 22, a second conductive layer 16 which functions as control gates is formed. Conductive materials that are made of the same material as the second conductive layer 16 are embedded in opening 22, and function as connecting sections where the second conductive layer 16 and first conductive layer 14 are electrically connected. The inter-gate insulating layer 15 is, for example, made of an ONO layer which has a stacked silicon oxide layer-silicon nitride layer-silicon oxide layer configuration.

In addition, near the surface of the region between the source and drain diffused layer 11 in the semiconductor substrate 10, a channel ion implantation layer 12 is formed contacting the source/drain diffused layers 11. Moreover, near the surface of the semiconductor substrate 10, select transistor channel diffused layers 25 are formed in the region including at least a region immediately below the opening 22 enclosed by the source/drain diffused layers 11.

The select transistor channel diffused layer 25 is formed so that the impurity density is higher than that in the memory cell transistor channel diffused layers 12, and the depth in the semiconductor substrate 10 is deeper than that of the memory cell transistor channel diffused layers 12.

In this case, the size of the opening 22 formed in the inter-gate insulating layers 15 under the select gate 21 is approximately half the length of the select gate 21.

It should be noted that it is possible to change the length of the select transistor channel diffused layers 25 by controlling the length of the opening 22 in the select gate 21.

In addition, it is possible to freely set the density of the select transistor channel diffused layer 25 by controlling the ion implantation dosage implanted under the select gate 21 via the opening 22, independent of the memory cell transistor.

It should be noted that the impurity density of the channel section of the select gate 21 is, for example, approximately $10^{17}$ cm$^{-3}$. In addition, the height of the memory cell gate 1 is formed to be equal to the height of the select gate 21.

As with the first embodiment, the modified example 1 of the first embodiment allows implementation of a memory cell configuration that facilitates lithographic micro-fabrication of flash memory cells for not only a NAND flash memory but also an AND flash memory having select gates by setting the gate length of the select gates to be the same as that of the memory cells, and arranging the select gates with the same pitch.

In this manner, the select gates 21 are configured to supply electric potential to the first conductive layers 14, so as to function in the same manner as a general MOSFET, and have a composition and size similar to a memory cell transistor, except for the fact that the multi-layer gate structure includes an opening.

Moreover, in the modified example 1 of the first embodiment of the present invention, since the impurity density in the channel region of the select transistor may be set so as to be higher than the impurity density in the channel region of the memory cell transistor, the select transistor threshold value may be set so as to be higher than the memory cell transistor threshold value. Therefore, it is possible to provide a nonvolatile semiconductor memory device with the cut-off characteristics (current cut-off characteristics) required for the select transistor.

In addition, the first conductive layer 14 and the second conductive layer 16 of the select transistor are connected via an opening 22 formed in the inter-gate insulating layers 15. By developing a nonvolatile semiconductor memory device with such configuration, it is possible to provide a minute nonvolatile semiconductor memory device which includes select transistors having required channel ion density and memory cell transistors having a channel density where the density is set lower so as to be suitable for miniaturization, and having various favorable memory cell transistor characteristics, such as data write characteristics, data hold characteristics, and tolerance towards read stress.

Next, a fabrication method of the nonvolatile semiconductor memory device of the modified example 1 of the first embodiment of the present invention is described while referencing FIG. 12 through FIG. 28. FIG. 12 through FIG. 28 correspond to a partial or entire cross section cut along II-II line in FIG. 11.

Figure 13:
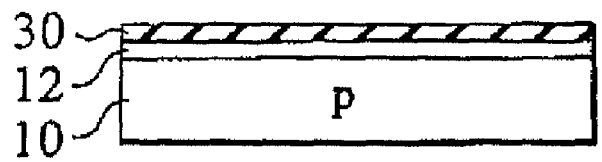
FIG. 13 is a cross-sectional diagram showing a step of a manufacturing method of the nonvolatile semiconductor memory device according to the first embodiment of the present invention.

(a) To begin with, as shown in FIG. 13, sacrificed silicon oxide layers 30 are formed on the semiconductor substrate 10 configured with p-type silicon. Next, p wells or double wells configured with n well and p well, depending on the configuring requirements, are formed and activated. Next, in the case of forming an n channel transistor on the semiconductor substrate 10 or in the region where a well is formed, channel ion implantation of p type impurities such as boron (B) is performed simultaneously to both the memory cell transistor and select transistor for controlling channels, and impurity ion implantation layers 12 are formed near the surface of the semiconductor substrate 10 as shown in FIG. 13.

Figure 14:
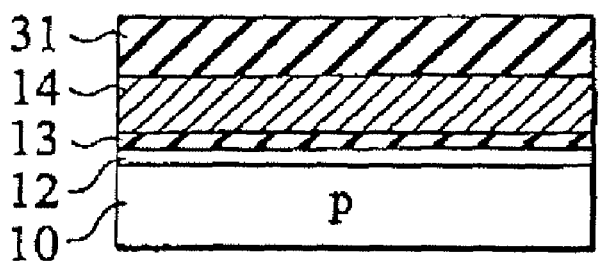
FIG. 14 is a cross-sectional diagram showing a step of the manufacturing method of the nonvolatile semiconductor memory device according to the first embodiment of the present invention.

(b) Next, as shown in FIG. 14, the sacrificed silicon oxide layers 30 formed for ion implantation are peeled off and gate insulating layers 13 are formed. A floating gate electrode layer 14 is formed as gate electrode material for floating gate electrodes by means of, for example, deposition of a polysilicon. In order to make this polysilicon conductive, for example, doping with phosphorous (P) may be used. Alternatively, phosphorous may be ion implanted through an ion implantation process. Next, on this floating gate electrode layer 14, mask material 31, for example, a silicon nitride layer ($Si_3N_4$) is deposited for processing a device isolating region 4.

Figure 15:
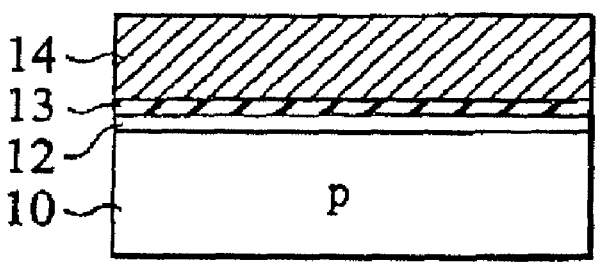
FIG. 15 is a cross-sectional diagram showing a step of the manufacturing method of the nonvolatile semiconductor memory device according to the first embodiment of the present invention.
Figure 16:
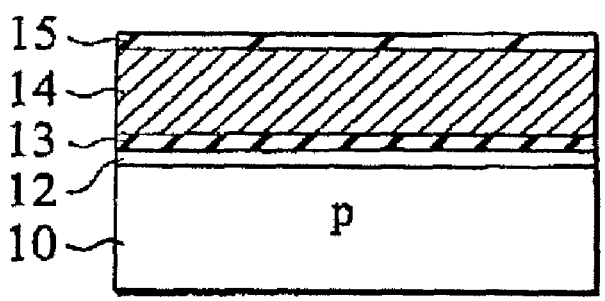
FIG. 16 is a cross-sectional diagram showing a step of the manufacturing method of the nonvolatile semiconductor memory device according to the first embodiment of the present invention.
Figure 17:
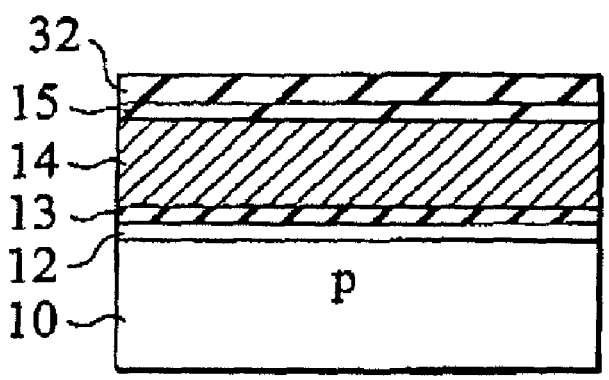
FIG. 17 is a cross-sectional diagram showing a step of the manufacturing method of the nonvolatile semiconductor memory device according to the first embodiment of the present invention.

(c) Next, as shown in FIG. 15, the mask material 31 made of the silicon nitride layer is removed. Next, as shown in FIG. 16, inter-gate insulating layers 15 are deposited on the exposed surface so as to form a stacked layer, such as the ONO layer. Next, as shown in FIG. 17, on the deposited inter-gate insulating layer 15, polysilicon, or other mask material, such as a silicon nitride layer is deposited as the mask material 32.

Figure 18:
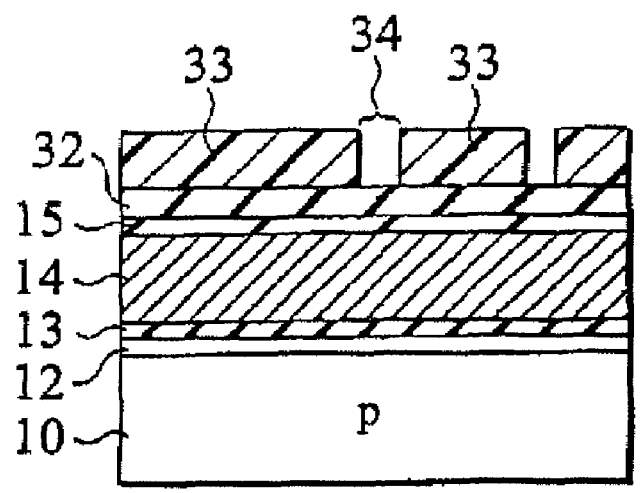
FIG. 18 is a cross-sectional diagram showing a step of the manufacturing method of the nonvolatile semiconductor memory device according to the first embodiment of the present invention.

(d) Next, as shown in FIG. 18, by patterning a part of the planned channel regions of the select transistor of the memory cell unit by utilizing the lithography process, an opening 34 is formed after depositing a photo resist 33 on the mask material 32. A state where two openings 34 have been formed is shown here.

Figure 19:
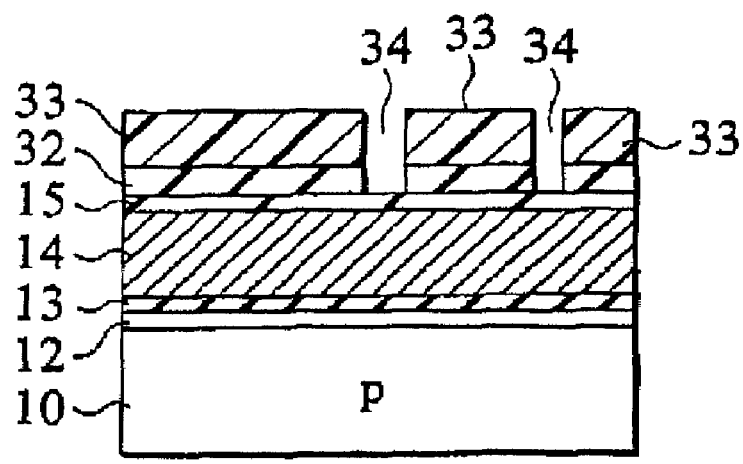
FIG. 19 is a cross-sectional diagram showing a step of the manufacturing method of the nonvolatile semiconductor memory device according to the first embodiment of the present invention.

(e) Next, as shown in FIG. 19, the mask material 32 immediately below the opening 34 of the photo resist 33 is etched and exposed. A method capable of fabricating the minimum process feature size in each generation in the semiconductor manufacturing technology is used for fabrication when patterning the mask material (where normally, expensive microscopic fabrication technology with highest performance is used). Accordingly, misalignment of the opening formed on the mask materials may be kept to a minimum.

Figure 20:
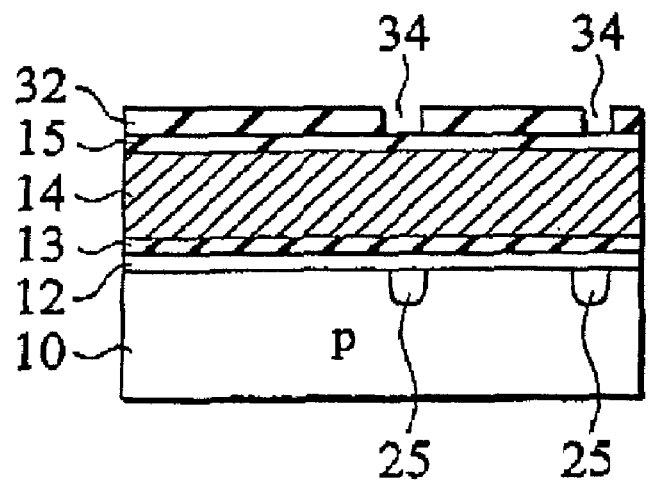
FIG. 20 is a cross-sectional diagram showing a step of the manufacturing method of the nonvolatile semiconductor memory device according to the first embodiment of the present invention.

(f) Next, as shown in FIG. 20, the photo resist 33 is removed, ion implantation is performed in the semiconductor substrate 10 which is used as the channel region of the select transistor via the inter-gate insulating layer 15, floating electrode gate 14, and gate insulating layer 13, and the select transistor channel diffused layer 25 are formed. Boron (B) is typically used as the ion implantation species in this case. However, phosphorus (P) may be used in the case of surface-channel type p channel MOS. In this case, mask material 32 is provided in the memory cell transistor region and a layer thickness is configured so that the ion-implanted ionic species attenuates in the mask material 32, and the acceleration energy of ion implantation is adjusted so as to penetrate to the semiconductor substrate 10 having surpassed the charge storage layer. In this example, ion implantation is performed without the photo resist 33 remaining. However, it is possible to perform ion implantation while the photo resist 33 still remains, and remove the photo resist 33 thereafter.

Figure 21:
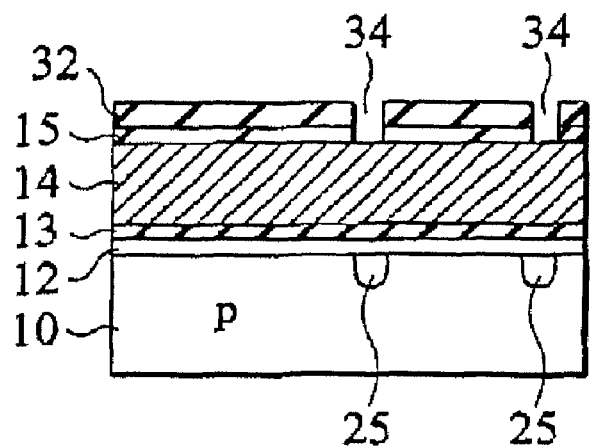
FIG. 21 is a cross-sectional diagram showing a step of the manufacturing method of the nonvolatile semiconductor memory device according to the first embodiment of the present invention.

(g) Next, as shown in FIG. 21, the inter-gate insulating layers 15 below the opening 34 are etched and exposed. It should be noted that ion implantation for forming the select transistor channel section diffused layers 25 may be performed after etching is performed to make openings in the inter-gate insulating layer 15. It should be noted that if ion implantation is performed while the inter-gate insulating layer 15 remains, it is possible to prevent contamination of the surface of the floating gate electrode layer 14 configured with a polycrystalline silicon layer, and the inter-gate insulating layer 15 may be used as a protection layer.

Figure 22:
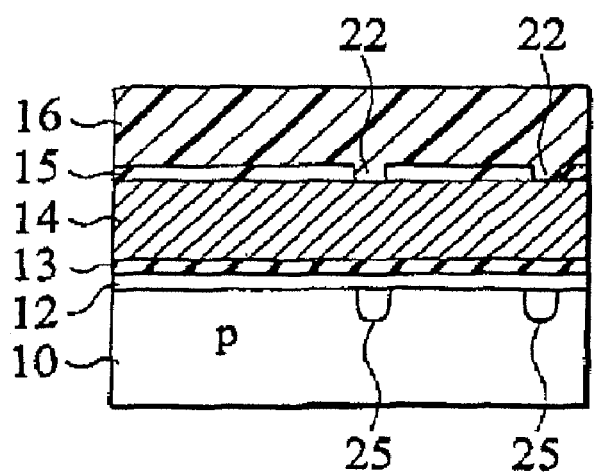
FIG. 22 is a cross-sectional diagram showing a step of the manufacturing method of the nonvolatile semiconductor memory device according to the first embodiment of the present invention.

(h) Next, as shown in FIG. 22, the mask materials 32 are peeled off. Polysilicon and tungsten silicide (WSi) are then deposited as control gate electrode material 16 and the metal silicide, respectively. In this case, it is also permissible for only a polysilicon to be deposited as the control gate material. In such a case, after performing gate fabrication by depositing polysilicon, silicide electrodes may be formed using the self-aligned silicide (Salicide) method.

Figure 23:
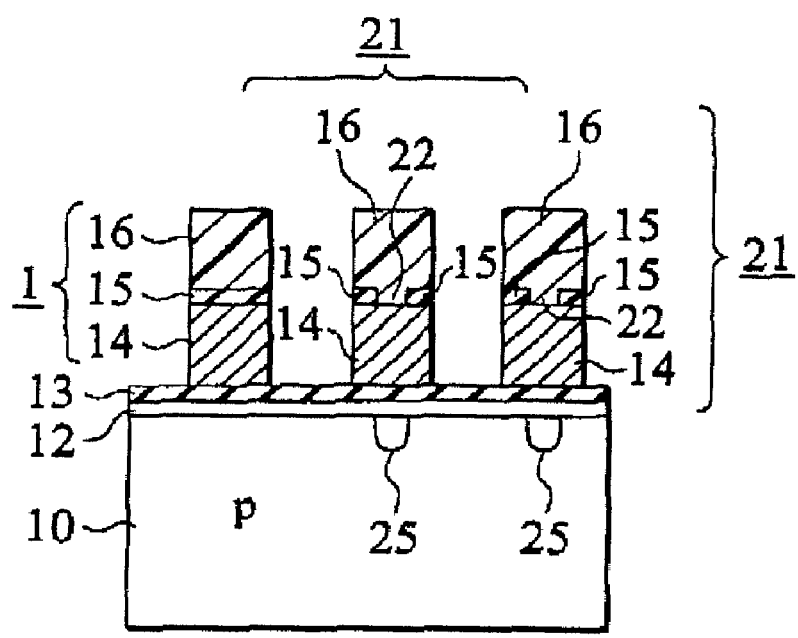
FIG. 23 is a cross-sectional diagram showing a step of the manufacturing method of the nonvolatile semiconductor memory device according to the first embodiment of the present invention.

(i) Next, as shown in FIG. 23, the gate electrode region is patterned through the lithography process, and the multi-layered gate structure is subjected to an etching process in order to form memory cell transistor gate electrodes configured with the charge storage layer 14, inter-gate insulating layer 15, and control gates 16, and select transistor gate electrodes configured with the charge storage layer 14, inter-gate insulating layer 15, and control gates 16 so as to have the same gate length and same pitch. RIE is used for this etching process. A pair of two control gates are formed at each end of the memory cells in each memory cell unit.

Figure 24:
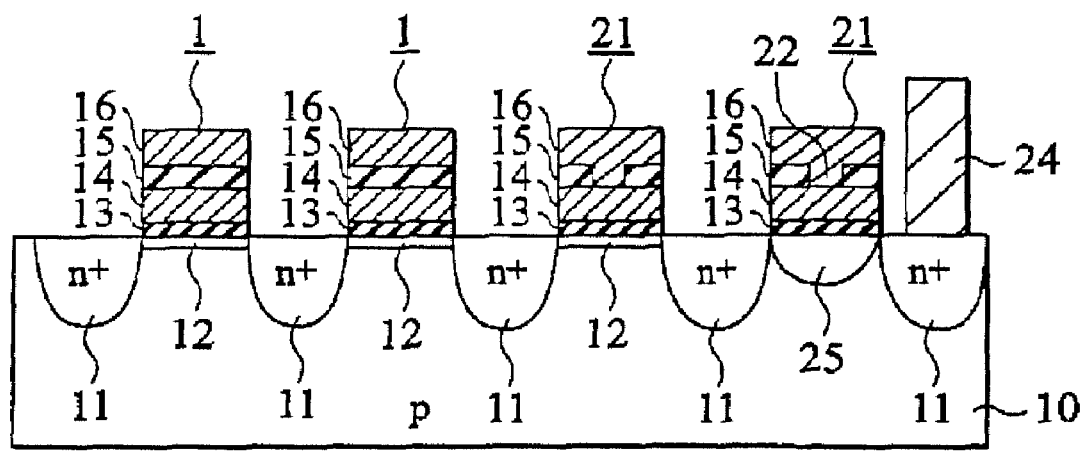
FIG. 24 is a cross-sectional diagram showing the structure of a nonvolatile semiconductor memory device according to a first modified example in the first embodiment of the present invention.

(j) Next, as shown in FIG. 24, impurities are ion implanted in the semiconductor substrate 10 in order to form source/drain regions by masking the memory cell transistor gate electrodes and select transistor gate electrodes having a multi-layered gate structure. In particular, the modified example 1 of the first embodiment becomes possible without adding a lithography step by performing ion implantation after opening a through hole in the inter-gate insulating layer 15 of the select transistor in order to electrically short circuit the floating gate and control gate. With this manufacturing method, a method for removing a part of the inter-gate insulating layer 15 which divides the charge storage layer 14 and control gate 16 is adopted. This method is applied to the select gate 21 in the memory cell unit. This method permits making contact with the charge storage layer 14, however, if the following conditions are satisfied, it is possible to perform ion implantation in only the channel section of the select gate through the floating gate during this manufacturing process.

In other words, if impurities are attenuated in the mask materials through ion implantation in the memory cell gate 1 so that the impurities do not reach the charge storage layer 14 and through the select gate 21, the ion implanted impurities implanted with the charge storage layer 14 and gate insulating layer 13 between, are implanted in the semiconductor substrate 10 in order to form channel regions having different impurity densities in the memory cell gate 1 and select gate 21. Thus, it is possible to form respective channel sections so as to satisfy the memory cell characteristics and select gate characteristics, and to achieve improvement of the respective characteristics through the self-alignment process without adding a lithography step.

Self-aligned channel ion implantation in the select gate 21 may be performed, if there is no misalignment and channel impurities may be formed in the select gate 21.

Here, obtaining accurate mask alignment tolerance can be expected for the ion implantation process of the threshold voltage control for the first bit line side select transistor SG11 having the first bit line side select gate line SGD1 and for the first source line side select transistor SG21 having the first source line side select gate line SGS1. Therefore, even if a mask misalignment is performed for the ion implantation process and the threshold voltage of the first select transistors SG11, SG21 having select gate lines SGD1, SGS1, respectively becomes lower than the threshold voltage of the second select transistors SG12, SG22 having select gate lines SGD2, SGS2, respectively, the cut off leakage current problem can be easily solved, because there are at least two select transistors for both the source line side and the bit line side. As a result, there is no need to design a space to be wider between the bit line side select gate line SGD1 and adjacent control gate line WL1 and also between the source line side select gate line SGS1 and adjacent control gate line WL32, so that the space can be reduced to the same value of the space between control gates.

With the above-discussed manufacturing method, it is possible to independently form the select transistor and memory cell transistor in a self-aligning manner so as to have different channel impurity densities.

In this manner, respective transistors are formed in a self-aligned manner whereby impurity density at a portion of the channel section of the memory cell select transistor and the impurity density in the channel portion of the memory cell section are different. In this case, in the select transistor, a portion of the ions passing through, when performing channel ion implantation, remain in the gate insulating layer 13 below the charge storage layer 14. That residual ion region configures a peripheral region including that immediately below the shape of the opening 22 formed in the inter-gate insulating layer 15 on the charge storage layer 14.

With the modified example 1 of the first embodiment, it is not necessary to perform channel implantation via the gate insulating layer 13 of the memory cell transistor and in particular, there is no degradation in the characteristics of the nonvolatile semiconductor memory device with a configuration having a floating gate.

It should be noted that the modified example 1 of the first embodiment is equally applicable to n channel transistors and p channel transistors, and furthermore, either boron (B) or phosphorus (P) may be used as the impurity ion species to be ion implanted for channel control in the memory cell transistor and select transistor.

In this manner, in the modified example of the first embodiment, the memory cell transistor is masked, highly accurate openings 34 in the mask material 32 corresponding to the select transistor channel region are formed, ion implantation is performed in the channel region using the openings 34, and channel ion implantation is performed without misalignment.

In addition, since, in the memory cell transistor, ion implantation is performed on the select transistor when there are no openings in the inter-gate insulating layer 15 between the first conductive layer 14 and the second conductive layer 16 of the gate electrode, the density of the memory cell transistor channel region is independent of select transistor channel density.

Modified Example 2 of the First Embodiment

With the configuration of a nonvolatile semiconductor memory device of this modified example 2, the configuration of the nonvolatile semiconductor memory device shown in FIG. 12 is modified as shown in FIG. 24. Accordingly, it is possible to improve the cut-off characteristics by forming a highly doped channel ion implantation region 25 in the semiconductor substrate 10 corresponding to the opening 22 in the inter-gate insulating layer 15 of the select gate of the pair of two select gates that is formed farther away from the memory cell gate. In this case, a channel ion implantation region 12 identical to that of the memory cell gate is formed below the select gate adjacent to the memory cell gate.

Although a select gate is formed on both the source side and drain side in each NAND string 23, impurity density and depth into the channel ion implantation region below the select gate adjacent to the memory cell gate may be set so as to be equal to the impurity density and depth into the channel ion implantation region of the memory cell gate on both or either one of the source side and drain side.

The manufacturing method of the modified example 2 of the first embodiment, forms a highly doped ion implantation region 25 in the semiconductor substrate 10 solely for the select gate 21 where ion implantation is performed below the select gate 21 by coating the planned select gate formation region, where ion implantation is not performed under the select gate 21, with photo resist following the step shown in FIG. 24 in the manufacturing method in the first embodiment.

In this manner, while adopting the gate structure shown in FIG. 12, it is possible to make the cut-off characteristics of the select transistors different by forming the density and depth of the channel ion implantation region so as to be lower and shallower than the select transistor farther away from the memory cell transistor through channel ion implantation by masking the side of the select transistor adjacent to the memory cell transistor with a resist (not shown in the figure).

In other words, the channel ion implantation region of the select gate 21 adjacent to the memory cell transistor has the same density and depth as the density and depth of the channel ion implantation region of the memory cell gate 1. In contrast, the channel ion implantation region of the select gate 21 on the side away from the memory cell transistor is formed so that the density and depth are more highly doped and deeper than the density and depth of the channel ion implantation region of the memory cell gate.

In this case, by improving the cut-off performance on the side farther from the memory cell gate 1 higher than single gate-type devices, it is possible to control the effect of impurity diffusion to be lower in the select gate 21 formed on the side adjacent to the memory cell gate 1. Through such configuration, it is possible to prevent channel impurity diffusion so as to the memory cell transistor adjacent the select gate 21.

Modified Example 3 of the First Embodiment

Figure 25:
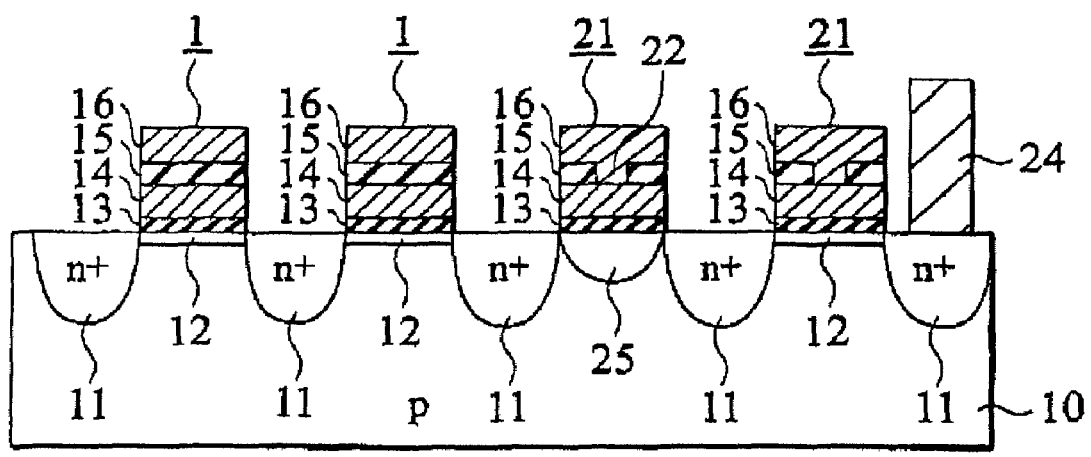
FIG. 25 is a cross-sectional diagram showing the structure of a nonvolatile semiconductor memory device according to a second modified example in the first embodiment of the present invention.

In this modified example, the configuration of the nonvolatile semiconductor memory device shown in FIG. 12 is modified as shown in FIG. 25. Accordingly, it is possible to improve the cut-off characteristics by forming a highly doped channel ion implantation region 25 in the semiconductor substrate 10, which corresponds to the opening 22 in the inter-gate insulating layer 15 of one of the pairs of two select gates formed adjacent to the memory cell gate 1. In this case, the channel ion implantation region 12 is formed below the select gate 21 apart from the memory cell gate 1 as with the memory cell gate 1.

Although two select gates 21 are formed on the source side and drain side respectively in one NAND string, impurity density and depth in the channel ion implantation region below the select gate 21 apart from the memory cell gate 1 may be set so as to be equal to the impurity density and depth in the channel ion implantation region of the memory cell gate 1 on both or either one of the source side and drain side.

The manufacturing method of the modified example 3 of the first embodiment forms the highly doped ion implantation region 25 in the semiconductor substrate only for the select gate where ion implantation is performed below the select gate by coating the planned select gate formation region, where ion implantation is not performed under the select gate, with the photo resist after the steps shown in FIG. 19.

In this manner, while adopting the gate structure shown in FIG. 12, it is possible to make the cut-off characteristics of the select transistors different by forming the density and depth of the channel ion implantation region so as to be lower and shallower than the select transistor apart from the memory cell transistor through channel ion implantation, by masking the side of the select transistor adjacent to the memory cell transistor with a resist (not shown in the figure).

In other words, the channel ion implantation region of the select gate 21 apart from the memory cell gate 1 has the same density and depth as the density and depth of the channel ion implantation region of the memory cell gate 1. In contrast, the channel ion implantation region of the select gate 21 on the side adjacent to the memory cell gate 1 is formed so that the density and depth are more highly doped and deeper than the density and depth of the channel ion implantation region of the memory cell gate 1.

In this case, the cut-off performance on the side adjacent to the memory cell is improved.

It should be noted that each embodiment is applicable to a nonvolatile semiconductor memory device having select gates. Each embodiment is also applicable to transistors in peripheral circuits.

In addition, the invention is not limited to only a nonvolatile semiconductor memory device, and each embodiment is applicable to a mixed memory loading semiconductor device having a nonvolatile semiconductor memory device.

Modified Example 4 of the First Emodiment

Figure 26:
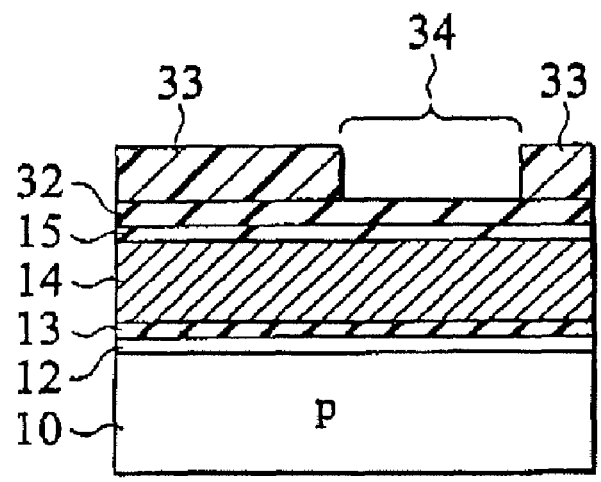
FIG. 26 is a cross-sectional diagram showing a step for a modified example of the manufacturing method of the nonvolatile semiconductor memory device according to the first embodiment of the present invention.
Figure 27:
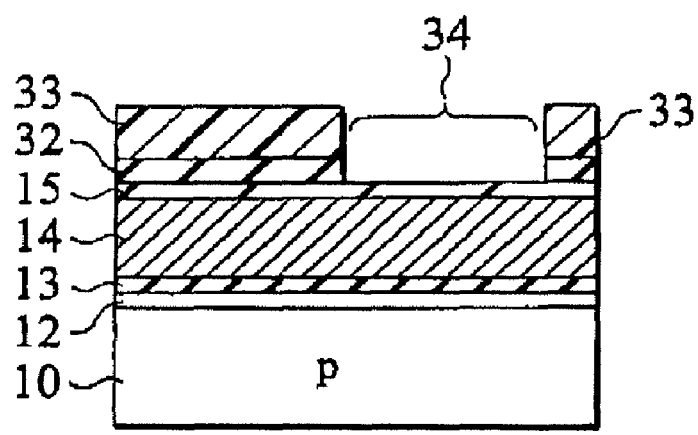
FIG. 27 is a cross-sectional diagram showing a step for a modified example of the manufacturing method of the nonvolatile semiconductor memory device according to the first embodiment of the present invention.
Figure 28:
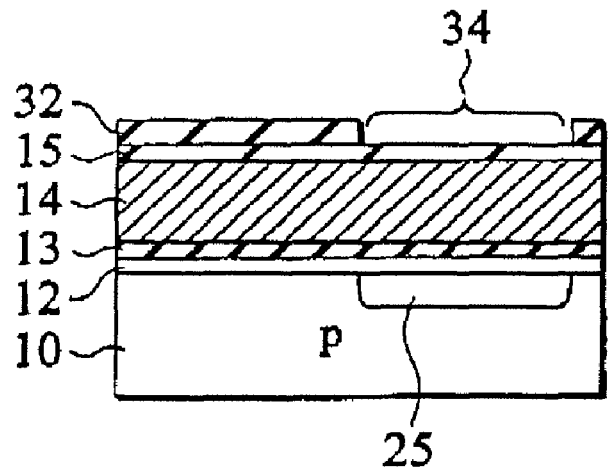
FIG. 28 is a cross-sectional diagram showing a step for the modified example of the manufacturing method of the nonvolatile semiconductor memory device according to the first embodiment of the present invention.

Instead of the steps in FIG. 18 through FIG. 20, as shown in FIG. 26 through FIG. 28, it is possible to form a wide select transistor channel diffused layer 25 by setting the opening 34 to be wider, and performing ion implantation to the planned channel region of the select transistor. The steps of FIG. 26 through FIG. 28 have fabrication margins of greater accuracy in microscopic fabrication in comparison with the steps shown in FIG. 18 through FIG. 20.

In other words, as shown in FIG. 26, by patterning a part of a planned channel region of a select transistor of the memory cell unit by utilizing a lithography process, an opening 34 is formed after depositing photo resist 33 on the mask materials 32. Here, a state where one wide opening 34 is formed is shown.

Next, as shown in FIG. 27, the mask materials 32 immediately below the opening 34 of the photo resist 33 are etched and exposed.

A method capable of fabricating the minimum fabrication size in each generation in the semiconductor manufacturing technology is used when the mask materials are patterned (that is, generally, a micro-fabrication technology with the highest performance is used). Accordingly, misalignment of the opening formed on the mask material may be kept to a minimum.

Next, as shown in FIG. 28, the photo resist 33 is removed, ion implantation is performed in the semiconductor substrate 10 which is used as the channel region of the select transistor via the inter-gate insulating layer 15, floating electrode gate 14, and gate insulating layer 13, to form the select transistor channel diffused layer 25. Boron (B) is typically used as the ion implantation species in this case. However, phosphorus (P) may be used in the case of surface-channel type p channel MOS.

In this case, mask material 32 is in the memory cell transistor region, and layer thickness configuration is determined so that ion-implanted ionic species are attenuated in the mask material 32. The acceleration energy of the ion implantation is adjusted so as to penetrate to the semiconductor substrate 10, having passed through the charge storage layer 14.

In this case, ion implantation is performed without the photo resists 33 remaining, however, it is possible to perform ion implantation while the photo resists 33 still remain, and remove the photo resists 33 thereafter.

With the first embodiment and the modified example 1 to 4 of the present invention, it is possible to provide a minute nonvolatile semiconductor memory device and manufacturing method thereof wherein the cut-off characteristics of the transistor are improved.

Modified Example 5 of the First Embodiment

Figure 29:
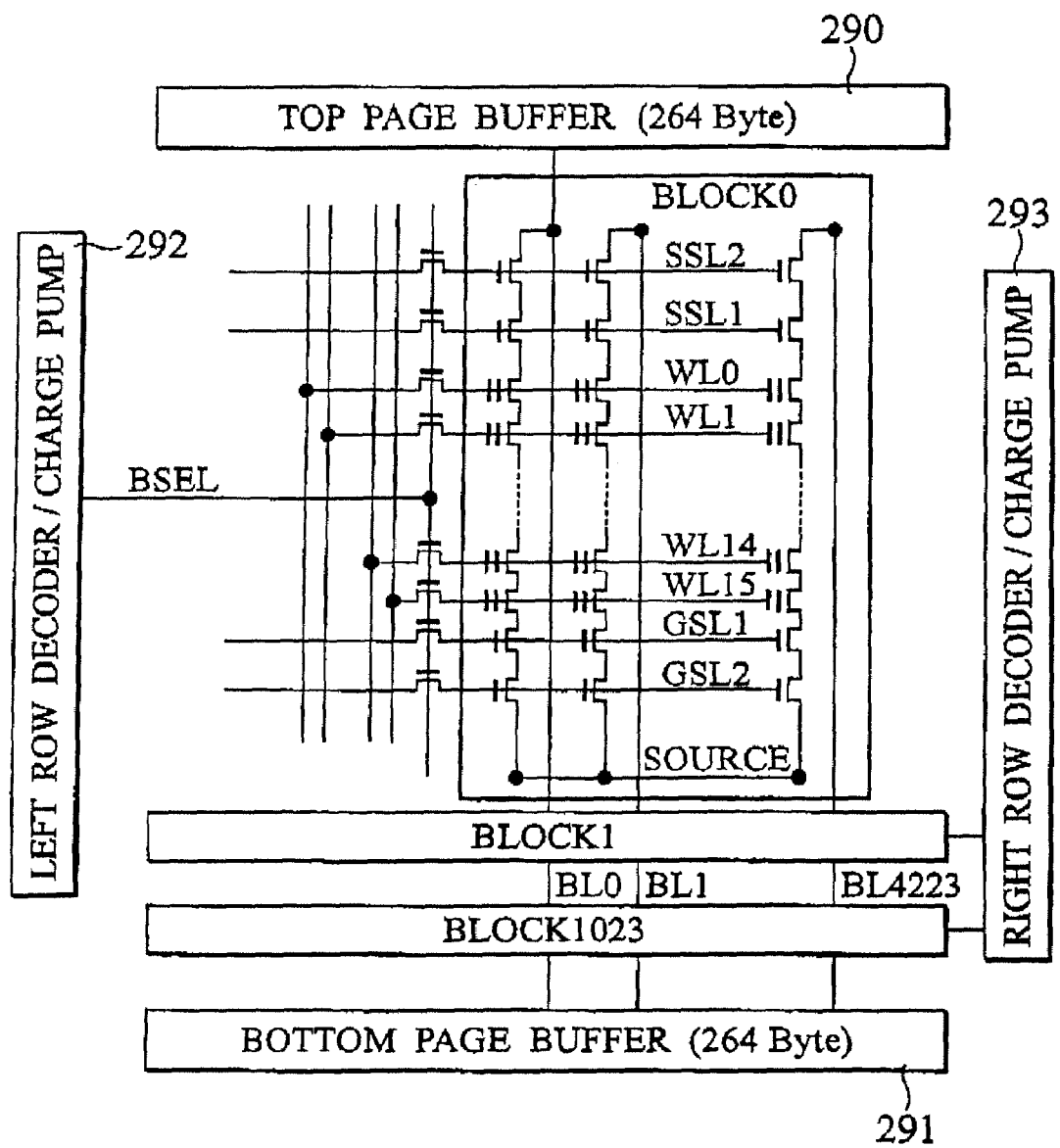
FIG. 29 is an illustrative circuit diagram of a nonvolatile semiconductor memory device according to the first embodiment of the present invention and shows an example of 64 M-bit NAND flash memory.

As the nonvolatile semiconductor memory device according to the modified example 5 of the first embodiment of the present invention, the schematic circuit configuration of a 64 M-bit NAND flash memory has, as shown in FIG. 29, two select gate lines SSL1 and SSL2 on the bit line side of the NAND string, and two select gate lines GSL1 and GSL2 on the source side. In FIG. 29, block 0 through block 1023 which are configured with NAND memory cell arrays are arranged, and a top page buffer 290, bottom page buffer 291, left row decoder/charge pump 292, and right row decoder/charge pump 293 are arranged surrounding the NAND memory cell arrays. In addition, in FIG. 29, word lines WL0, WL1, . . . , WL14, WL15 are arranged in parallel with the select gate lines SSL1, SSL2, GSL1, and GSL2, and bit lines BL0, BL1, . . . , BL4223 are arranged perpendicular to such word lines.

Modified Example 6 of the First Embodiment

Figure 30:
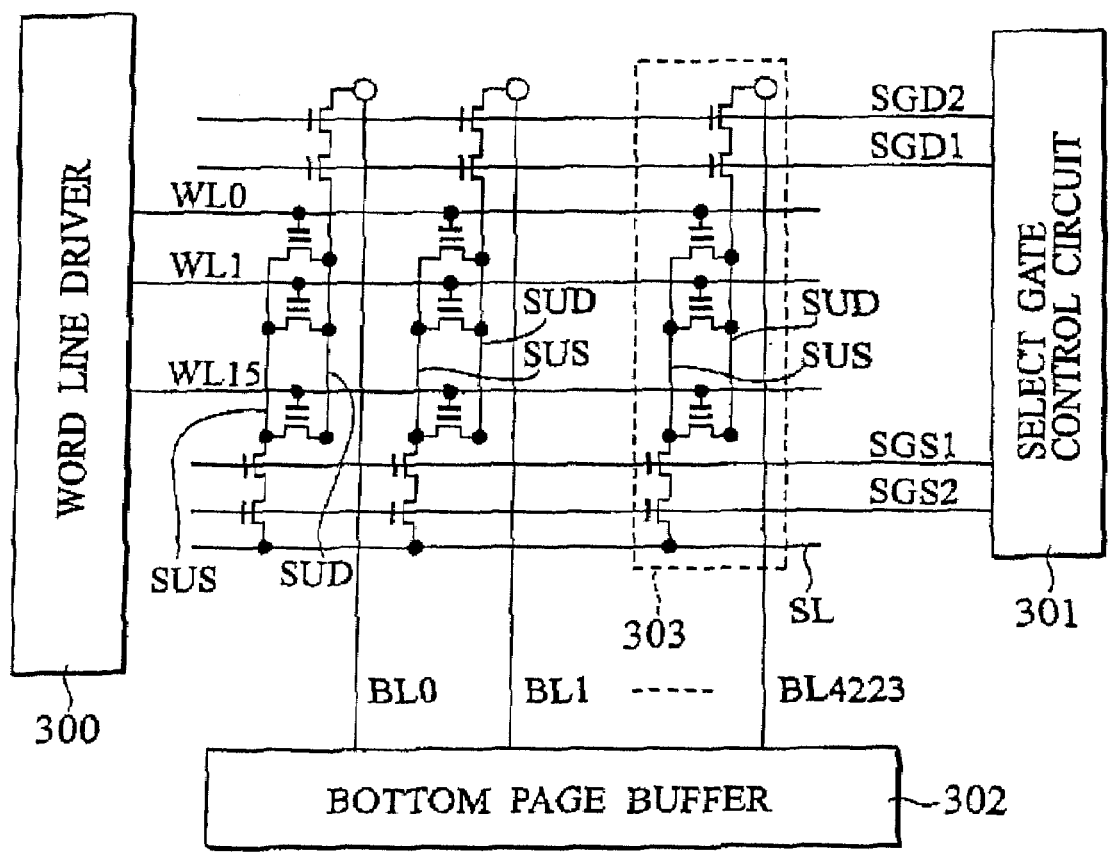
FIG. 30 is an illustrative circuit diagram of a nonvolatile semiconductor memory device according to the first embodiment of the present invention and shows an example of AND flash memory.

As the nonvolatile semiconductor memory device according to the modified example 6 of the first embodiment of the present invention, the schematic circuit configuration of the AND flash memory has, as shown in FIG. 30, two select gate lines SGS1 and SGS2 on the source side of the AND memory cell array, respectively, and two select gate lines SGD1 and SGD2 on the bit line side, respectively. In FIG. 30, a bottom page buffer 302, word line driver 300, and select gate control circuit 301 are arranged surrounding the AND memory cell array. In addition, in the AND memory cell array, word lines WL0, WL1, . . . , WL15 are arranged perpendicular to the bit lines BL0, BL1, . . . BL4223, and memory cells are connected to each word line. In FIG. 30, the region 303 enclosed by a dotted line indicates the AND memory cell unit.

The name "AND" is derived from the fact that the connecting method is a parallel connection as with the NOR type, and logical method is opposite the NOR type. The AND flash memory unit 303 is configured with 128 unit cells and two select gate lines SGD1, SGD2 which connect sub bit lines SUD to the bit lines BL0, BL1, . . . , BL4223 and two select gate lines SGS1, SGS2 which connect sub source lines SUS to common source line SL in the case of 64 M-bit AND flash memory, for example, which is inserted between the sub bit line SUD and sub source line SUS in parallel. The features of this memory cell array is that a pseudo contactless configuration is employed where the bit line BL0, BL1, . . . , BL4223 and source line CS interconnections are configured to have a hierarchical structure and the sub bit line SUD and the sub source line SUS are made of diffused layers.

Figure 31A:
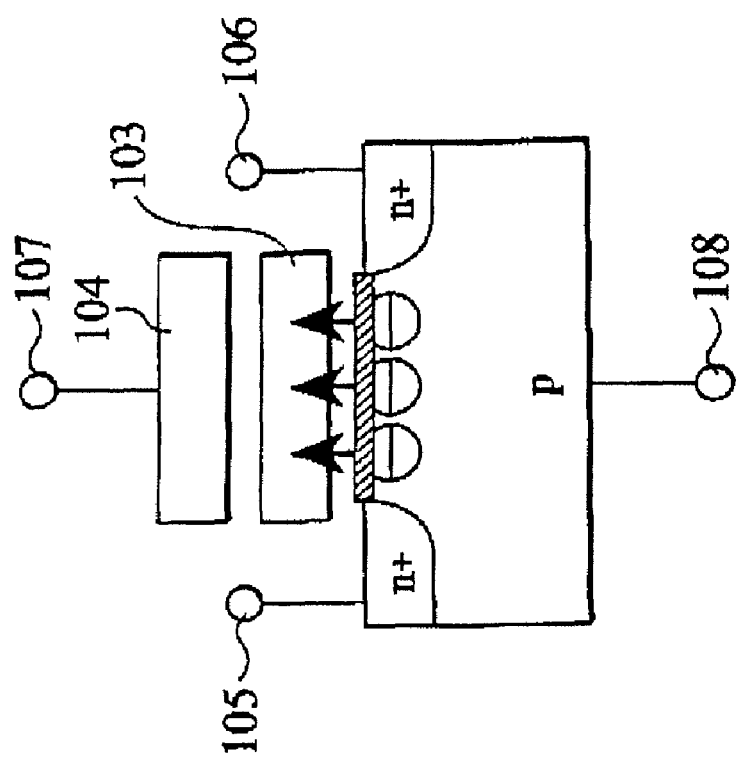
FIG. 31A is a diagram describing an AND flash memory write operation.
Figure 31B:
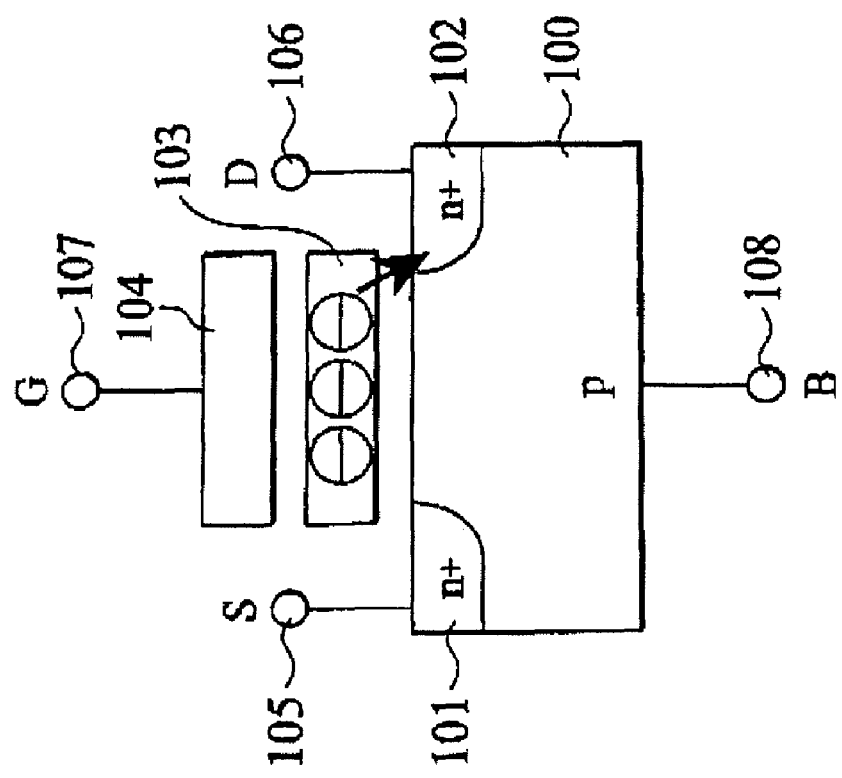
FIG. 31B is a diagram describing an AND flash memory erase operation.

FIG. 31A is a schematic cross-sectional configuration for describing a write operation in the AND memory cell. FIG. 31B is a schematic cross-sectional configuration for describing an erase operation. In FIG. 31A, upon a write operation, a source terminal 105 connected to a source region 101 is left opened, and 3V is applied to a drain terminal 106 connected to the drain region 102, −9V to a control gate terminal 107 connected to the control gate 104, and 0V to a back bias terminal 108 connected to the substrate 100. Upon a write operation, the drain region 102 is subjected to tunneling injection of electrons from the floating gate 103. In FIG. 31B, upon an erase operation, 0V is applied to the source terminal 105, 0V to drain terminal 106, +13V to the control gate terminal 107 connected to the control gate 104, and 0V to the back bias terminal 108 connected to the substrate 100. Upon an erase operation, electrons are injected into the floating gate 103 from the substrate 100. Writing/erasing of the memory cell is performed using a Fowler-Nordheim (FN) tunneling current. As shown in FIG. 31A, writing operation to the memory cell is performed by injecting electrons from the floating gate 13 to the drain region 102 side using the tunneling current. In the erase operation, as shown in FIG. 38B, electrons are injected from the substrate 100 to the floating gate 13 using the FN tunneling current of the entire channel surface.

Modified Example 7 of the First Embodiment

The divided bit line NOR (DINOR) type flash memory has the following features: single power supply operation, high-speed writing, and small memory size, which are features of the NAND flash memory, and high-speed random access, which is a feature of the NOR flash memory. Hierarchical configuration is employed for the bit line and sub bit lines SUD in the memory array, therefore, the DINOR flash memory unit is approximately equal to that of the AND type. The memory cell is a stack gate type as with the NOR type or NAND type, and the drain in the memory cell is connected in parallel to the sub bit line SUD which is made of polysilicon. For example, in the case of a 16 M-bit DINOR type flash memory, 64 memory cells are connected to the sub bit line SUD. Reduction of the memory cell size is implemented by making the connection to the memory cell by using implanted contacts between the polysilicon and diffused layer. The write/erase mechanism to the memory cell is the same as that of the AND flash memory, and is performed using the Fowler-Nordheim (FN) tunneling current. Writing to the memory cell is performed by injecting electrons from the floating gate to the drain region side using tunneling current. In the erase operation, electrons are injected from the substrate to the floating gate using the FN tunneling current of the entire channel surface.

Figure 32:
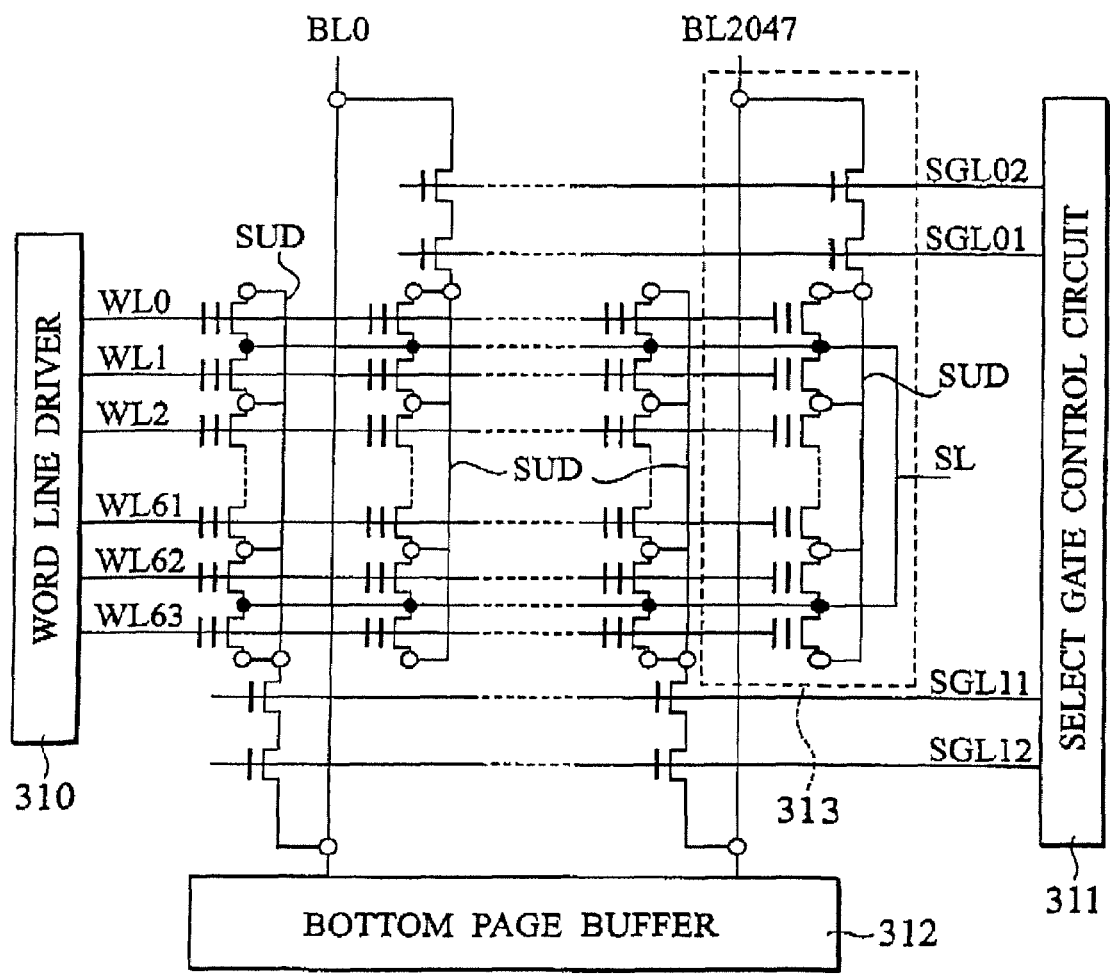
FIG. 32 is an illustrative circuit diagram of a nonvolatile semiconductor memory device according to the first embodiment of the present invention configured with a divided bit line NOR flash memory.

As in the nonvolatile semiconductor memory device according to the modified example 7 of the first embodiment of the present invention, the schematic circuit configuration of the divided bit line NOR flash memory has, as shown in FIG. 32, the bit lines BL0, BL1, . . . , BL2047 and the sub bit line SUD are configured to have a hierarchical structure in the DINOR memory cell array, two select gate lines SGL11 and SGL12 on the source side, and two select gate lines SGL01 and SGL02 on the bit line side both for connecting between the bit lines and the sub bit lines SUD. In FIG. 32, a bottom page buffer 312, word line driver 310, and select gate control circuit 311 are arranged surrounding the DINOR memory cell array. In addition, in the DINOR memory cell array, word lines WL0 through WL63 are arranged perpendicular to the bit lines BL0 through BL2047, with a memory cell row connected to each word line. In FIG. 31, an area 313 enclosed by a dotted line indicates the DINOR memory cell unit. In addition, a closed circle "●" indicates a diffused layer region, and an open circle "○" indicates a contact region.

Second Embodiment

In the second embodiment of the present invention, isolating characteristics between the memory cell gate and bit line or source line are improved by dividing the select gate in two. Unlike the first embodiment of the present invention, the select gates short circuit at a predetermined pitch, and a technique is employed to reduce the delay of signals propagated on the select gate line by applying the same electric potential.

Figure 33:
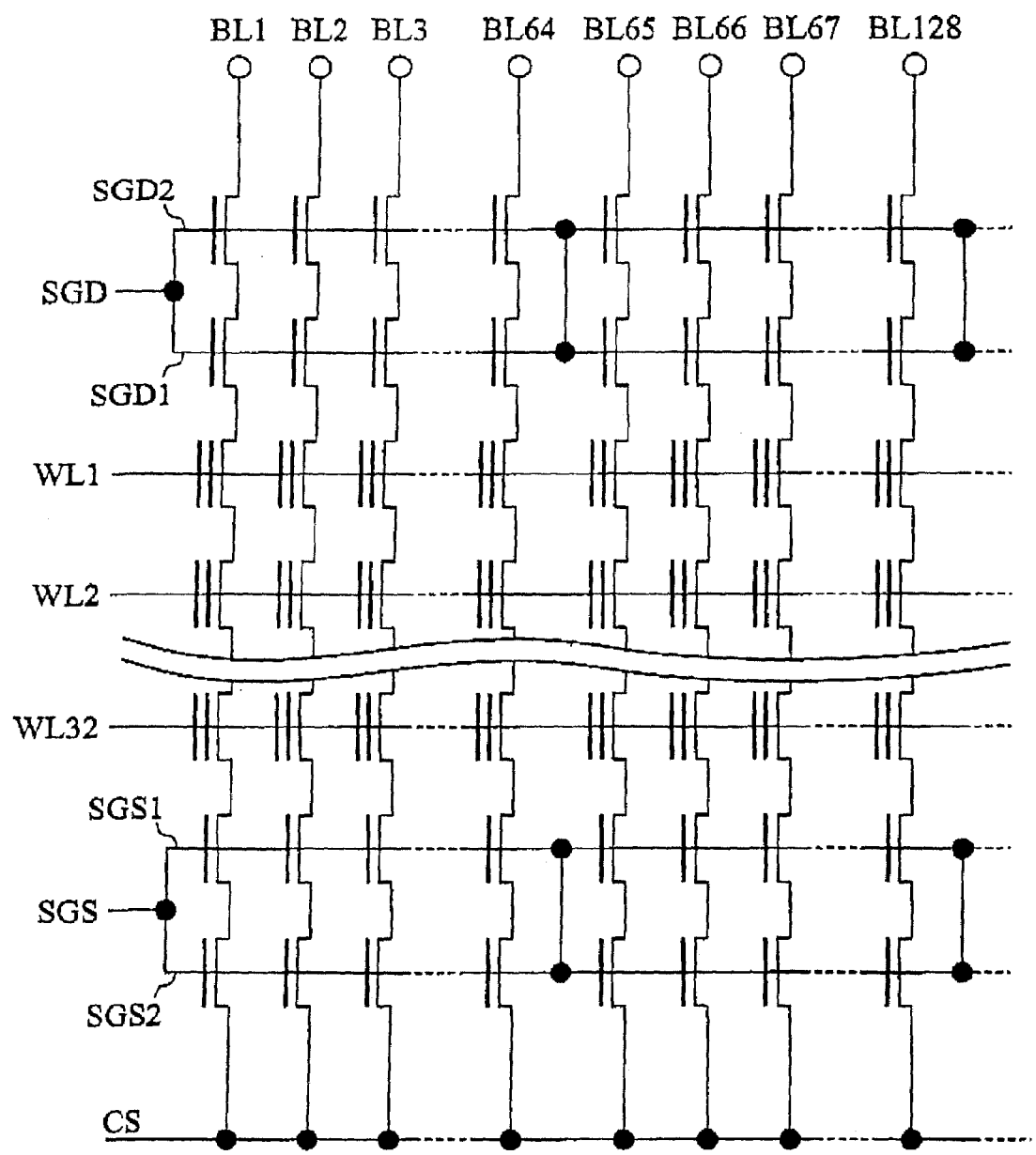
FIG. 33 is an illustrative circuit diagram of a nonvolatile semiconductor memory device configured with NAND flash memory according to a second embodiment of the present invention.

FIG. 33 illustrates the memory cell array configured by arranging the NAND flash memory cell units of the present invention. Two select gate lines SGD1 and SGD2 of the bit line side select transistor and two select gate lines SGS1 and SGS2 of the source line side select transistor are each short circuited every 64 bit lines, and configure the select gate line SGD of the bit line side select transistor and select gate SGS of the source line side select transistor. The present invention is also applicable to the case where occurrence of short-circuiting can be varied.

Modified Example 1 of the Second Embodiment

Figure 34:
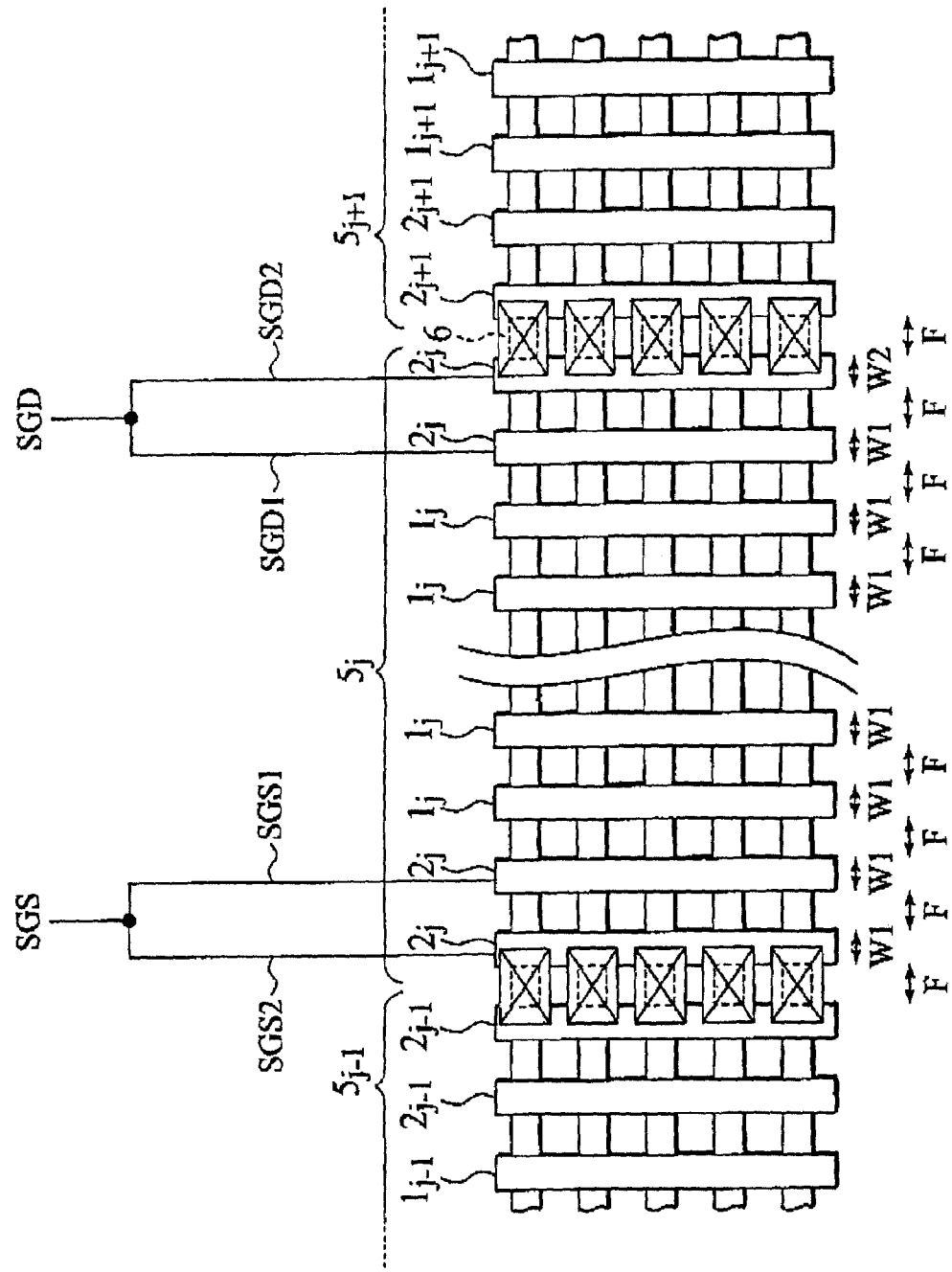
FIG. 34 is a planar view of an example of a nonvolatile semiconductor memory device configured with NAND flash memory according to the second embodiment of the present invention.

FIG. 34 illustrates an example where the gate length of only the select gate line SGD2 of the second bit line side select transistor is given as W2, and gate lengths of the select gate line SGD1 of the first bit line side select transistor, select gate line SGS1 of the first source line side select transistor, and select gate line SGS2 of the second source line side select transistor, and gate lengths of control gates (word lines) WL1 through WL32 of each memory cell gate 1 are given as W1, wherein W2 is made larger than W1.

In FIG. 34, two select gate lines SGD1 and SGD2 of the bit line side select transistor and two select gate lines SGS1 and SGS2 of the source line side select transistor are each short circuited every 64 bit lines, and configure the select gate line SGD of the bit line side select transistor and select gate SGS of the source line side select transistor. The modified example 1 of the present invention is also applicable to the case where occurrence of short-circuiting can be varied.

Modified Example 2 of the Second Embodiment

Figure 35:
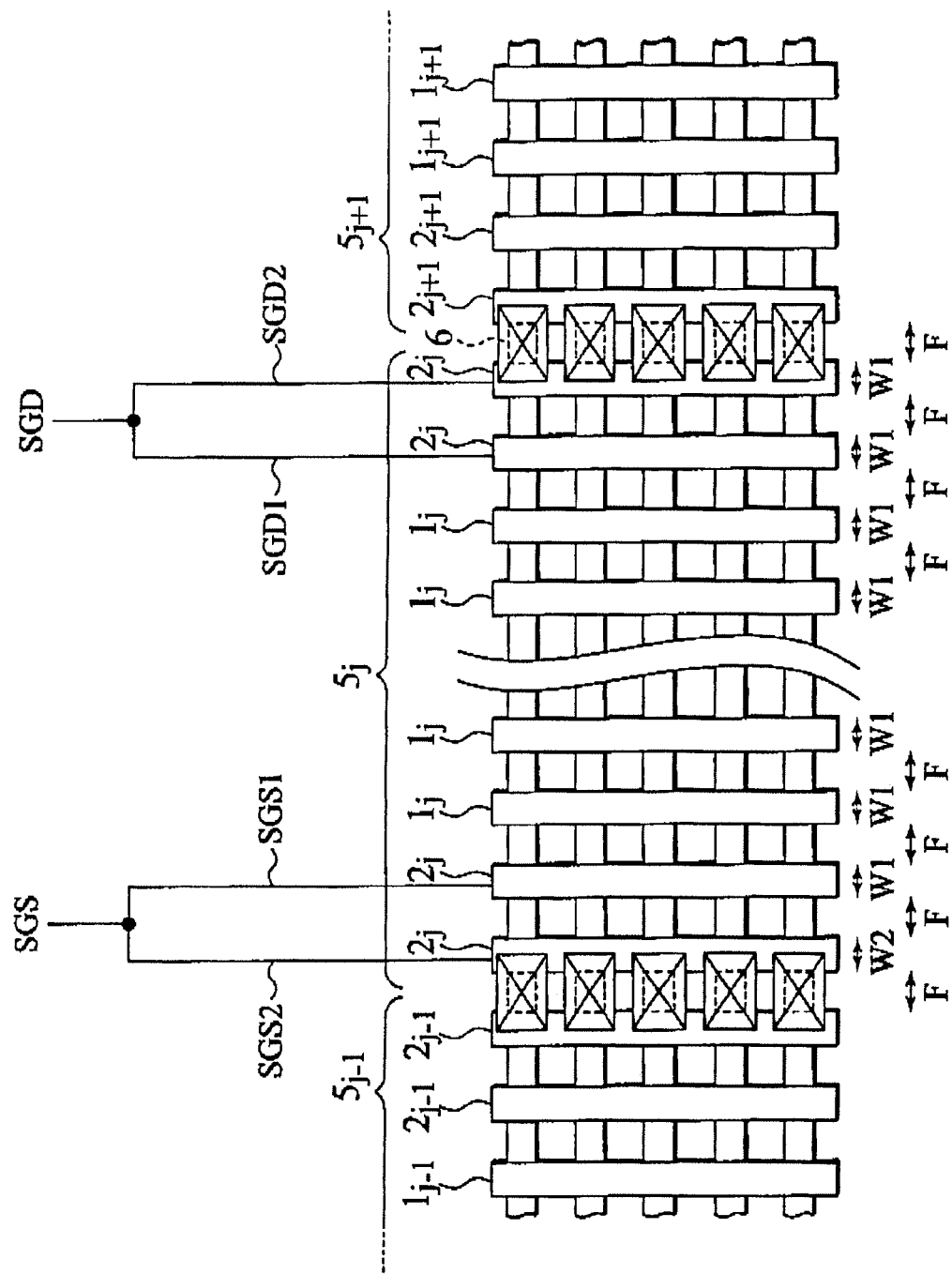
FIG. 35 is a planar view of an example of a nonvolatile semiconductor memory device configured with NAND flash memory according to the second embodiment of the present invention.

FIG. 35 illustrates an example where the gate length of only the select gate line SGS2 of the second source line side select transistor is given as W2, and gate lengths of the select gate line SGS1 of the first source line side select transistor, select gate line SGD1 of the first bit line side select transistor, and select gate line SGD2 of the second bit line side select transistor, and gate lengths of control gates (word lines) WL1 through WL32 of each memory cell gate 1 are given as W1, wherein W2 is made larger than W1.

In FIG. 35, two select gate lines SGD1 and SGD2 of the bit line side select transistor and two select gate lines SGS1 and SGS2 of the source line side select transistor are each short circuited every 64 bit lines, and configure the select gate line SGD of the bit line side select transistor and select gate SGS of the source line side select transistor. The modified example 2 of the present invention is also applicable to the case where occurrence of short-circuiting can be varied.

Modified Example 3 of the Second Embodiment

Figure 36:
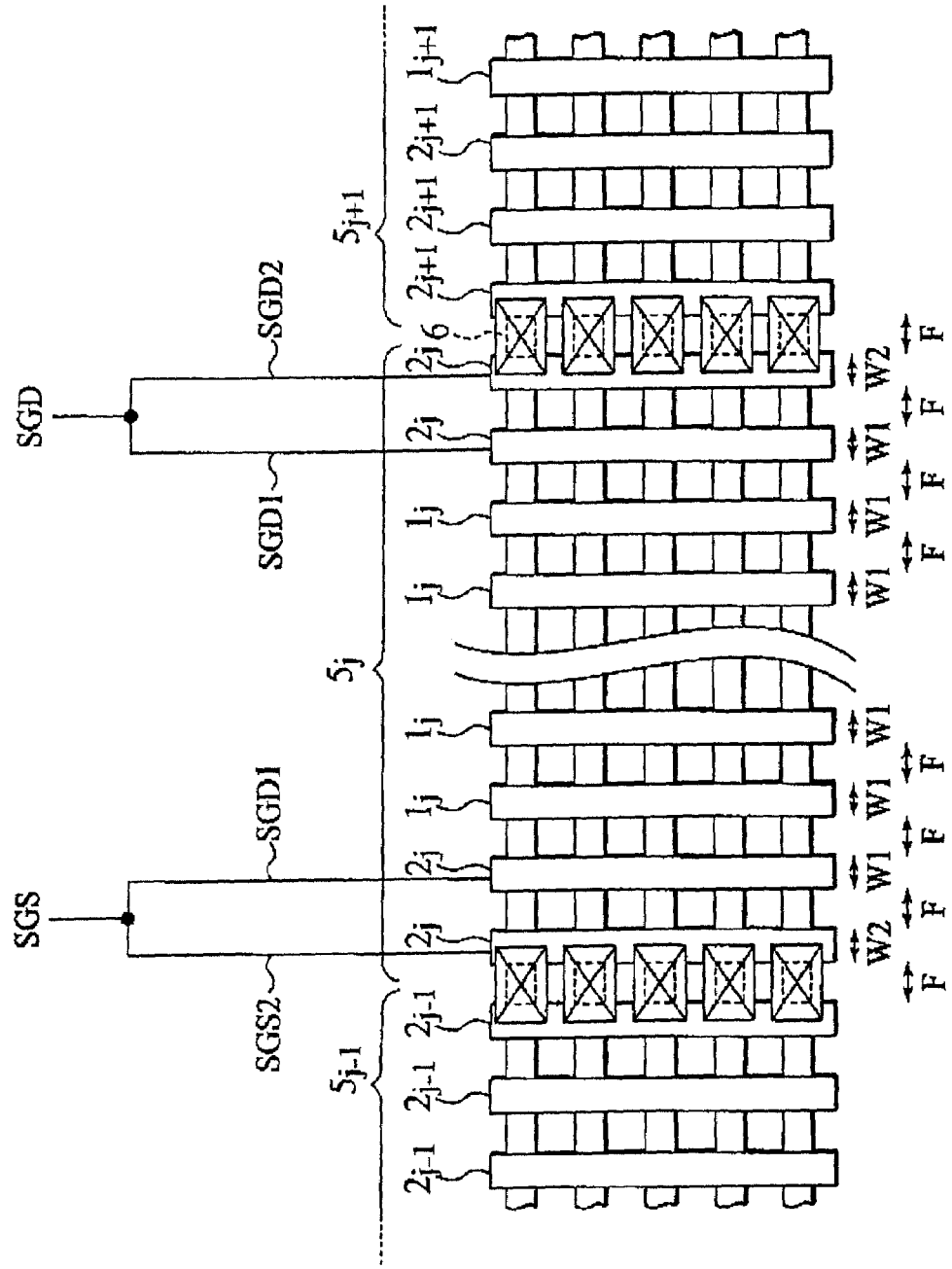
FIG. 36 is a planar view of an example of a nonvolatile semiconductor memory device configured with NAND flash memory according to the second embodiment of the present invention.

FIG. 36 illustrates an example where the gate lengths of only the select gate line SGD2 of the second bit line side select transistor and select gate line SGS2 of the second source line side select transistor are given as W2, and gate lengths of the select gate line SGD1 of the first bit line side select transistor and select gate line SGS1 of the first source line side select transistor, and gate lengths of control gates (word lines) WL1 through WL32 of each memory cell gate 1 are given as W1, wherein W2 is made larger than W1.

In FIG. 36, two select gate lines SGD1 and SGD2 of the bit line side select transistor and two select gate lines SGS1 and SGS2 of the source line side select transistor are each short circuited every 64 bit lines, and configure the select gate line SGD of the bit line side select transistor and select gate SGS of the source line side select transistor. The modified example 3 of the present invention is also applicable to the case where occurrence of short-circuiting can be varied.

Modified Example 4 of the Second Embodiment

Figure 37:
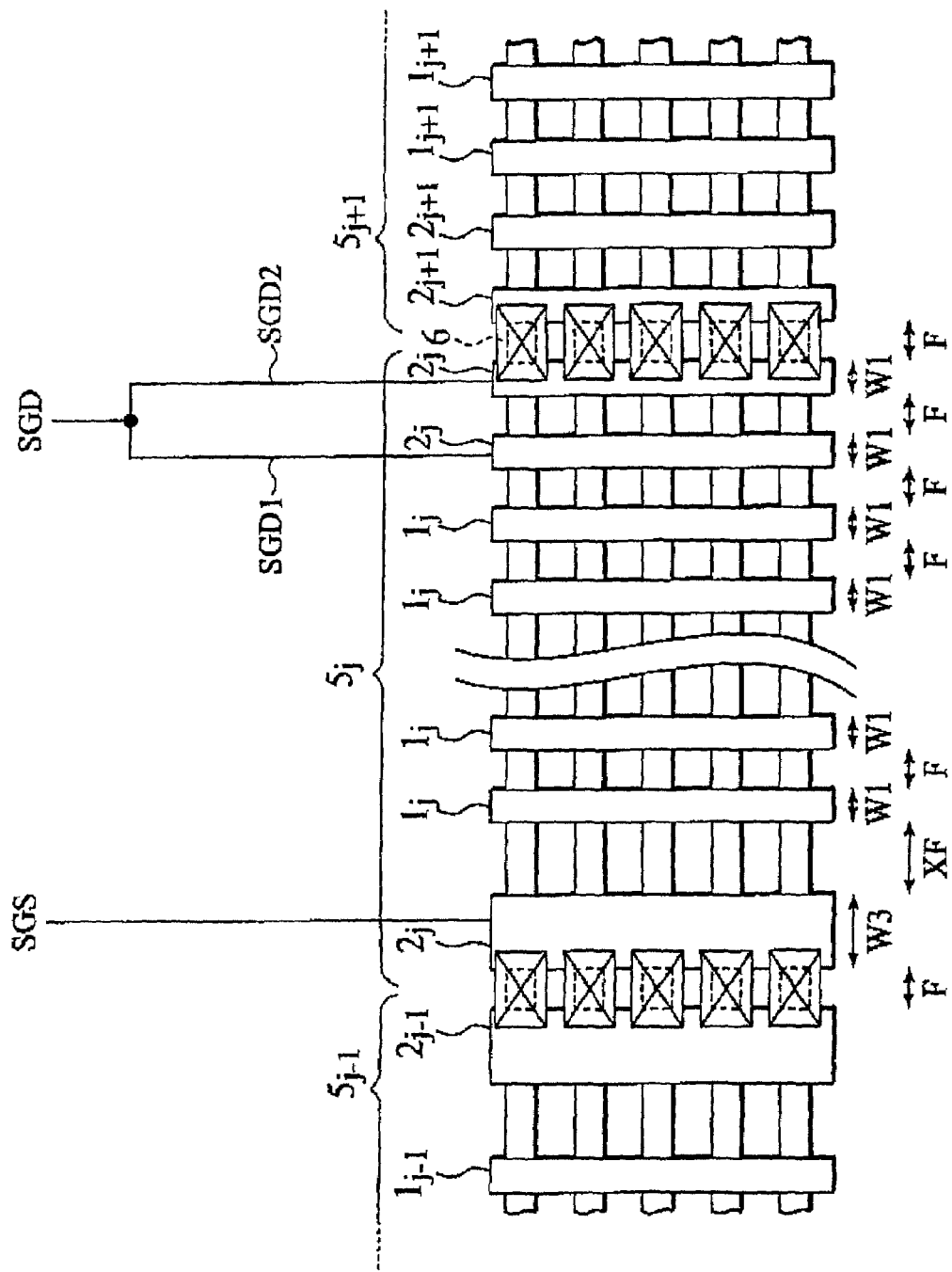
FIG. 37 is a planar view of an example of a nonvolatile semiconductor memory device configured with NAND flash memory, according to the second embodiment of the present invention.

FIG. 37 illustrates an example where the select gate lines of the bit line side select transistor are divided into two given as SGD1 and SGD2, and the select gate lines of the source line side select register are arranged into one, given as SGS. An example is shown where the gate length of only the source side select gate line SGS is given as W3, and the gate lengths of the select gate lines SGD1 and SGD2 of the bit line side select transistor and control gate (word lines) WL1 through WL32 of each memory cell gate 1 are given as W1, wherein W3 is made larger than W1. The distance separating the select gate line SGS of the source line side select transistor and the neighboring memory cell gate 1j is given as X F, wherein X F is larger than F.

In FIG. 37, two select gate lines SGD1 and SGD2 of the bit line side select transistor are short circuited every 64 bit lines, and configure the select gate line SGD of the bit line side select transistor. The modified example 4 of the present invention is also applicable to the case where occurrence of short-circuiting can be varied.

Modified Example 5 of the Second Embodiment

Figure 38:
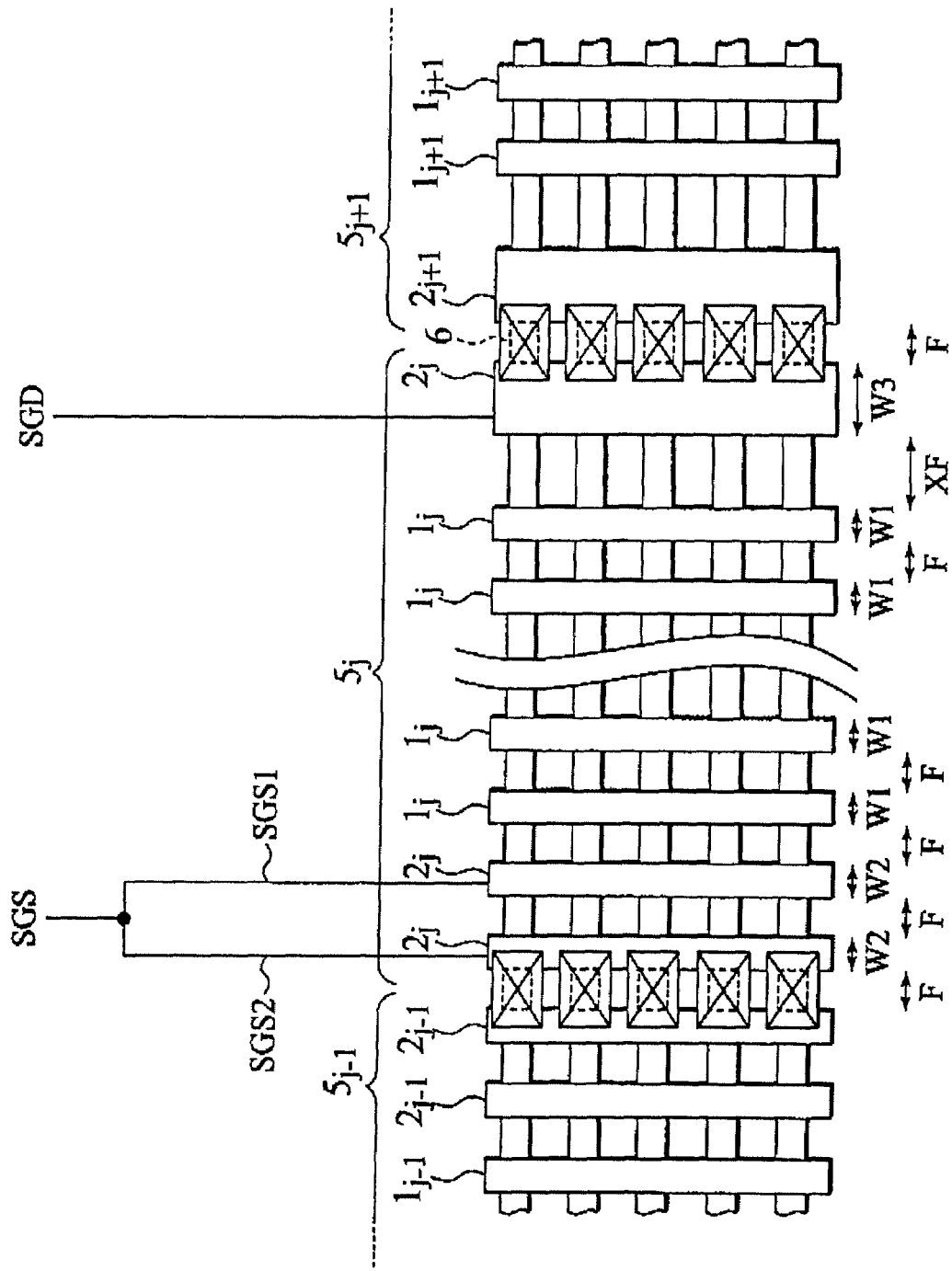
FIG. 38 is a planar view of an example of a nonvolatile semiconductor memory device configured with NAND flash memory according to the second embodiment of the present invention.

FIG. 38 illustrates an example where the select gate lines of the source line side select transistor are divided into two given as SGS1 and SGS2, and the select gate lines of the bit line side select register are arranged into one, given as SGD. An example is shown where the gate length of only the select gate line SGD of the bit line side select transistor is given as W3, and the gate lengths of the select gate lines SGS1 and SGS2 of the source line side select transistor and control gates (word lines) WL1 through WL32 of each memory cell gate 1j are given as W1, wherein W3 is made larger than W1. The distance separating the select gate line SGD of the bit line side select transistor and neighboring memory cell gate 1j is given as X F, wherein X F is larger than F.

In FIG. 38, two select gate lines SGS1 and SGS2 of the source line side select transistor are short circuited every 64 bit lines, and configure the select gate line SGS of the source line side select transistor. The modified example 5 of the present invention is also applicable to the case where occurrence of short-circuiting can be varied.

Modified Example 6 of the Second Embodiment

Figure 39:
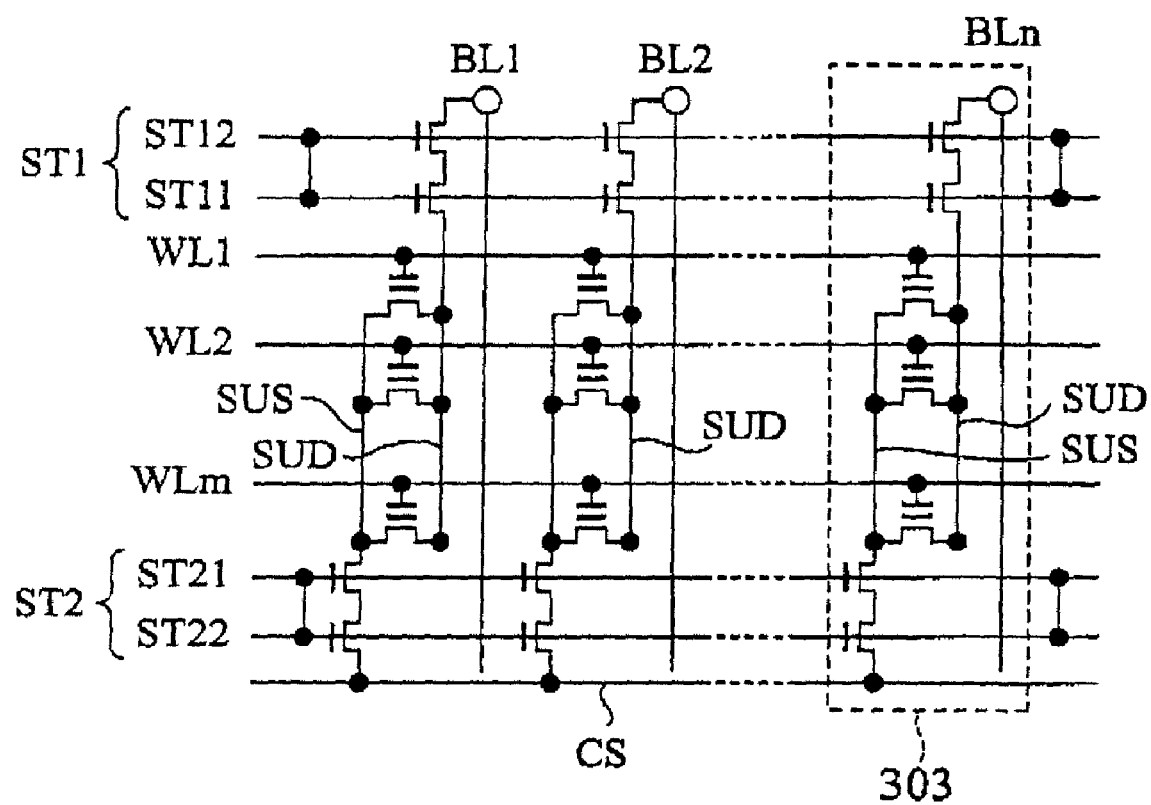
FIG. 39 is an illustrative circuit diagram of a nonvolatile semiconductor memory device configured with AND flash memory according to the second embodiment of the present invention.

FIG. 39 is an illustrative circuit diagram of the nonvolatile semiconductor memory device configured with an AND flash memory according to the modified example 6 of the second embodiment of the present invention. An example is shown where the present invention is applied to the AND memory cell unit. The two bit line side select gate line ST11 and ST12, and two source line side select gate line ST21 and ST22 are short circuited every arbitrary bit line, and configure one bit line side select gate line ST1 and one source line side select gate line ST2, respectively. Word lines WL1, WL2 through WLm are arranged perpendicular to the bit lines BL1, BL2 through BLn. In FIG. 39, the region 303 enclosed by a dotted line indicates the AND memory cell unit. The source line CS is configured to have a electrically common potential. The AND flash memory unit 303 is configured with 128 unit cells and two select gate lines ST11, ST12 which connect sub bit lines SUD to the bit lines BL1, BL2, . . . , BLn and two select gate lines ST21, ST22 which connect sub source lines SUS to common source line CS in the case of an AND flash memory. For example, the 128 unit memory cells are inserted between the sub bit line SUD and sub source line SUS in parallel.

Features of this memory cell array include a pseudo contact-less configuration employed where the bit line BL1. BL2, . . . , BLn and source line CS interconnections are configured to have a hierarchical structure and the sub bit line SUD and the sub source line SUS are diffused layers.

Modified Example 7 of the Second Embodiment

Figure 40:
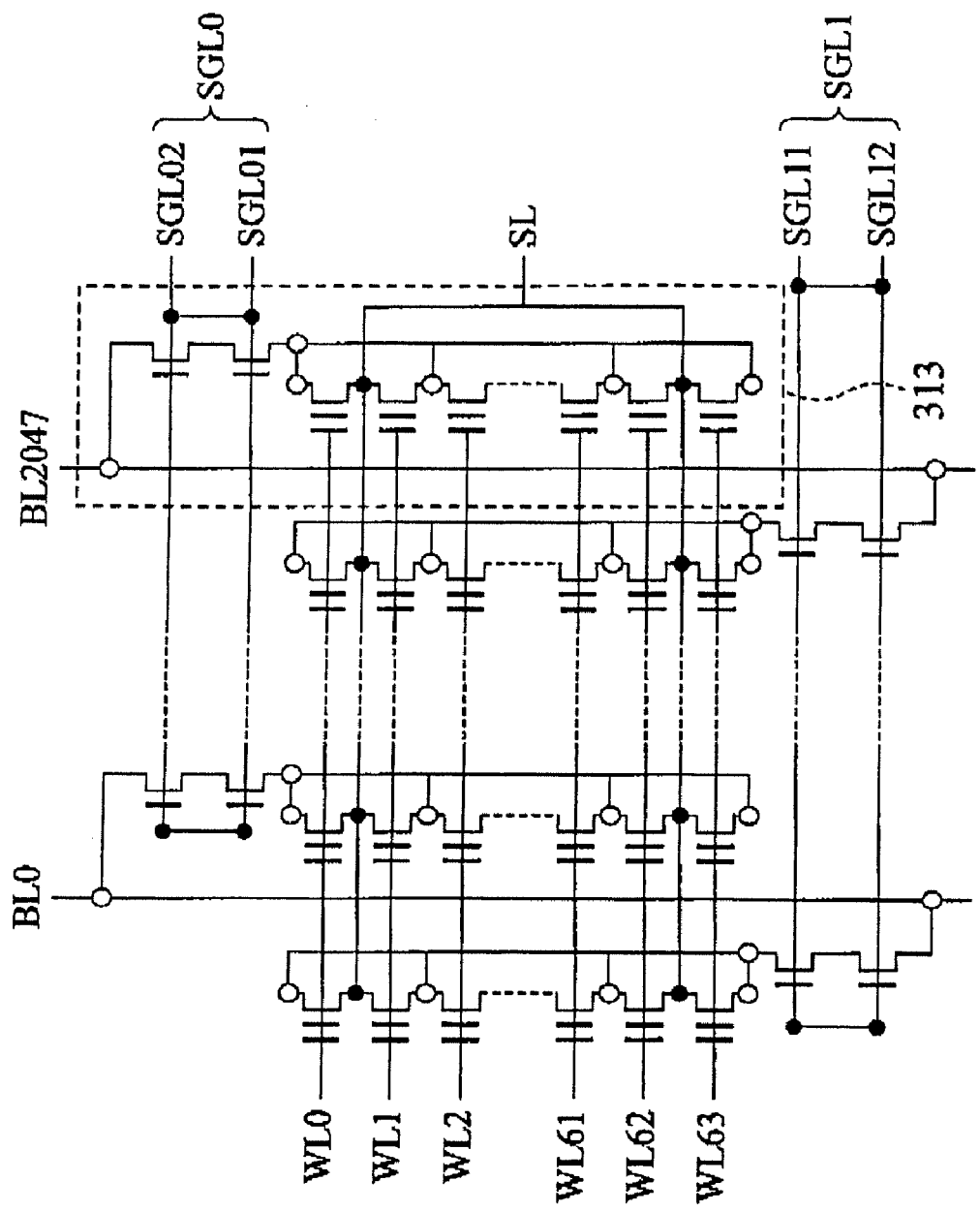
FIG. 40 is an illustrative circuit diagram of a nonvolatile semiconductor memory device configured with divided bit line NOR flash memory according to the second embodiment of the present invention.

As in the modified example 7 of the second embodiment of the present invention, the schematic circuit configuration of the divided bit line NOR flash memory includes components as shown in FIG. 40. Specifically, the bit lines BL0, BL1, . . . , BL2047 and the sub bit line SUD configured to have a hierarchical structure in the DINOR memory cell array, two select gate lines SGL11 and SGL12 on the bottom page side, and two select gate lines SGL01 and SGL02 on the top page side both for connecting between the bit lines and the sub bit lines SUD. The top page side two select gate lines SGL01 and SGL02, and bottom page two side select gate line SGL11 and SGL12 are short circuited every arbitrary bit line, and configure one select gate line SGL0 and one select gate line SGL1, respectively. In addition, in the DINOR memory cell array, word lines WL0 through WL63 are arranged perpendicular to the bit lines BL0 through BL2047, with a memory cell row connected to each word line. The source region of each memory cell is connected to a common source line SL so as to provide a common electric potential. In FIG. 40, an area 313 enclosed by a dotted line indicates the DINOR memory cell unit. In addition, a closed circle "●" indicates a diffused layer region, and an open circle "○" indicates a contact region.

Modified Example 8 of the Second Embodiment

Figure 41:
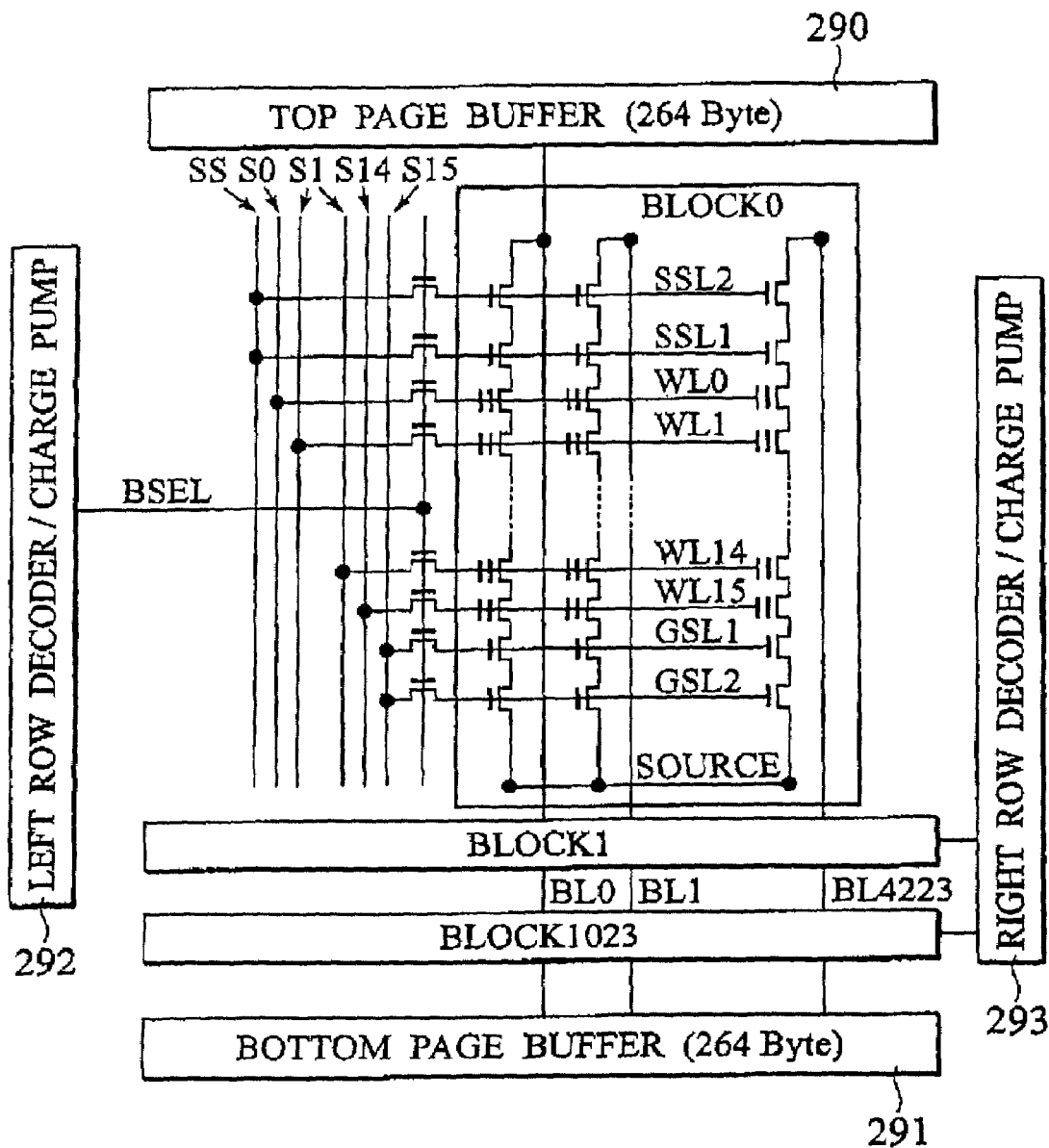
FIG. 41 is an illustrative circuit diagram of the nonvolatile semiconductor memory device configured with 64 M-bit NAND flash memory according to the second embodiment of the present invention.

As the nonvolatile semiconductor memory device according to the modified example 8 of the second embodiment of the present invention, the illustrative circuit configuration of the 64M-bit NAND flash memory has, as shown in FIG. 41, two select gates SSL1 and SSL2 on bit line side of the NAND string, and two select gates GSL1 and GSL2 on the source side. In FIG. 41, block 0 through block 1023 which are configured with an NAND memory cell array are arranged, with a top page buffer 290, bottom page buffer 291, left row decoder/charge pump 292, and right row decoder/charge pump 293. In addition, in FIG. 41, word lines WL0 through WL 15 are arranged parallel to the lines of select gate lines SSL1, SSL2, GSL1, and GSL2, and bit lines BL0, BL1, through BL4223 are arranged perpendicular to such word lines. The features of FIG. 41 are the fact that the select gate lines SSL1 and SSL2 are short circuited, and select gate lines GSL1 and GSL2 are short circuited.

With the modified example 8 of the second embodiment of the present invention, it is possible to provide a system and a semiconductor memory device that aims to improve reliability by preventing a breakdown of the resist and fluctuation in the processing of the gate length of the control gate due to breaks in the regularity of the pattern during gate processing. This improvement is achieved through the dividing of the select gate of the select transistor into a first transistor and second transistor, and synchronizing at least the gate length of the first select transistor near the control gate (in the word line) and the space between gates with the pitch of the gate length of the control gate and the space between the gates.

By dividing the select transistors, there is no need for the space between the select transistor and neighboring control gate and the gate length of the select transistor for improving the punch-through immunity to be longer than that of the control gate. As a result, it is possible to minimize chip size, and to achieve cost reductions in addition to process and reliability improvements. As the design rule is miniaturized further, the effect of the present invention is more pronounced.

Accordingly, with the modified example 8 of the second embodiment of the present invention, it is possible to provide a highly reliable, and low cost semiconductor memory device.

Third Embodiment

In the third embodiment of the present invention, isolating characteristics between the memory cell gate and bit line DQ or source line CS are improved by dividing the select gate in three. As with the first embodiment of the present invention, different signal potentials may be supplied to the select gates. Alternatively, as with the second embodiment of the present invention, the select gates short circuit at a predetermined pitch, and a technique is employed to reduce the delay of signals propagated on the select gate line.

Figure 42:
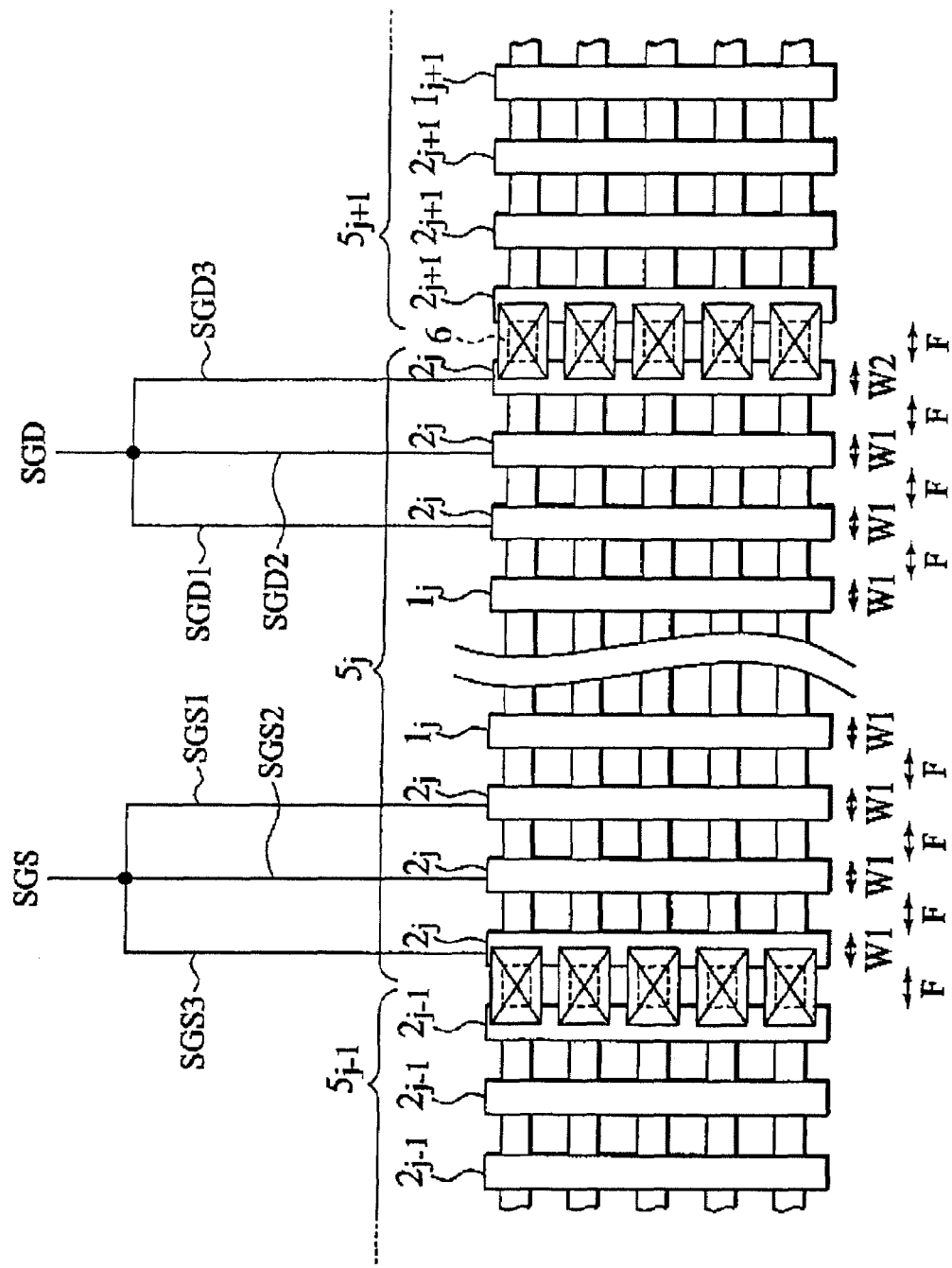
FIG. 42 is a planar view of an example of a nonvolatile semiconductor memory device configured with NAND flash memory according to a third embodiment of the present invention.

FIG. 42 is a planar view of an example of a nonvolatile semiconductor memory device, configured with the NAND flash memory according to a third embodiment of the present invention. The memory cell array is configured by arranging the NAND flash memory cell units of the present invention in an array is illustrated. Three gate lines SGD1, SGD2, and SGD3 of the bit line side select transistor and three gate lines SGS1, SGS2, and SGS3 of the source line side select transistor are short circuited every 64 bit lines respectively, and configure the gate line SGD of the bit line side select transistor and select gate SGS of the source line side select transistor. The third embodiment of the present invention is also applicable to the case where occurrence of short-circuiting can be varied.

FIG. 42 illustrates an example where the gate length of only the gate line SGB3 of the third bit line side select transistor is given as W2, and the gate lengths of the gate line SGD1 of the first bit line side select transistor, gate line SGD2 of the second bit line side select transistor, gate line SGS1 of the first source line side select transistor, gate line SGS2 of the second source line side select transistor, gate line SGS3 of the third source line side select transistor, and gate lengths of control gates (word lines) WL1 through WL32 are given as W1, wherein W2 is made larger than W1. In addition, three bit line side select gate lines SGD1. SGD2, SGD3 may be isolated electrically and three different signal potentials can be applied to them, respectively. In the same way, three source line side select gate lines SGS1, SGS2, SGS3 may be isolated electrically and three different signal potentials can be applied to them, respectively.

Figure 43:
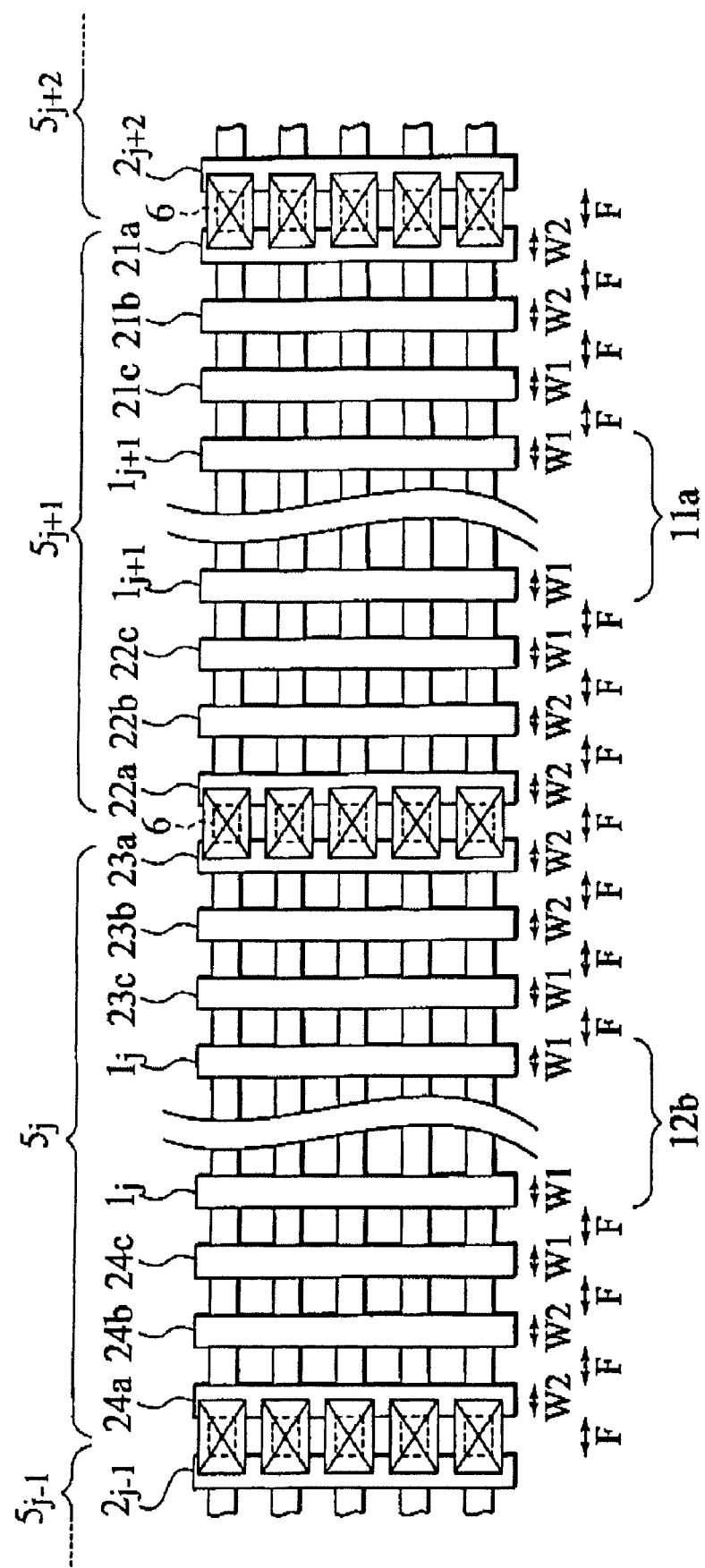
FIG. 43 is a planar view describing a pattern configuration where the planar view shown in FIG. 42 is extended along the NAND strings, and repeated along the bit lines.

FIG. 43 is a planar view describing a pattern configuration which is configured by extending the planar view shown in FIG. 42 along a direction of the NAND strings 5j, 5j+1, . . . and repeating the pattern of the NAND strings 5j, 5j+1, . . . along the bit line. A first memory cell gate group 11a includes first select gate groups 21a, 21b, and 21c adjacent to the drain side, and second select gate groups 22a, 22b,a and 22c adjacent to the source side. A second memory cell gate group 12b includes third select gate groups 23a, 23b, and 23c adjacent to the source side, and fourth select gate groups 24a, 24b, and 24c adjacent to the drain side. In this manner, the NAND strings 5j are arranged with a repeat pattern configuration centered about the drain side bit line DQ or the source side source line CS. Three select gate lines SGD1, SGD2, and SGD3 of the bit line side select transistor are short circuited, however, this description is omitted. In addition, three select gate lines SGS1, SGS2, and SGS3 of the source line side select transistor are short circuited, however, this description is omitted. Alternatively, as described above, three different signal potentials can be applied for three bit line side select gate lines SGD1, SGD2 and SGD3, respectively. In the same way, three different signal potentials can be applied for three source line side select gate lines SGS1, SGS2 and SGS3, respectively.

Modified Example 1 of the Third Embodiment

Figure 44:
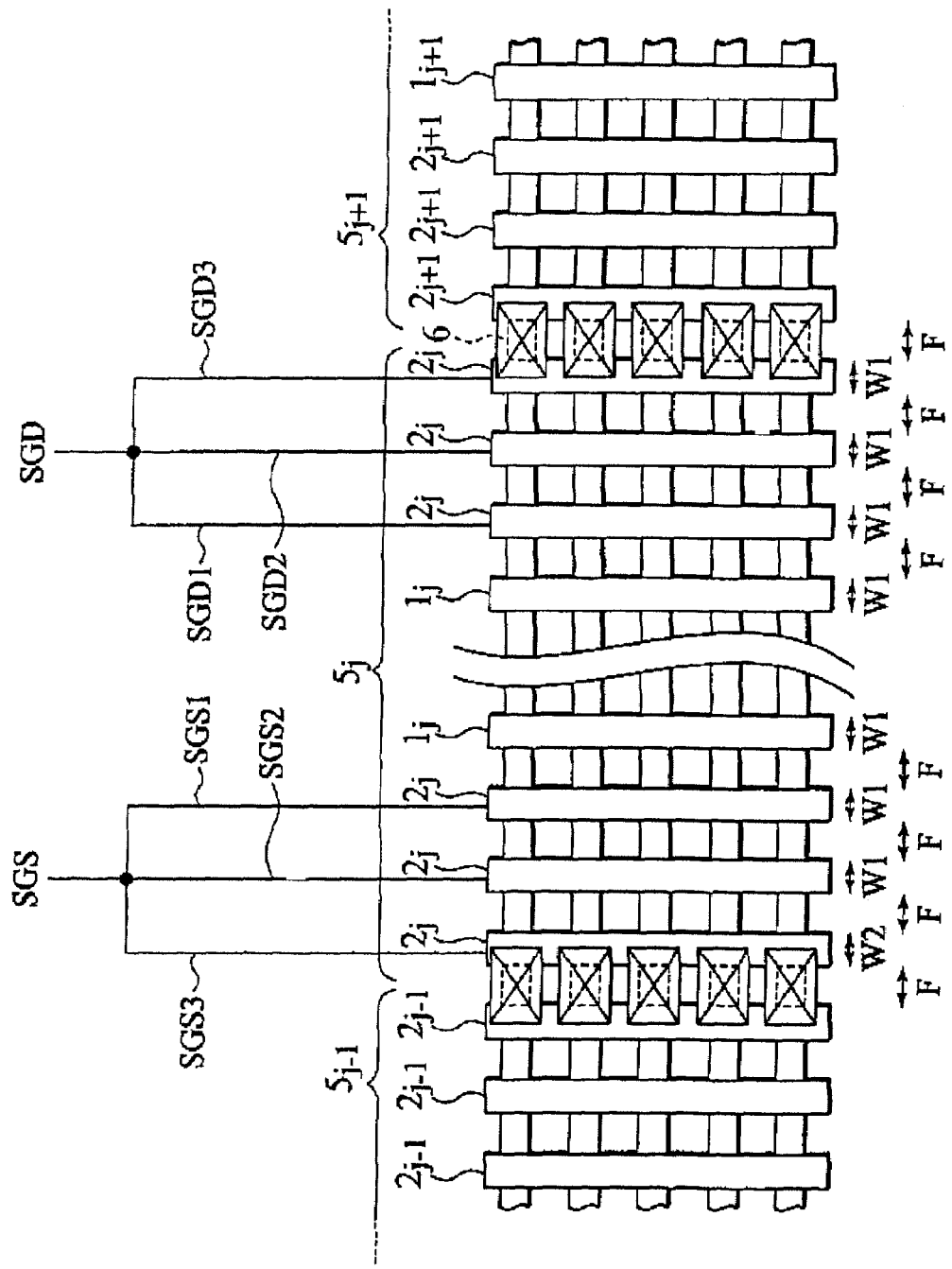
FIG. 44 is a planar view of an example of a nonvolatile semiconductor memory device configured with the NAND flash memory according to the third embodiment of the present invention.

FIG. 44 is a planar view of an example of a nonvolatile semiconductor memory device, configured with the NAND flash memory according to the modified example 1 of the third embodiment of the present invention.

In FIG. 44, three select gate lines SGD1, SGD2 and SGD3 of the bit line side select transistors and three select gate lines SGS1, SGS2 and SGS3 of the source line side select transistors are each short circuited every 64 bit lines, and configure the select gate line SGD of the bit line side select transistor and select gate SGS of the source line side select transistor. The modified example 1 of the present invention is also applicable to the case where occurrence of short-circuiting can be varied.

FIG. 44 illustrates an example where the gate length of only the select gate line SGS3 of the third source side select transistor is given as W2, and the gate lengths of the gate line SGS1 of the first source line side select transistor, gate line SGS2 of the second source line side select transistor, gate line SGD1 of the first bit line side select transistor, gate line SGD2 of the second bit line side select transistor, and gate line SGD3 of the third bit line side select transistor, and gate lengths of control gates (word lines) WL1 through WL32 are given as W1, wherein W2 is made larger than W1.

Alternatively, as described above, three different signal potentials can be applied for three bit line side select gate lines SGD1, SGD2 and SGD3, respectively. In the same way, three different signal potentials can be applied for three source line side select gate lines SGS1, SGS2 and SGS3, respectively.

Modified Example 2 of the Third Embodiment

Figure 45:
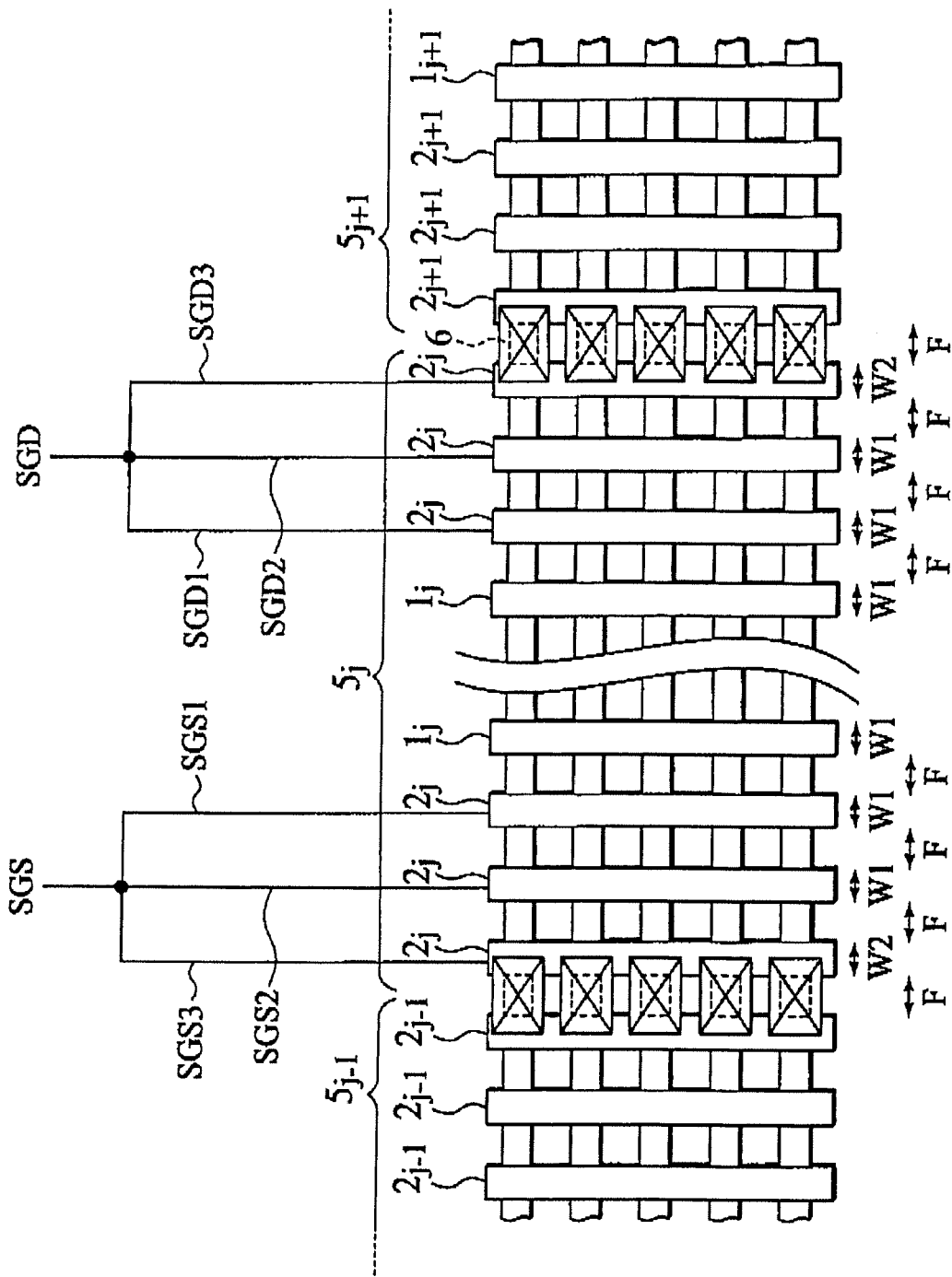
FIG. 45 is a planar view of an example of a nonvolatile semiconductor memory device configured with the NAND flash memory according to the third embodiment of the present invention.

FIG. 45 is a planar view of an example of the nonvolatile semiconductor memory device configured with the NAND flash memory according to the modified example 3 of the third embodiment of the present invention. FIG. 45 illustrates an example where the gate lengths of only the gate line SGD3 of the third bit line side select transistor and the gate line SGS3 of the third source line side select transistor are given as W2, and the gate lengths of the gate line SGD1 of the first bit line side select transistor, the gate line SGD2 of the second bit line side select transistor, gate line SGS1 of the first source line side select transistor, and gate line SGS2 of the second source line side select transistor, and the gate lengths of control gates (word lines) WL1 through WL32 are given as W1, wherein W2 is made larger than W1.

In FIG. 45, three select gate lines SGD1, SGD2 and SGD3 of the bit line side select transistors and three select gate lines SGS1, SGS2 and SGS3 of the source line side select transistors are each short circuited every 64 bit lines, and configure the select gate line SGD of the bit line side select transistor and select gate SGS of the source line side select transistor. The modified example 2 of the present invention is also applicable to the case where occurrence of short-circuiting can be varied.

Alternatively, as described above, three different signal potentials can be applied for three bit line side select gate lines SGD1 SGD2 and SGD3, respectively. In the same way, three different signal potentials can be applied for three source line side select gate lines SGS1, SGS2 and SGS3, respectively.

Modified Example 3 of the Third Embodiment

Figure 46:
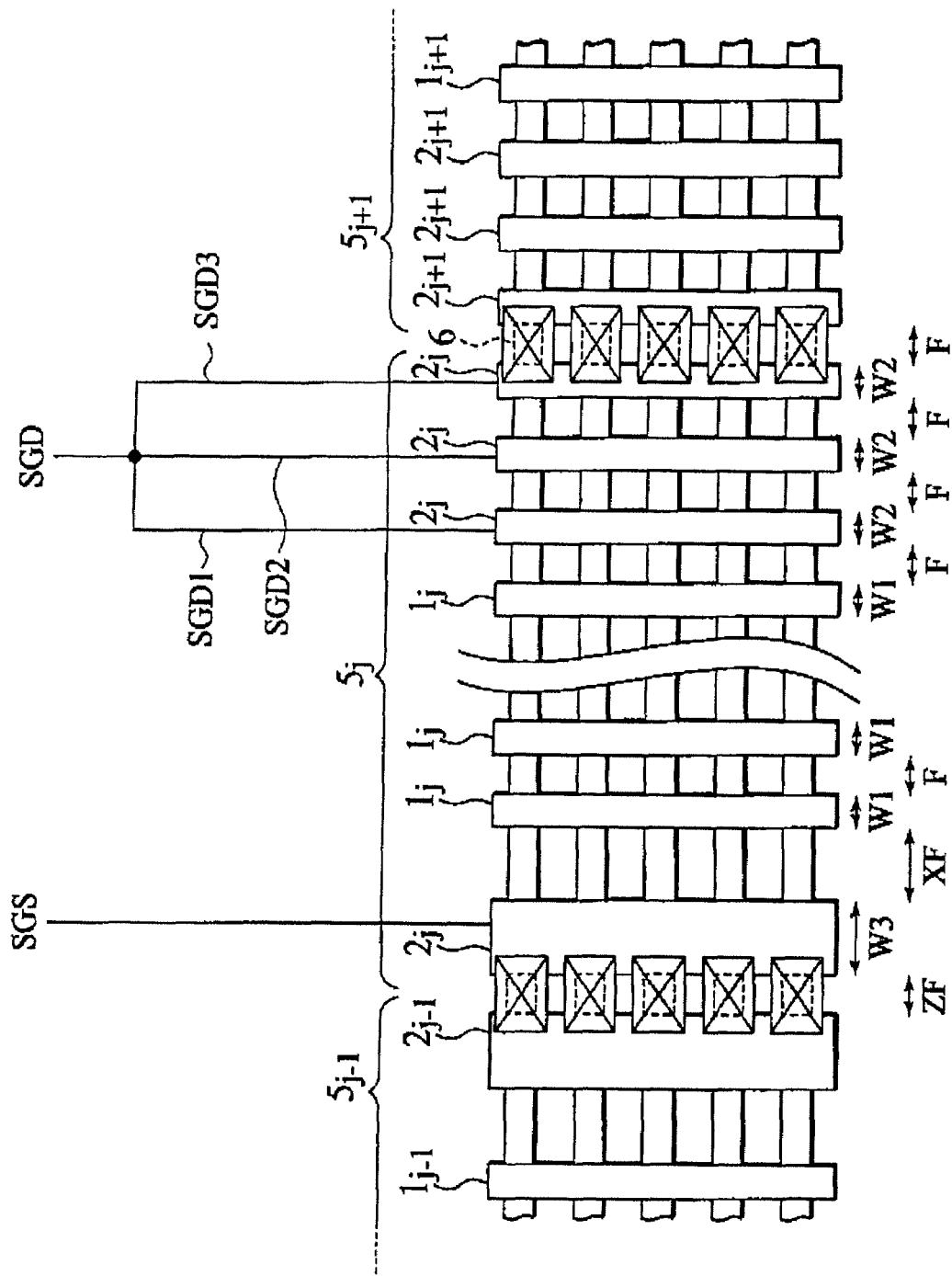
FIG. 46 is a planar view of an example of a nonvolatile semiconductor memory device configured with the NAND flash memory according to the third embodiment of the present invention.

FIG. 46 is a planar view of an example of the nonvolatile semiconductor memory device configured with the NAND flash memory according to the modified example 3 of the third embodiment of the present invention. FIG. 46 illustrates an example where the select gate line of the bit line side select transistor is divided into three given as SGD1, SGD2, and SGD3, and the select gate line of the source line side select transistor are arranged as one, given as SGS. An example is shown where the gate length of only the source side select gate line SGS is given as W3, and the gate lengths of the select gate lines SGD1, SGD2, and SGD3 of the bit line side select transistor and control gates (word lines) WL1, WL2 through WL32 of each memory cell gate 1j are given as W1, wherein W3 is made larger than W1. The distance separating the select gate line SGS of the source line side select transistor and the neighboring memory cell gate 1j is given as X F, wherein X F is larger than F.

In FIG. 46, three select gate lines SGD1, SGD2 and SGD3 of the bit line side select transistors are short circuited every 64 bit lines, and configure the select gate line SGD of the bit line side select transistor. The modified example 3 of the present invention is also applicable to the case where occurrence of short-circuiting can be varied.

Modified Example 4 of the Third Embodiment

Figure 47:
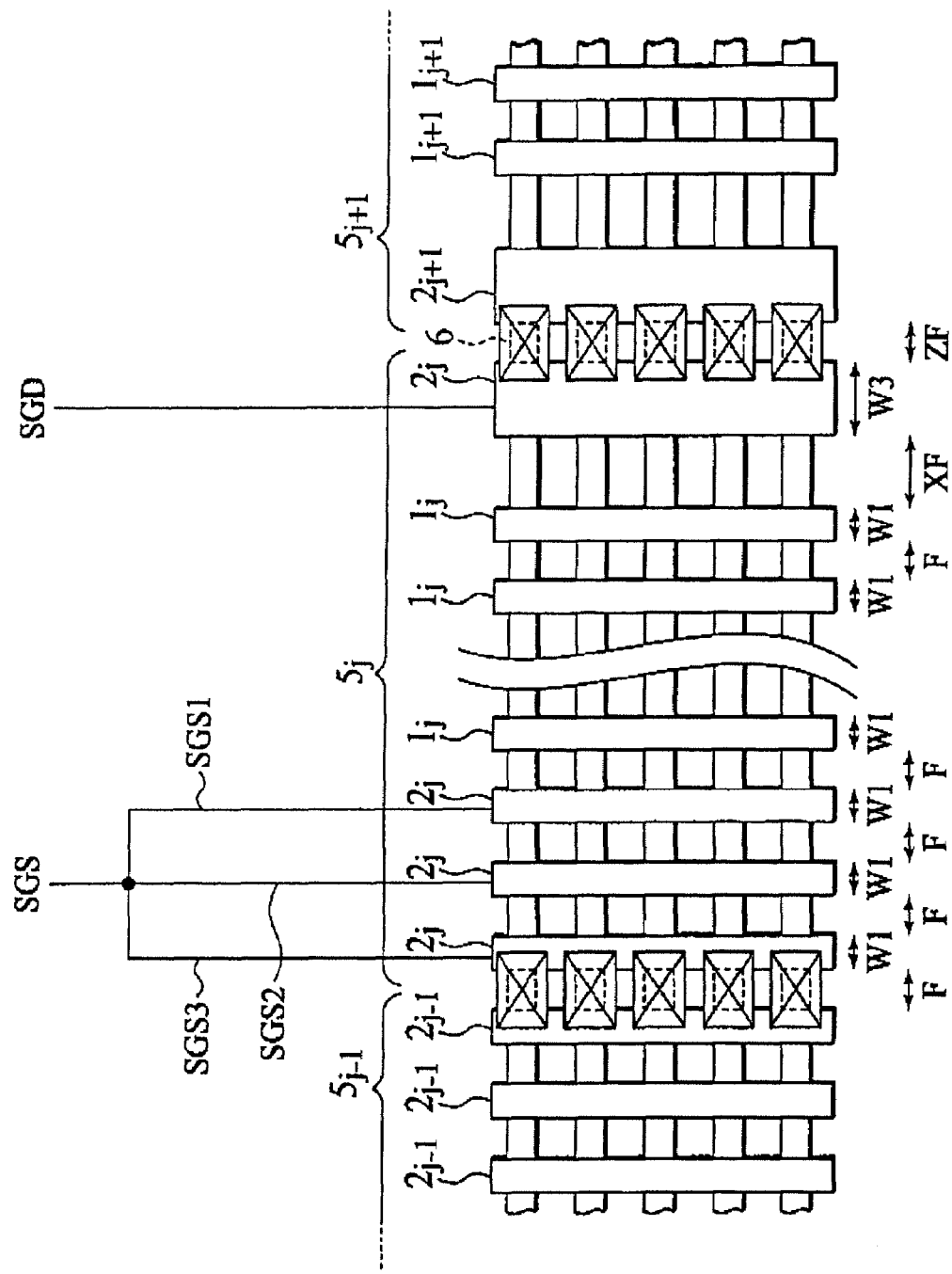
FIG. 47 is a planar view of an example of a nonvolatile semiconductor memory device configured with the NAND flash memory according to the third embodiment of the present invention.

FIG. 47 is a planar view of an example of the nonvolatile semiconductor memory device configured with the NAND flash memory according to the third embodiment of the present invention. FIG. 47 illustrates an example where the select gate line of the source line side select transistor is divided into three given as SGS1, SGS2, and SGS3, and the select gate line of the bit line side select register are arranged as one, given as SGS. An example is shown where the gate length only of the select gate line SGD of the bit line side select transistor is given as W3, and the gate lengths of the select gate lines SGS1, SGS2, and SGS3 of the source line side select transistor and control gates (word lines) WL1, WL2 through WL32 of each memory cell gate 1 are given as W1, wherein W3 is made larger than W1. The distance separating the select gate line SGD of the bit line side select transistor and neighboring memory cell gate 1j is given as X F, wherein X F is larger than F.

In FIG. 47, three select gate lines SGS1, SGS2 and SGS3 of the source line side select transistors are short circuited every 64 bit lines, and configure the select gate line SGS of the source line side select transistor. The modified example 4 of the present invention is also applicable to the case where occurrence of short-circuiting can be varied.

Alternatively, as described above, three different signal potentials can be applied for three source line side select gate lines SGS1, SGS2 and SGS3, respectively.

Modified Example 5 of the Third Embodiment

Figure 48:
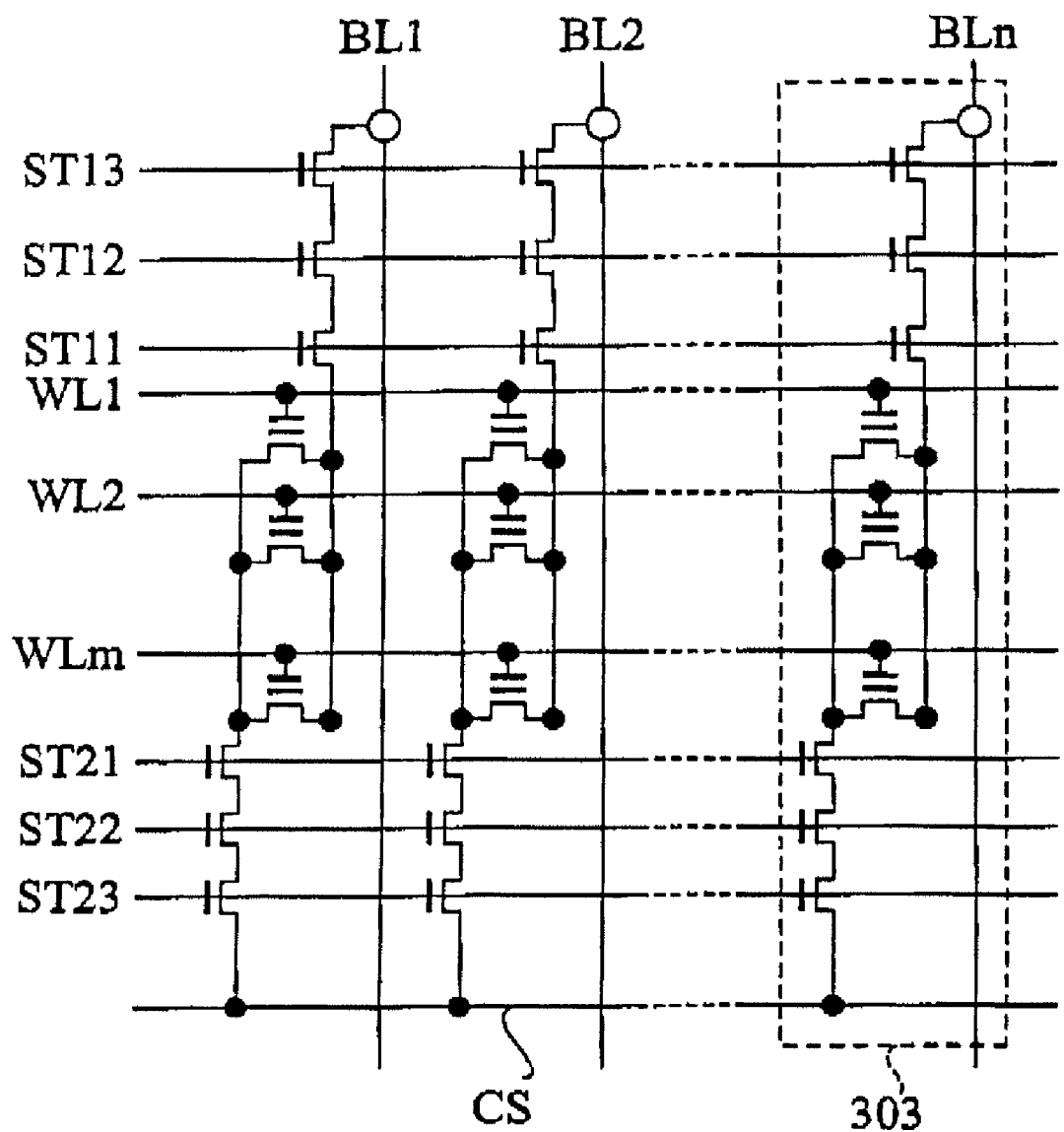
FIG. 48 is an illustrative circuit diagram of the nonvolatile semiconductor memory device configured with the AND flash memory according to the third embodiment of the present invention.

FIG. 48 is a circuit diagram of an example of the nonvolatile semiconductor memory device configured with the AND flash memory according to the modified example 5 of the third embodiment of the present invention. As shown in FIG. 48, the bit line select gate is divided in three, ST11, ST12, and ST13. In addition, the source line side select gate is divided into three, ST21, ST22, and ST23. As with the first embodiment of the present invention, different signals may be supplied to these gates from the control circuit. Alternatively, as with the second embodiment of the present invention, the select gates may be short circuited at a predetermined pitch, and a technique employed to reduce the delay of signals propagated on the select gate line.

In FIG. 48, word lines WL1, WL2 through WLm are arranged perpendicular to the bit lines BL1, BL2 through BLn. The region 303 enclosed by a dotted line indicates the AND memory cell unit. The source line CS is configured to have a common electrical potential. The AND flash memory unit 303 is configured with 128 unit cells and three select gate lines ST11, ST12 and ST13 which connect sub bit lines SUD to the bit lines BL1, BL2, . . . , BLn and three select gate lines ST21, ST22 and ST23 which connect sub source lines SUS to common source line CS, for example, which is inserted between the sub bit line SUD and sub source line SUS in parallel. The features of this memory cell array is that a pseudo contactless configuration is employed where the bit line BL1, BL2, . . . , BLn and source line CS interconnections are configured to have a hierarchical structure and the sub bit line SUD and the sub source line SUS are made of diffused layers.

Modified Example 6 of the Third Embodiment

Figure 49:
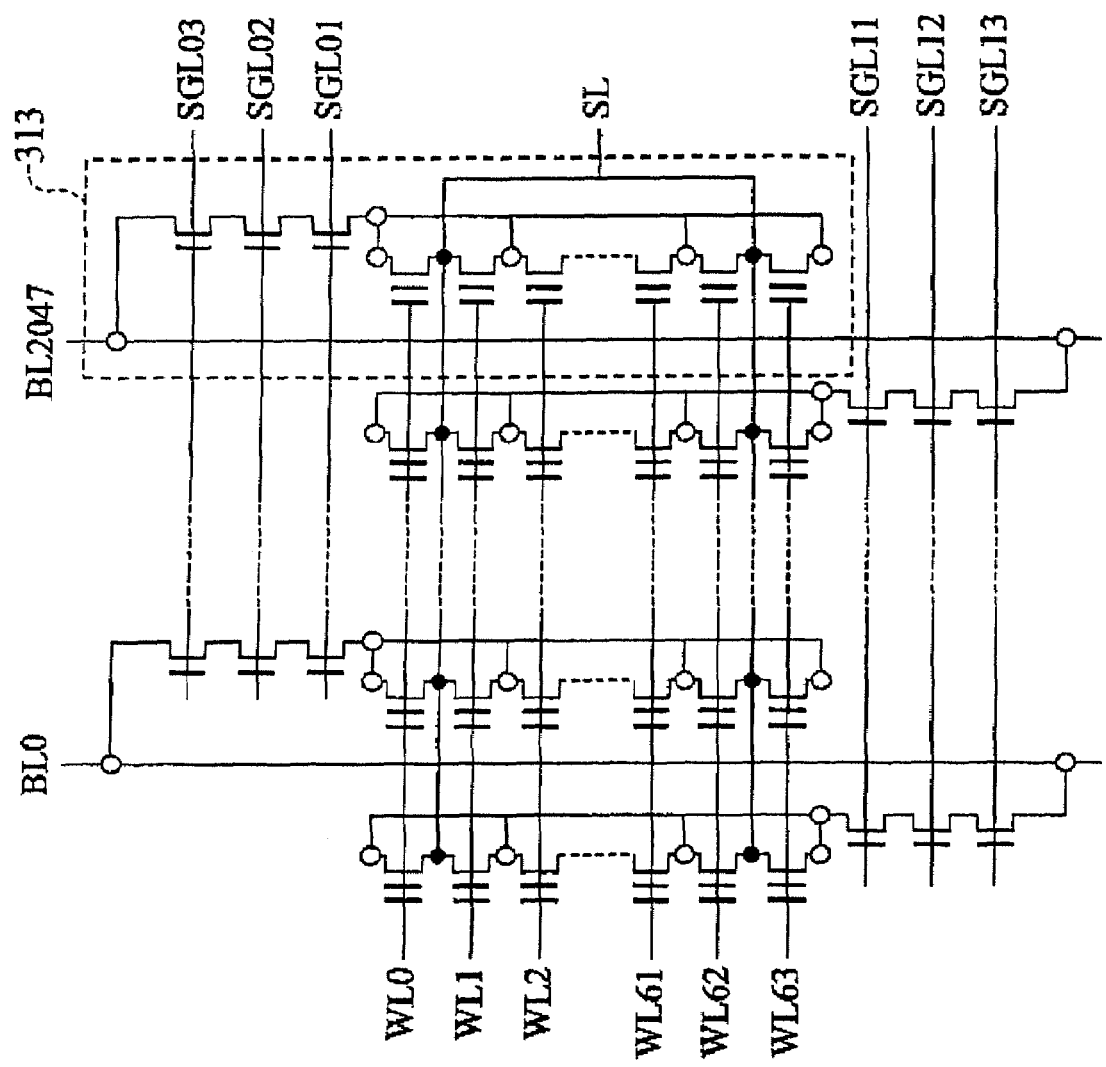
FIG. 49 is an illustrative circuit diagram of the nonvolatile semiconductor memory device configured with divided bit line NOR flash memory according to the third embodiment of the present invention.

FIG. 49 is an illustrative circuit diagram of the nonvolatile semiconductor memory device configured with divided bit line NOR flash memory according to the modified example 6 of the third embodiment of the present invention. As shown in FIG. 49, the schematic circuit configuration of the divided bit line NOR flash memory has the bit lines BL0, BL1, . . . , BL2047 and the sub bit line SUD configured to have a hierarchical structure in the DINOR memory cell array, three select gate lines SGL11, SGL12 and SGL13 on the bottom page side, and three select gate lines SGL01, SGL02 and SGL03 on the top page side both for connecting between the bit lines and the sub bit lines SUD. As shown in FIG. 49, the top page side select gate is divided in three, SGL01, SGL02, and SGL03. In addition, the bottom page side select gate is divided into three, SGL11, SGL12, and SGL13. As with the first embodiment of the present invention, different signals may be supplied to these gates from the select gate control circuit 301 as shown in FIG. 30. Alternatively, as with the second embodiment of the present invention, the select gates short circuit at a predetermined pitch, and a technique is employed to reduce the delay of signals propagated on the select gate line.

In addition, in the DINOR memory cell array, word lines WL0 through WL63 are arranged perpendicular to the bit lines BL0 through BL2047, with a memory cell row connected to each word line. The source region of each memory cell is connected to a common source line SL so as to provide a common electric potential. In FIG. 49, an area 313 enclosed by a dotted line indicates the DINOR memory cell unit. In addition, a closed circle "●" indicates a diffused layer region, and an open circle "○" indicates a contact region.

Modified Example 7 of the Third Embodiment

Figure 50:
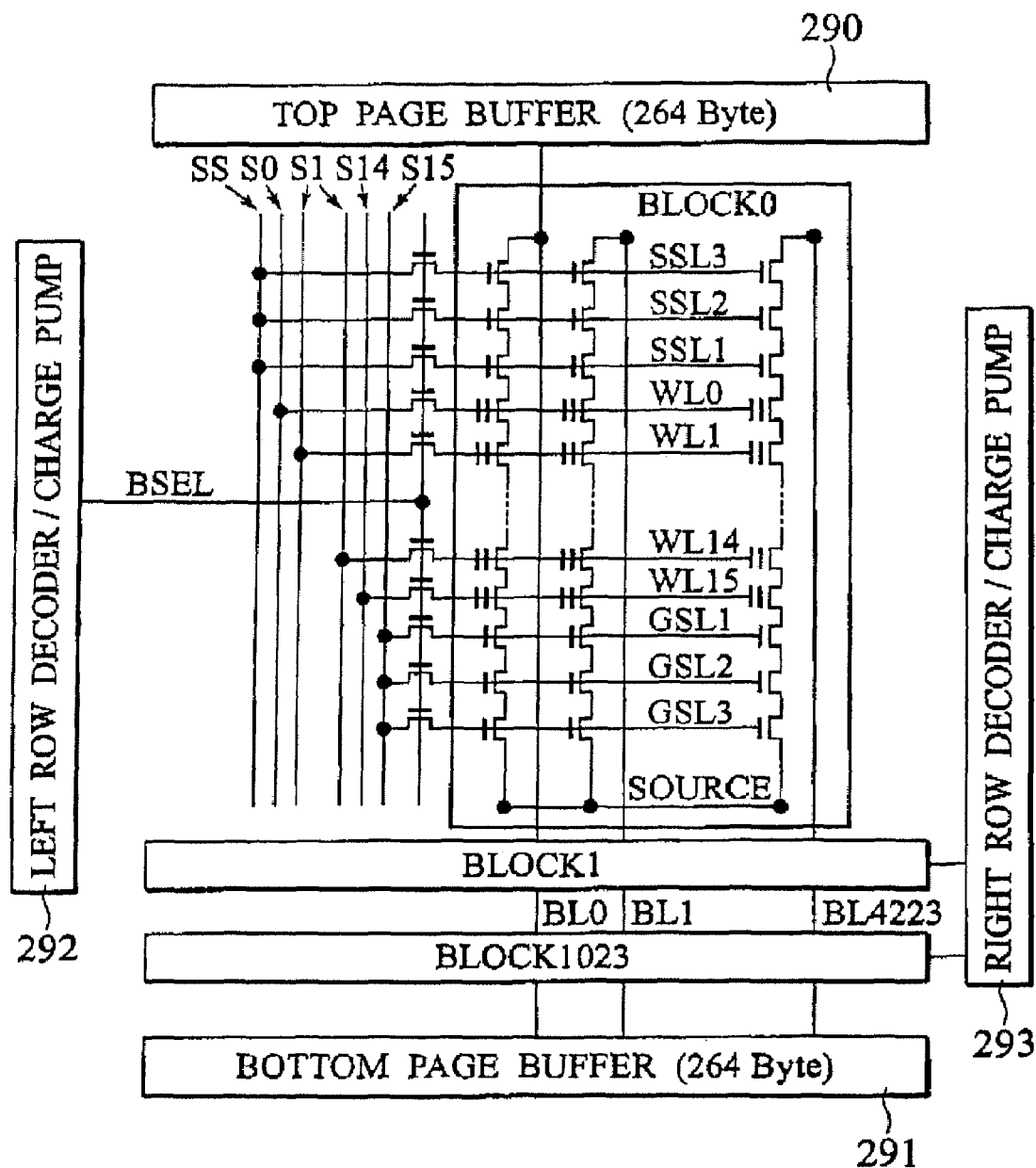
FIG. 50 is an illustrative circuit diagram of the nonvolatile semiconductor memory device configured with 64 -M bit NAND flash memory according to the third embodiment of the present invention.

FIG. 50 is an illustrative circuit diagram of the nonvolatile semiconductor memory device configured with the 64-M bit NAND flash memory according to the modified example 7 of the third embodiment of the present invention; As shown in FIG. 50, the bit line side select gate line is divided in three, SSL1, SSL2, and SSL3. In addition, the source line side select gate line is divided in three, GSL1, GSL2, and GSL3. As with the first embodiment of the present invention, different signals may be supplied to the above gates from the control circuit. Or, as with the second embodiment of the present invention, the select gates may be short circuited at a predetermined pitch, and a technique employed to reduce the delay of signals propagated on the select gate line. In the exemplary circuit configuration of FIG. 50, a technique is employed to supply the same electric potential through the operation of the row select transistor. In FIG. 50, block 0 through block 1023 configured with NAND memory cell arrays are arranged, and a top page buffer 290, bottom page buffer 291, left row decoder/charge pump 292, and right row decoder/charge pump 293 are arranged surrounding the NAND memory cell arrays. In addition, in FIG. 50, word lines WL0 through WL 15 are arranged in parallel with the select gate lines SSL1, SSL2, SSL3, GSL1, GSL2, and GSL3, and bit lines BL0 through BL4223 are arranged perpendicular to such word lines. A feature of FIG. 50 is that the select gate lines SSL1, SSL2, and SSL3 are short circuited, and the select gate lines GSL1, GSL2, and GSL3 are short circuited.

With the modified example 7 of the third embodiment of the present invention, it is possible to improve reliability by preventing a breakdown of the resist and fluctuation in the processing of the gate length of the control gate due to breaks in the regularity of the pattern during gate processing by dividing the gate of the select transistor into first, second, and third select transistors, and synchronizing at least the gate length of the first select transistor near the control gate (in the word line) and the space between the gates with the pitch of the gate length of the control gate and the space between the gates.

By dividing the select transistors, there is no need for the space between the select transistor and neighboring control gate and the gate length of the select transistor for improving the punch-through immunity to be longer than that of the control gate. As a result, it is possible to minimize chip size, and to achieve cost reductions in addition to process and reliability improvements. As the design rule is miniaturized, the effect of the present invention is more pronounced.

Accordingly, with the modified example 7 of the third embodiment of the present invention, it is possible to provide a highly reliable, low cost semiconductor memory device.

Fourth Embodiment

Roughly classified, there are three operation modes of a nonvolatile semiconductor memory device according to the embodiments of the present invention. These modes are termed "page mode", "byte mode", and "EEPROM mode having a ROM regions".

Figure 51:
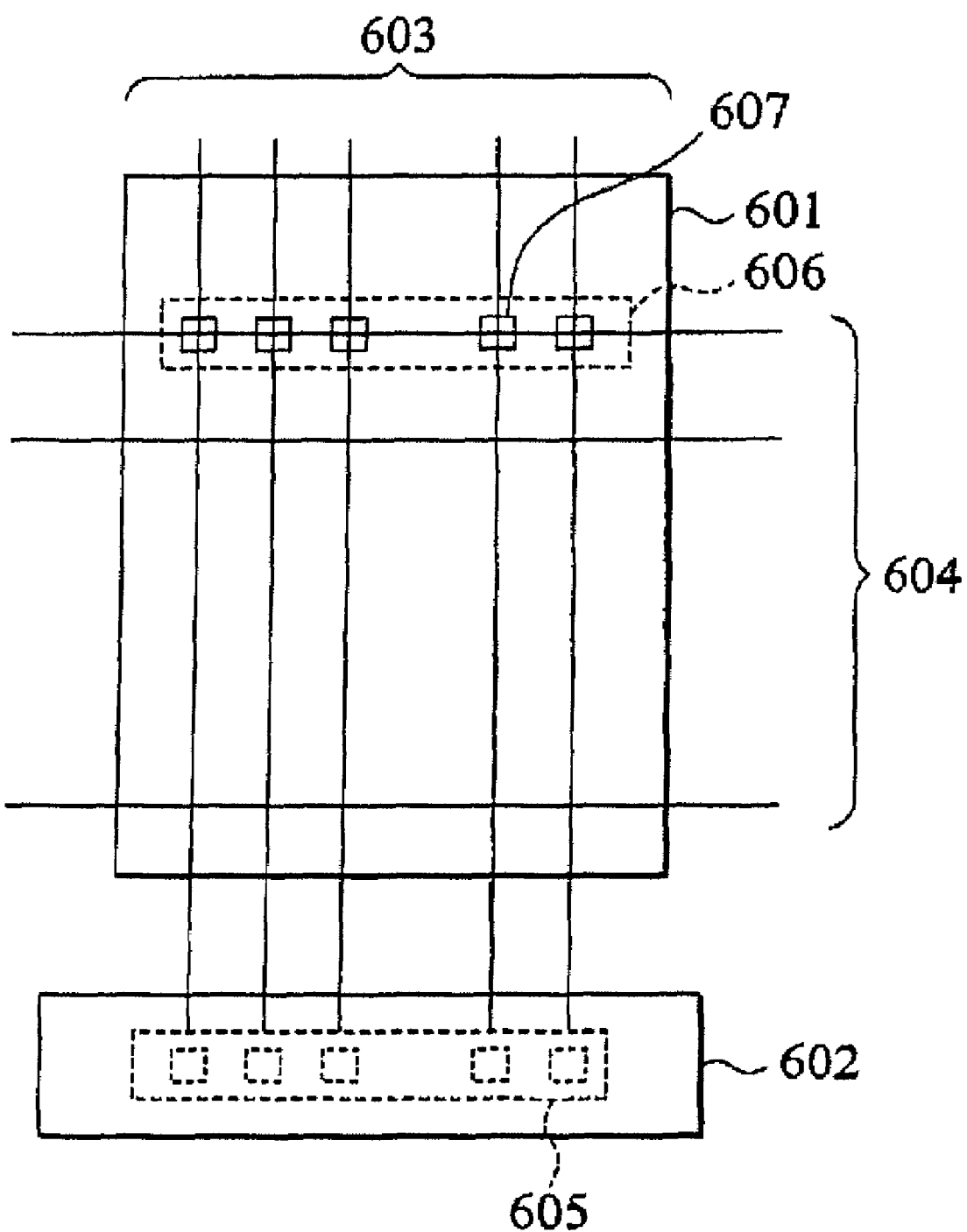
FIG. 51 is an illustrative block diagram of page flash memory used in the nonvolatile semiconductor memory device according to a fourth embodiment of the present invention.

The page mode performs, as shown in FIG. 51, a read operation is performed for each stored memory, at once, of a memory cell row 606 formed on the word line 604 in the flash memory cell array 601 into the sense amplifier 602 as a memory cell row 605 via the bit line 603, or alternatively a write operation from the sense amplifier 602 at once. In other words, reading/writing operation is performed page-by-page. In FIG. 51, memory cells 607 are arranged on the intersections of the word line 604 and bit line 603.

Figure 52:
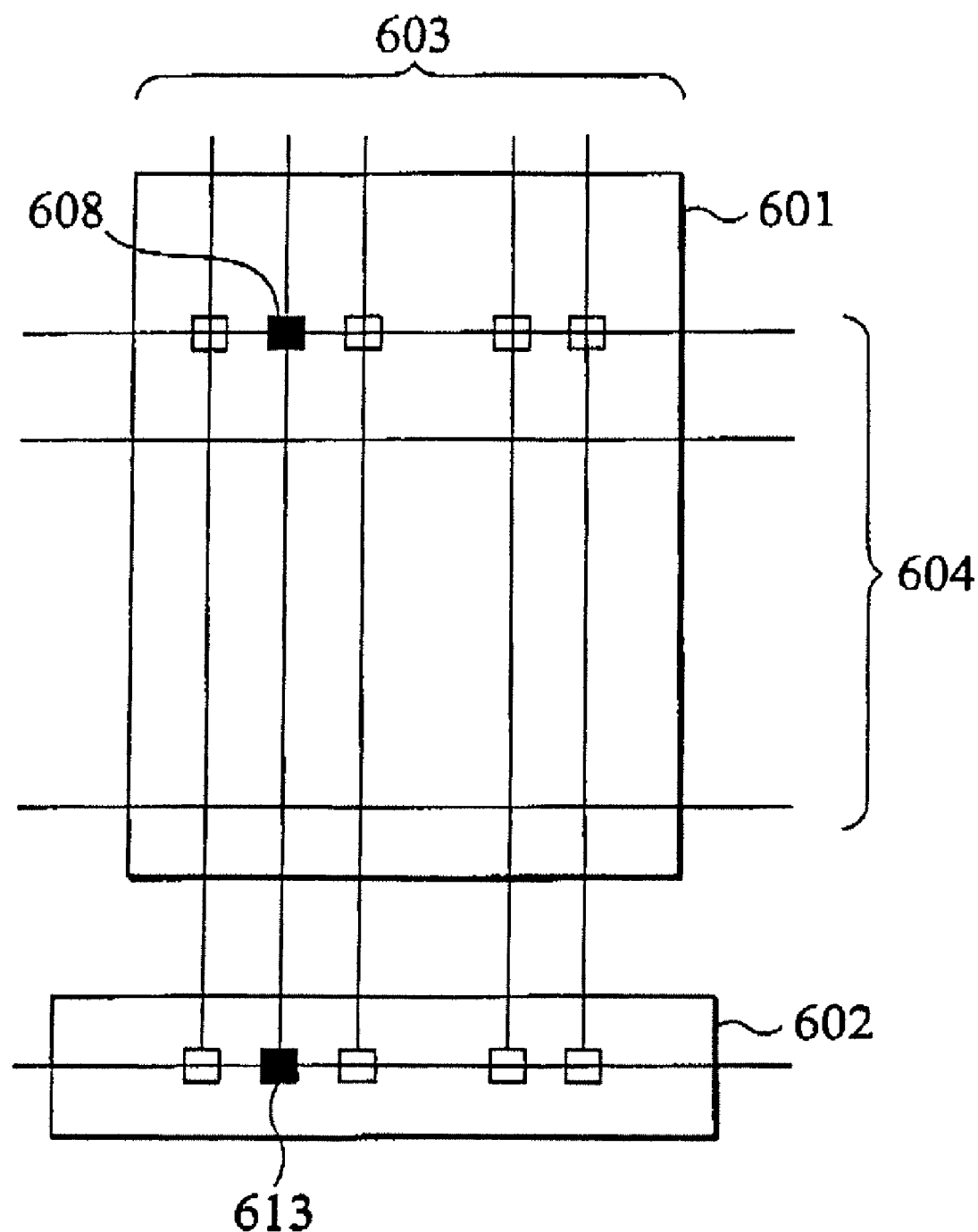
FIG. 52 is an illustrative block diagram of byte flash memory used in the nonvolatile semiconductor memory device according to the fourth embodiment of the present invention.

In contrast, the byte mode performs, as shown in FIG. 52, read operation of the memory cell 608 formed on the word lines 604 in the flash memory cell array 601 is performed to the sense amplifier 602 as the memory cell 613 byte-by-byte, or a write operation from the memory cell 613 in the sense amplifier 602 in the memory cell 608 is performed byte-by-byte. In other words, it is different from the page mode in that reading/writing is performed byte-by-byte.

Figure 53:
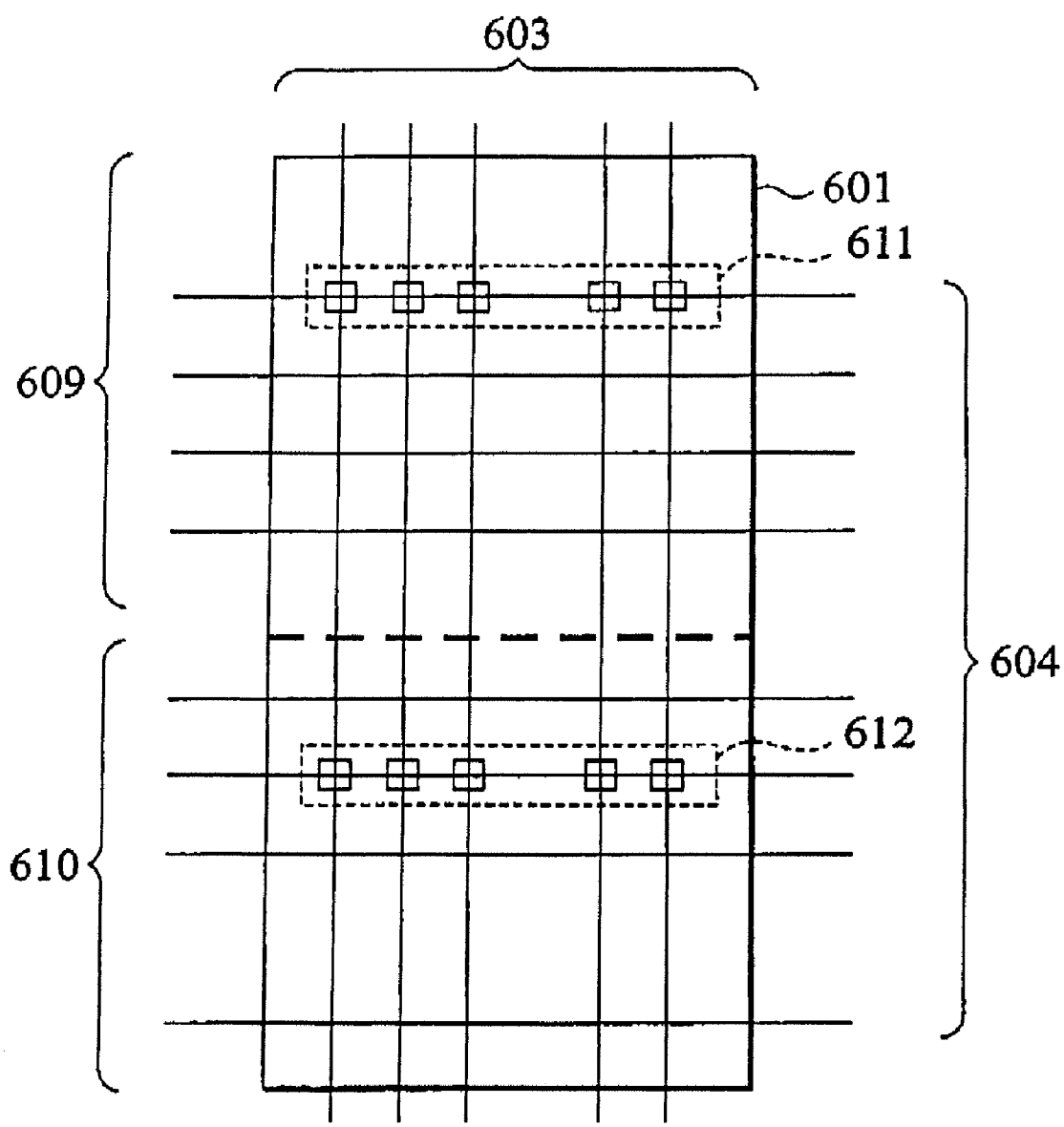
FIG. 53 is an illustrative block diagram of pseudo EEPROM flash memory used in the nonvolatile semiconductor memory device according to the fourth embodiment of the present invention.

In the EEPROM mode having a ROM region, as shown in FIG. 53, operations of reading information from the flash memory cell array 601 page-by-page, or, byte-by-byte, and rewriting the information by dividing the inside of the flash memory cell array 601 into a flash memory 609 section and the EEPROM 610 section are performed. Then systematically switching the EEPROM 610 section having a flash memory 609 is performed so that the EEPROM 610 conducts rewriting operations. An example where the memory cell row 611 on the same word line in the flash memory 609 are read out or written in the EEPROM 610 side as the memory cell row 612 is shown in FIG. 53.

Figure 54:
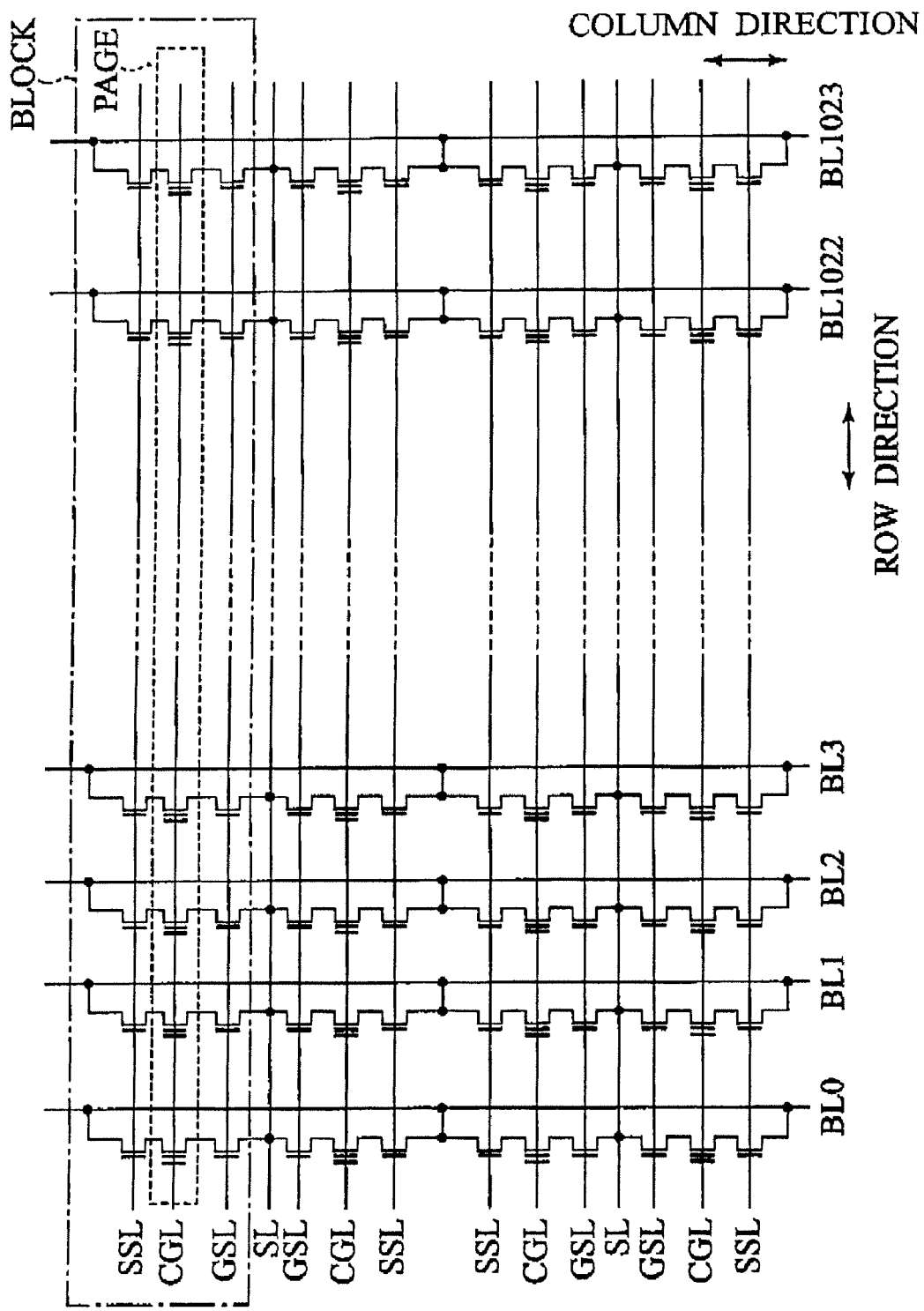
FIG. 54 is a circuit diagram of the pseudo EEPROM flash memory shown in FIG. 53 that is used in the nonvolatile semiconductor memory device according to the fourth embodiment of the present invention.

FIG. 54 is an illustrative circuit diagram of the EEPROM mode flash memory shown in FIG. 53 that is used in the nonvolatile semiconductor memory device according to the fourth embodiment of the present invention. An exemplary circuit shown in FIG. 54 features the use of a three-transistor NAND cell configuration. In other words, a three transistor/cell style NAND memory cell array is configured by arranging two switching transistors for each NAND memory cell. CGL is the control gate line, SSL is the gate line for the source side switching transistor, and GSL is the gate line for the drain side switching transistor. One horizontal block of NAND memory cells on the same CGL line configure one page. Bit lines BL0, BL1, B2, BL3 through BL1022, and BL1023 are arranged vertically. By using three such transistor/cell style NAND memory cells, it is possible to implement the EEPROM mode flash memory cell array 601 as shown in FIG. 53.

Naturally, it is possible to operate the respective nonvolatile semiconductor memory devices according to the first through third embodiments of the present invention in each mode: page mode, byte mode, and EEPROM mode having a ROM region. In addition, in the above-mentioned nonvolatile semiconductor memory device according to the first through third embodiments of the present invention, examples of NAND flash memory, AND flash memory, and divided bit line (DI) NOR flash memory are described, however, it is apparent that it is possible to implement operation modes of page mode, byte mode, and EEPROM mode having a ROM region in any of such three types of flash memory. In particular, as described later, in the case of using the flash memory in applications such as memory cards or IC cards, the EEPROM mode having a ROM region allowing the flash memory to operate systematically is important for configuring system LSI as well as in terms of advancing one-chip integration.

[System LSI]

In the nonvolatile semiconductor memory devices according to the first through third embodiments of the present invention, various application examples are possible. Some of those application examples are shown in FIG. 55 through FIG. 68.

Application Example 1

Figure 58:
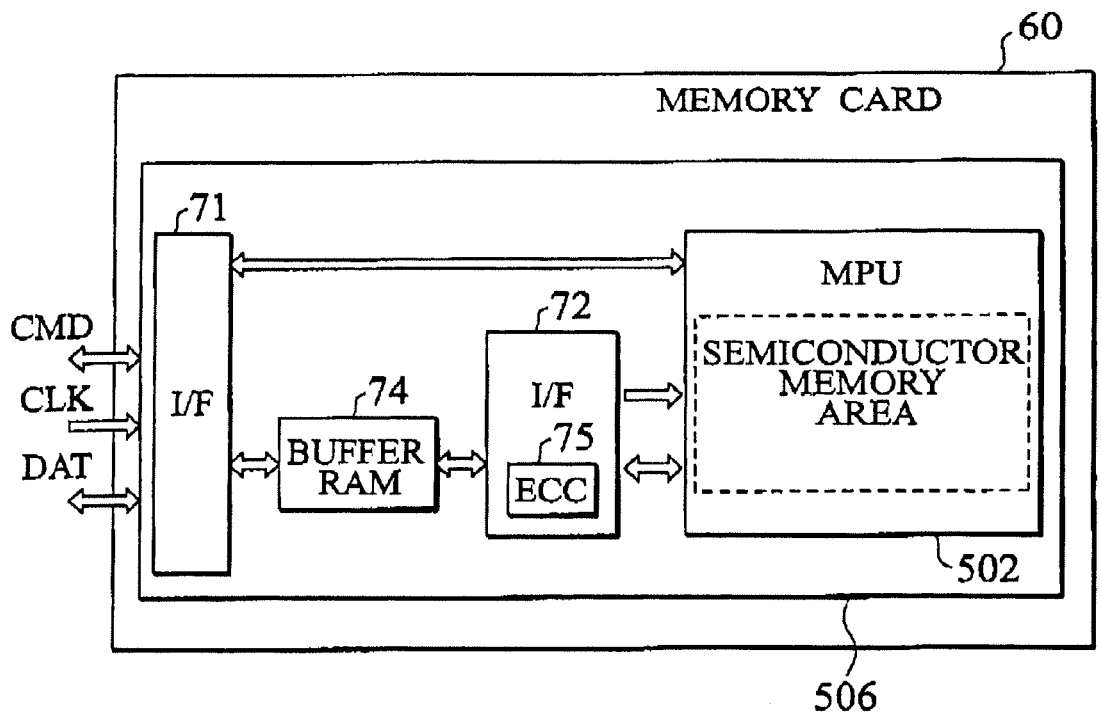
FIG. 58 is an illustrative block diagram showing the internal configuration of a memory card to which is applied the nonvolatile semiconductor memory device according to the fourth embodiment of the present invention.

As an example, a memory card 60 including a semiconductor memory device 50 is configured as shown in FIG. 58. The nonvolatile semiconductor memory device according to the first through third embodiments of the present invention are applicable to the semiconductor memory device 50. The memory card 60 is, as shown in FIG. 55, operable so as to receive a predetermined signal from an external device (not shown in the figure) or to transfer a predetermined signal to an external device (not shown in the figure).

A signal line DAT, a command line enable signal line CLE, an address line enable signal line ALE, and a ready/busy signal line R/B are connected to the memory card 60 in which the semiconductor memory device 50 is embedded. The signal line DAT is used to transfer a data signal, an address signal, or a command signal. The command line enable signal line CLE is used to transmit a signal which indicates that the command signal is being transferred over the signal line DAT. The address line enable signal line ALE is used to transmit a signal which indicates that the address signal is being transferred over the signal line DAT. The ready/busy signal line R/B is used to transmit a signal which indicates whether or not the semiconductor memory device 50 is ready.

Application Example 2

Figure 55:
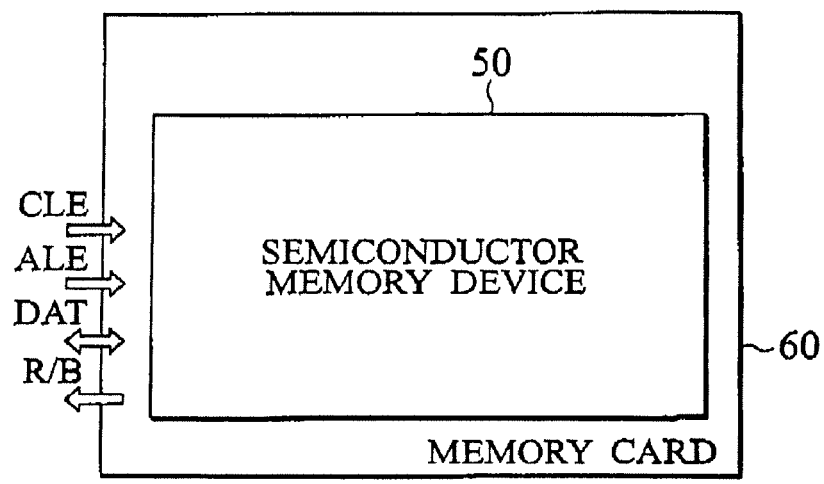
FIG. 55 is an illustrative block diagram showing the internal configuration of a memory card to which is applied a nonvolatile semiconductor memory system according to the fourth embodiment of the present invention.
Figure 56:
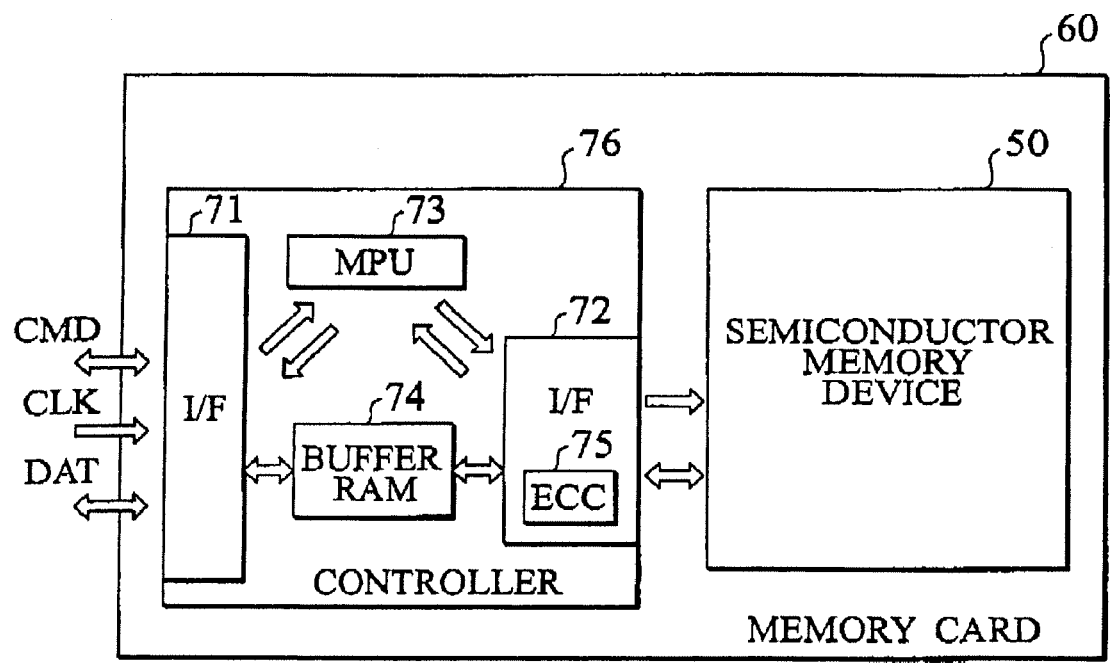
FIG. 56 is an illustrative block diagram showing the internal configuration of a memory card to which is applied the nonvolatile semiconductor memory system according to the fourth embodiment of the present invention.

Another example of the memory card 60 includes, as shown in FIG. 56, a semiconductor memory device 50, and a controller 76 that controls the semiconductor memory device 50, and transfers a prescribed signal with an external device, unlike the example of the memory card of FIG. 55. The controller 76 has interface units 71 and 72, a microprocessor unit (MPU) 73, buffer RAM 74, and an error correction code unit (ECC) 75 included in the interface unit (I/F) 72.

The interface unit (I/F) 71 transfers a prescribed signal to an external device, and the interface unit (I/F) 72 transfers a prescribed signal to the semiconductor memory device 50. The microprocessor unit (MPU) 73 converts a logic address to a physical address. The buffer RAM 74 temporarily stores data. The error correction code unit (ECC) 75 generates an error correction code.

A command line CMD, clock signal line CLK, and signal line DAT are connected to the memory card 60. The number of control signal lines, bit length of signal line DAT, and circuit configuration of the controller 76 may be modified as desired.

Application Example 3

Figure 57:
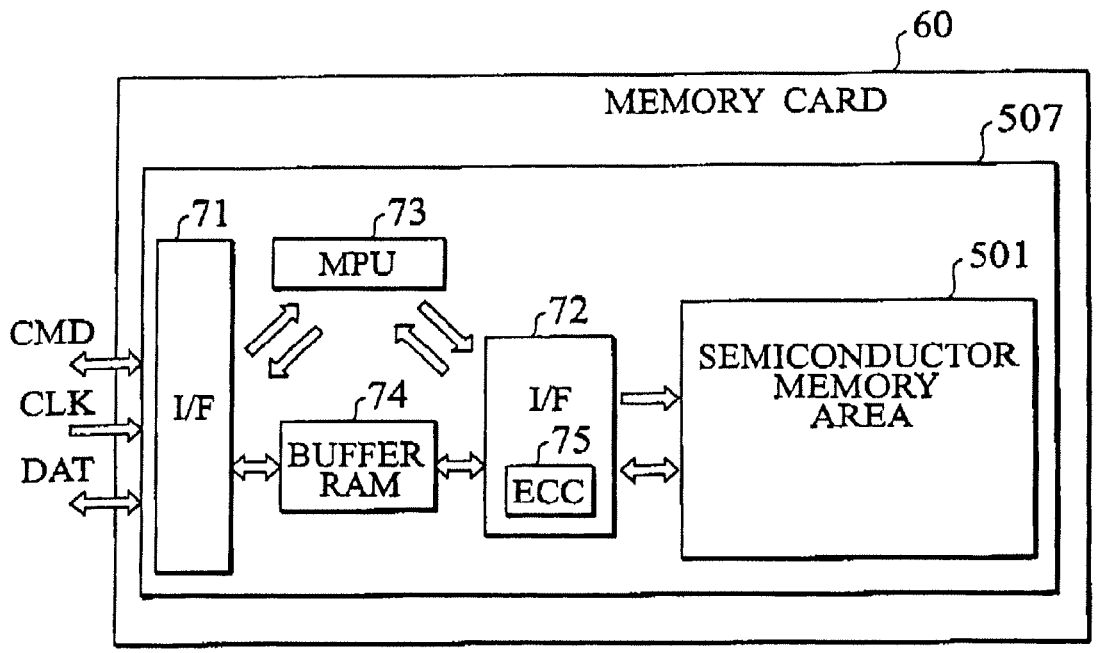
FIG. 57 is an illustrative block diagram showing the internal configuration of a memory card to which is applied the nonvolatile semiconductor memory system according to the fourth embodiment of the present invention.

Another exemplary configuration of the memory card 60 implements, as shown in FIG. 57, a system LSI chip 507 by integrating interface units (I/F) 71 and 72, a microprocessor unit (MPU) 73, buffer RAM 74, error correction code unit (ECC) 75 included in the interface unit (I/F) 72, and semiconductor memory device region 501 all onto one chip. Such a system LSI chip 507 is loaded in the memory card 60.

Application Example 4

Another exemplary configuration of the memory card 60 implements, as shown in FIG. 58, a mixed memory loading MPU 502, provided by forming the semiconductor memory device region 501 in the microprocessor unit (MPU) 73, and implements a system LSI chip 506 by integrating interface units (I/F) 71 and 72, a buffer RAM 74, and an error correction code unit (ECC) 75 included in the interface unit (I/F) 72 all onto one chip. Such system LSI chip 506 is loaded in the memory card 60.

Application Example 5

Figure 59:
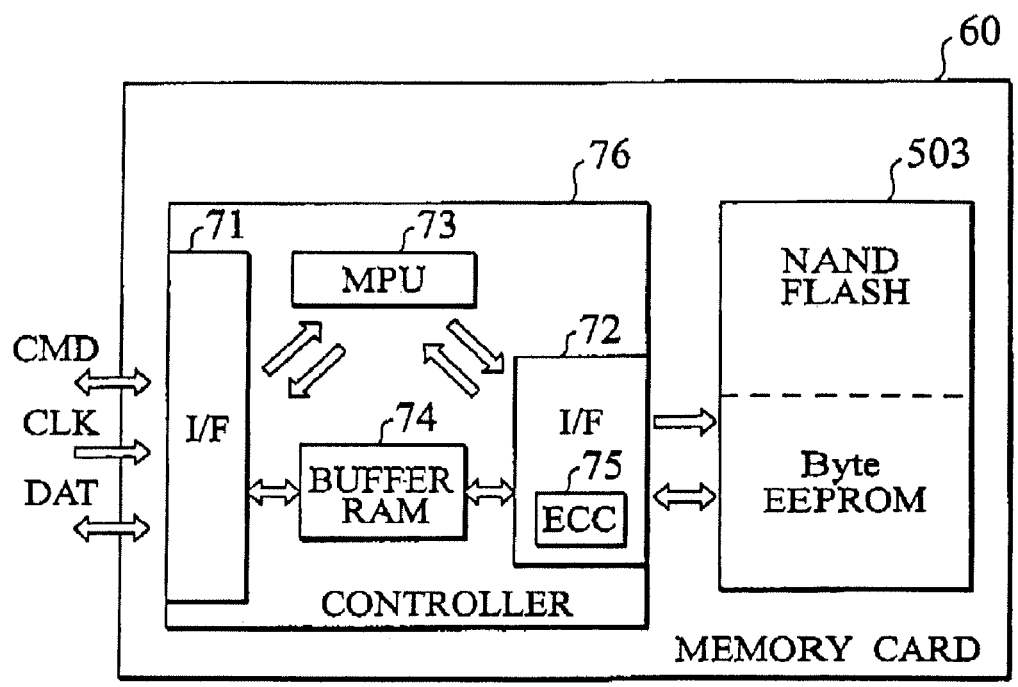
FIG. 59 is an illustrative block diagram showing the internal configuration of a memory card to which is applied the nonvolatile semiconductor memory device according to the fourth embodiment of the present invention.

Another exemplary configuration of the memory card 60 utilizes, as shown in FIG. 59, an EEPROM mode flash memory 503, configured with NAND flash memories and byte EEPROM, instead of the semiconductor memory device 50 shown in FIG. 55 or FIG. 56.

Naturally, it is possible to configure the system LSI chip 507 by forming the EEPROM mode flash memory 503 in the same chip as the controller 76, as shown in FIG. 57, and integrating them onto one chip. In addition, as shown in FIG. 58, naturally, it is possible to implement a mixed memory loading MPU 502 by forming a semiconductor memory region configured with EEPROM mode flash memories 503 in the microprocessor unit (MPU) 73, and to configure a system LSI chip 506 by integrating the interface units (I/F) 71 and 72 and buffer RAM 74 all onto one chip.

Application Example 6

Figure 60:
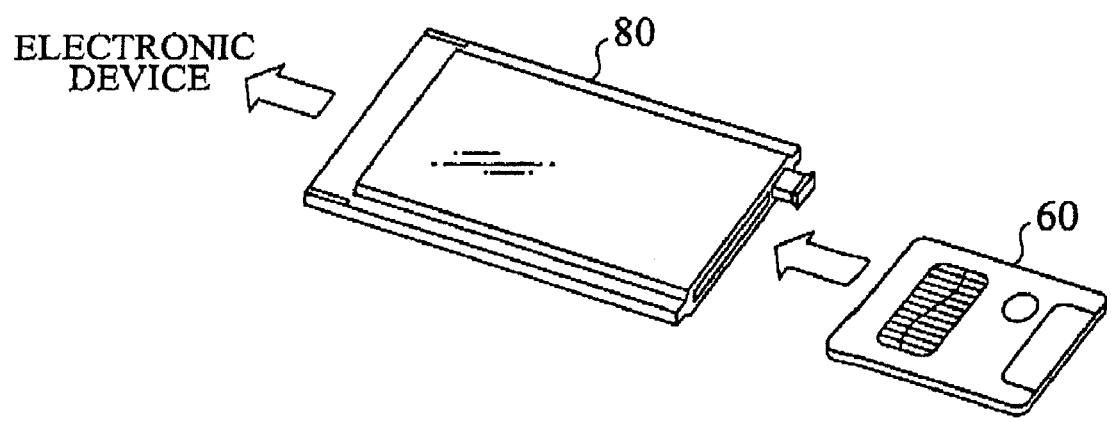
FIG. 60 is an illustrative block diagram of a memory card and card holder to which is applied the nonvolatile semiconductor memory device according to the fourth embodiment of the present invention.

As an application example of the memory card 60 shown in FIG. 56 through FIG. 59, a memory card holder 80 may be proposed, as shown in FIG. 60. The memory card holder 80 may receive the memory card 60, which uses the nonvolatile semiconductor memory device described in detail in the first through third embodiments of the present invention as a semiconductor memory device 50. The memory card holder 80 is connected to an electronic device (not shown in the figure), and is operable as an interface between the memory card 60 and the electronic device. The memory card holder 80 is capable of executing various functions including functions such as those of the controller 76, microprocessor unit (MPU) 73, buffer RAM 74, error correction code unit (ECC) 75, and interface units (I/F) 71 and 72 in the memory card 60 disclosed in FIG. 56 through FIG. 59.

Application Example 7

Figure 61:
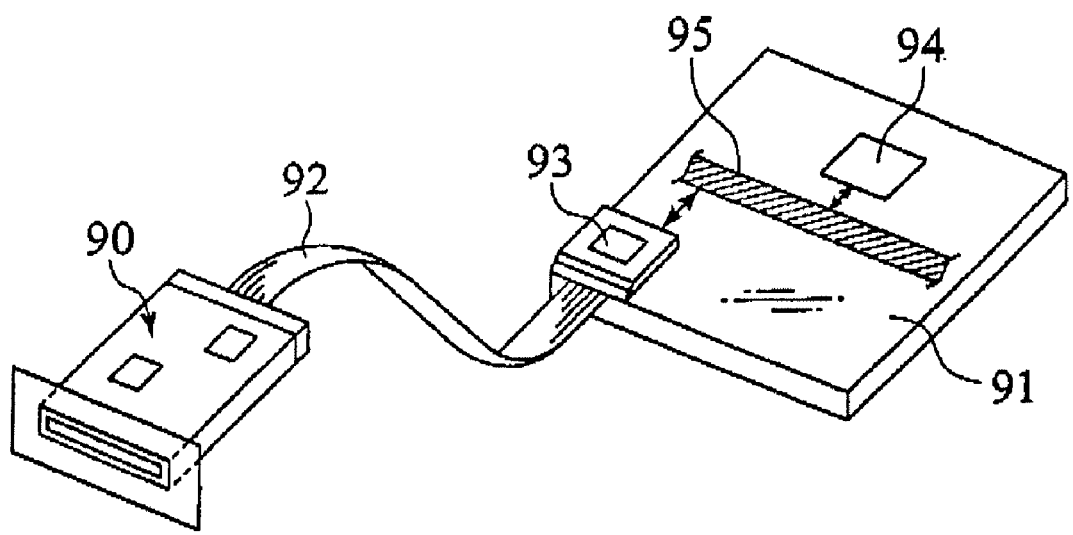
FIG. 61 is an illustrative block diagram of a connecting device operable to receive the memory card and card holder to which is applied the nonvolatile semiconductor memory device according to the fourth embodiment of the present invention.

Another application example is described while referencing FIG. 61. In FIG. 61, a connecting apparatus 90 capable of receiving the memory card 60 or memory card holder 80 is disclosed. A nonvolatile semiconductor memory device described in detail in the first through third embodiments of the present invention is embedded in either the memory card 60 or memory card holder 80 and 18 used as the semiconductor memory device 50, semiconductor memory device region 501, mixed memory loading MPU 502, and/or EEPROM mode flash memory 503.

The memory card 60 or memory card holder 80 is attached to the connecting apparatus 90, and connected electrically. The connecting apparatus 90 is connected to a circuit board 91 which mounts a CPU 94 and bus 95 via a connecting wire 92 and interface circuit 93.

Application Example 8

Figure 62:
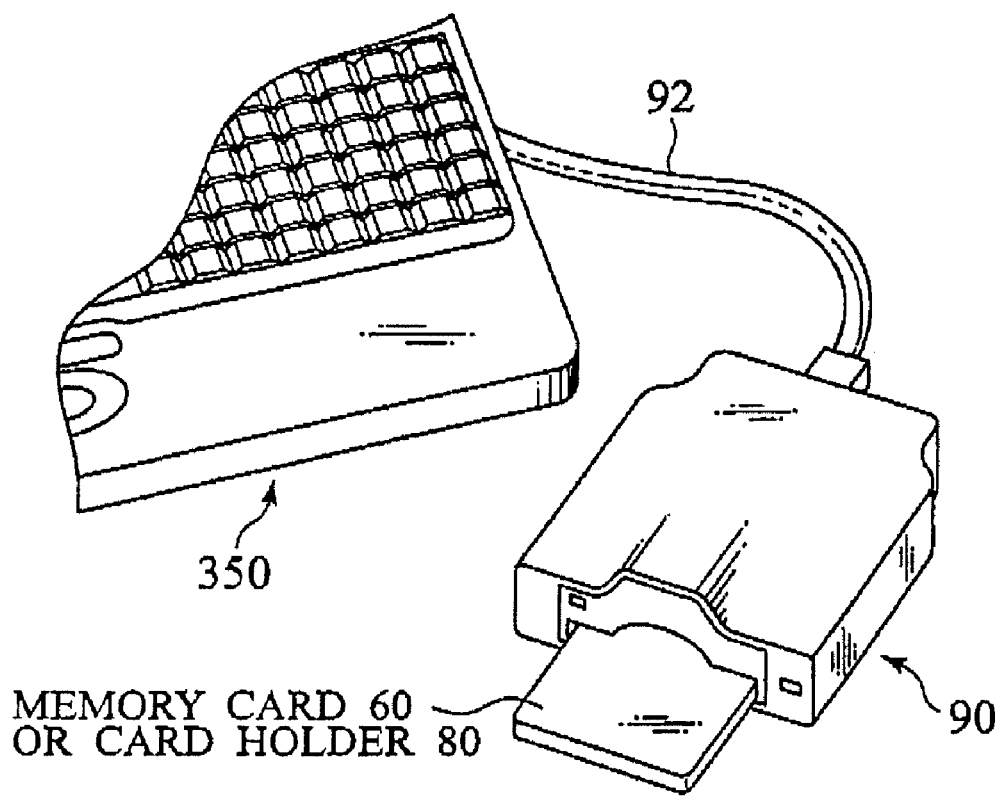
FIG. 62 is an illustrative diagram of a coupling device, for connecting to a personal computer via a connecting wire, with an internal memory card to which is applied the nonvolatile semiconductor memory device according to the fourth embodiment of the present invention.

Another application example is described while referencing FIG. 62. A nonvolatile semiconductor memory device described in detail in the first through third embodiments of the present invention is embedded in either the memory card 60 or memory card holder 80 as the semiconductor memory device 50, semiconductor memory device region 501, mixed memory loading MPU 502, and/or EEPROM mode flash memory 503. The memory card 60 or memory card holder 80 is attached to the connecting apparatus 90, and connected electrically. The connecting apparatus 90 is connected to a personal computer (PC) 350 via a connecting wire 92.

Application Example 9

Figure 63:
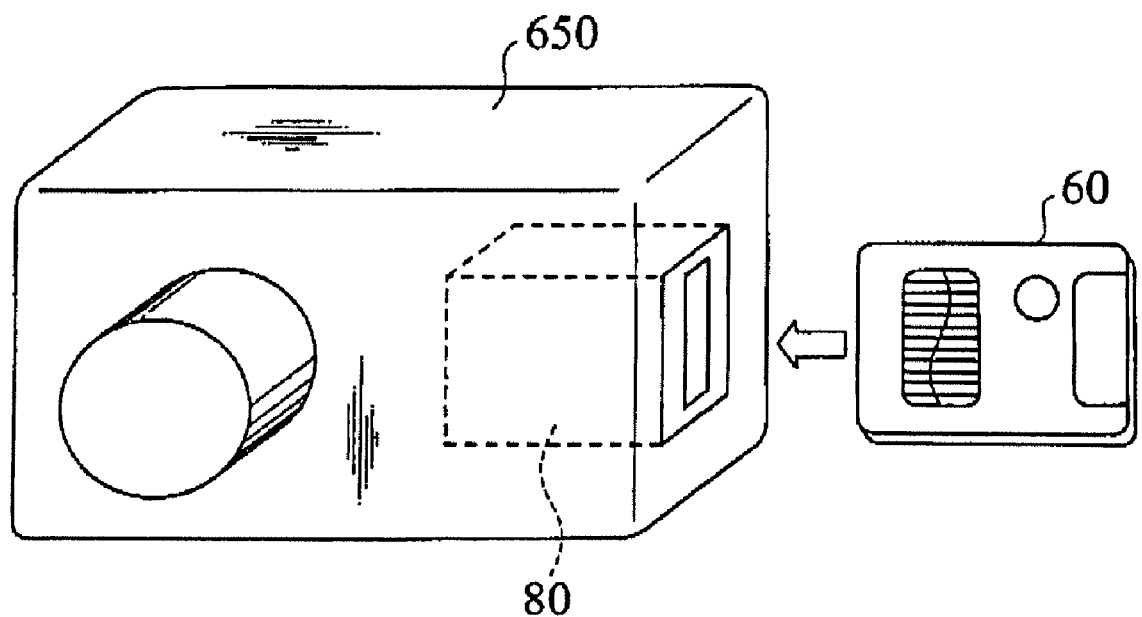
FIG. 63 is a digital camera system which allows the loading of a memory card to which is applied the nonvolatile semiconductor memory device according to the fourth embodiment of the present invention.

Another application example is described while referencing FIG. 63. A nonvolatile semiconductor memory device described in detail in the first through third embodiments of the present invention is embedded in the memory card 60 with the semiconductor memory device 50, or semiconductor memory device region 501, mixed memory loading MPU 502, and EEPROM mode flash memory 503. FIG. 63 shows an example of applying such memory card 60 to a digital camera 650 in which the memory card holder 80 is embedded.

Application Example 10

Figure 64:
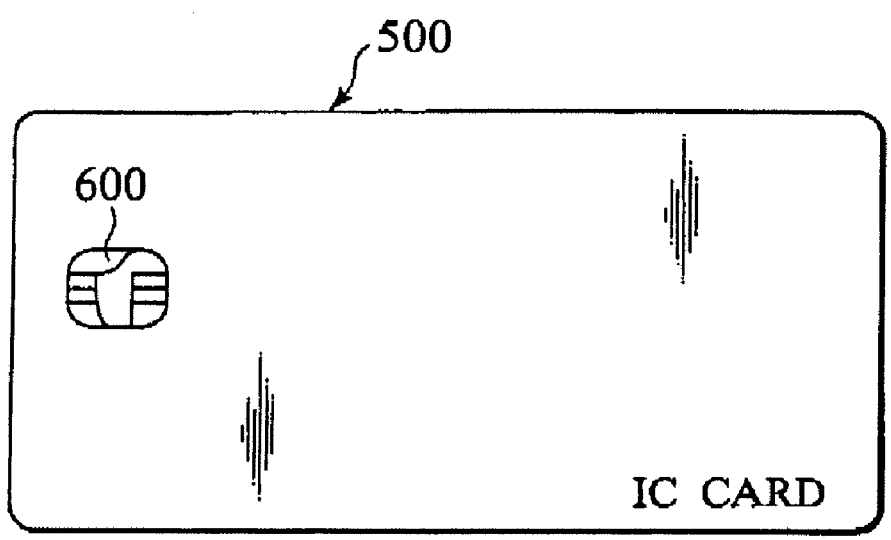
FIG. 64 is an illustrative block diagram of an IC card to which is applied the nonvolatile semiconductor memory device according to the fourth embodiment of the present invention.
Figure 65:
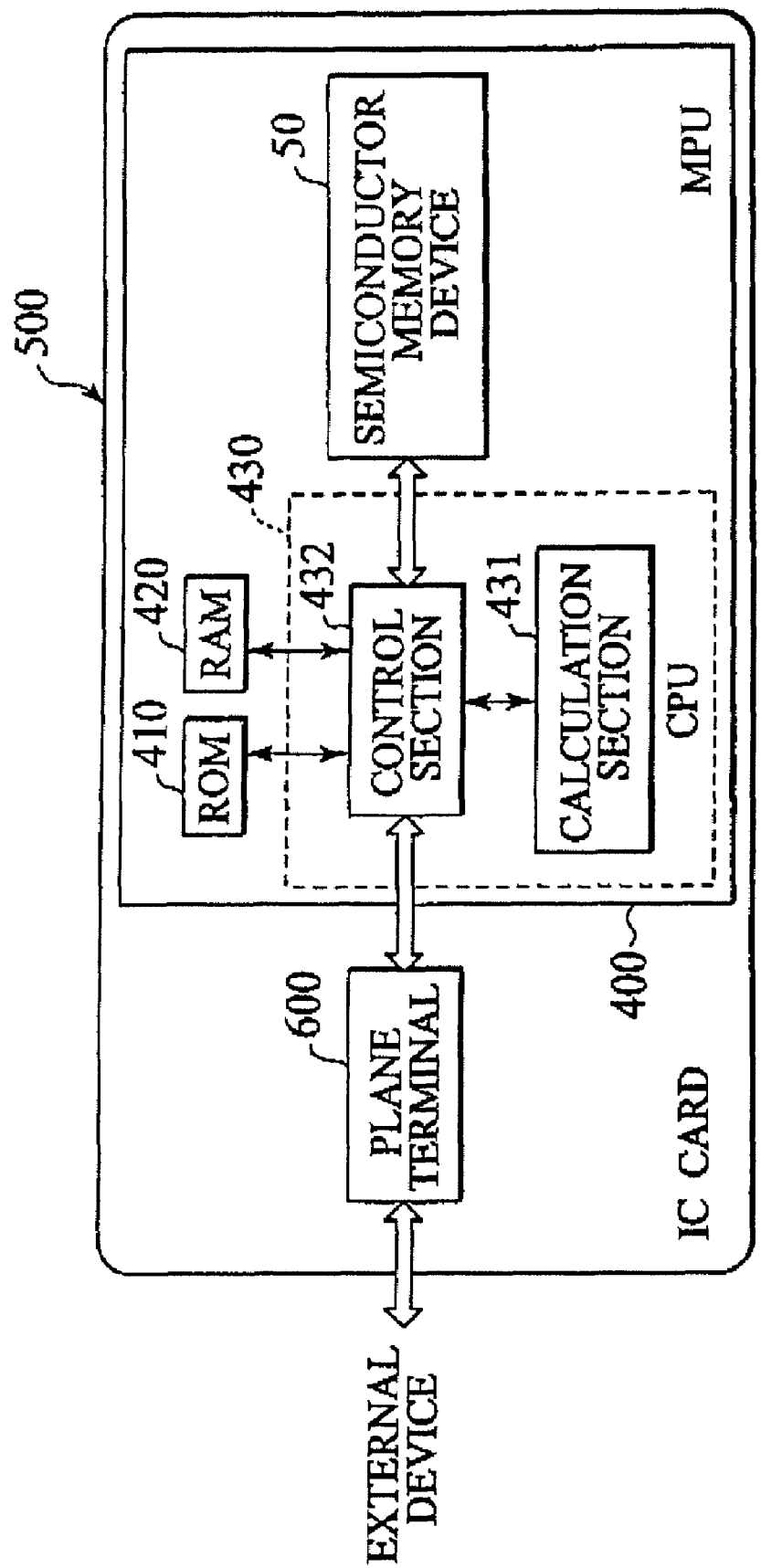
FIG. 65 is an illustrative block diagram showing the internal configuration of an IC card to which is applied the nonvolatile semiconductor memory device according to the fourth embodiment of the present invention.

Another application example of the nonvolatile semiconductor memory device according to the first through third embodiment of the present invention configures, as shown in FIG. 64 and FIG. 65, an interface circuit (IC) card 500 which includes an MPU 400 configured with a semiconductor memory device 50, ROM 410, RAM 420, and CPU 430, and a plane terminal 600. The IC card 500 may be connected to an external device via the plane terminal 600. In addition, the plane terminal 600 is coupled to the MPU 400 of the IC card 500. The CPU 430 has a calculation section 431 and control section 432. The control section 432 is coupled to the semiconductor memory device 50, ROM 410, and RAM 420. It is desirable that the MPU 400 be molded on one of the surfaces of the IC card 500, and the plane terminal 600 be manufactured on the other surface of the IC card 500. As shown in FIG. 65, the nonvolatile semiconductor memory device described in detail in the first through third embodiments of the present invention is applicable to the semiconductor memory device 50 or ROM 410. In addition, it is possible for the nonvolatile semiconductor memory device to operate in page mode, byte mode, or EEPROM mode having a ROM region.

Application Example 11

Figure 66:
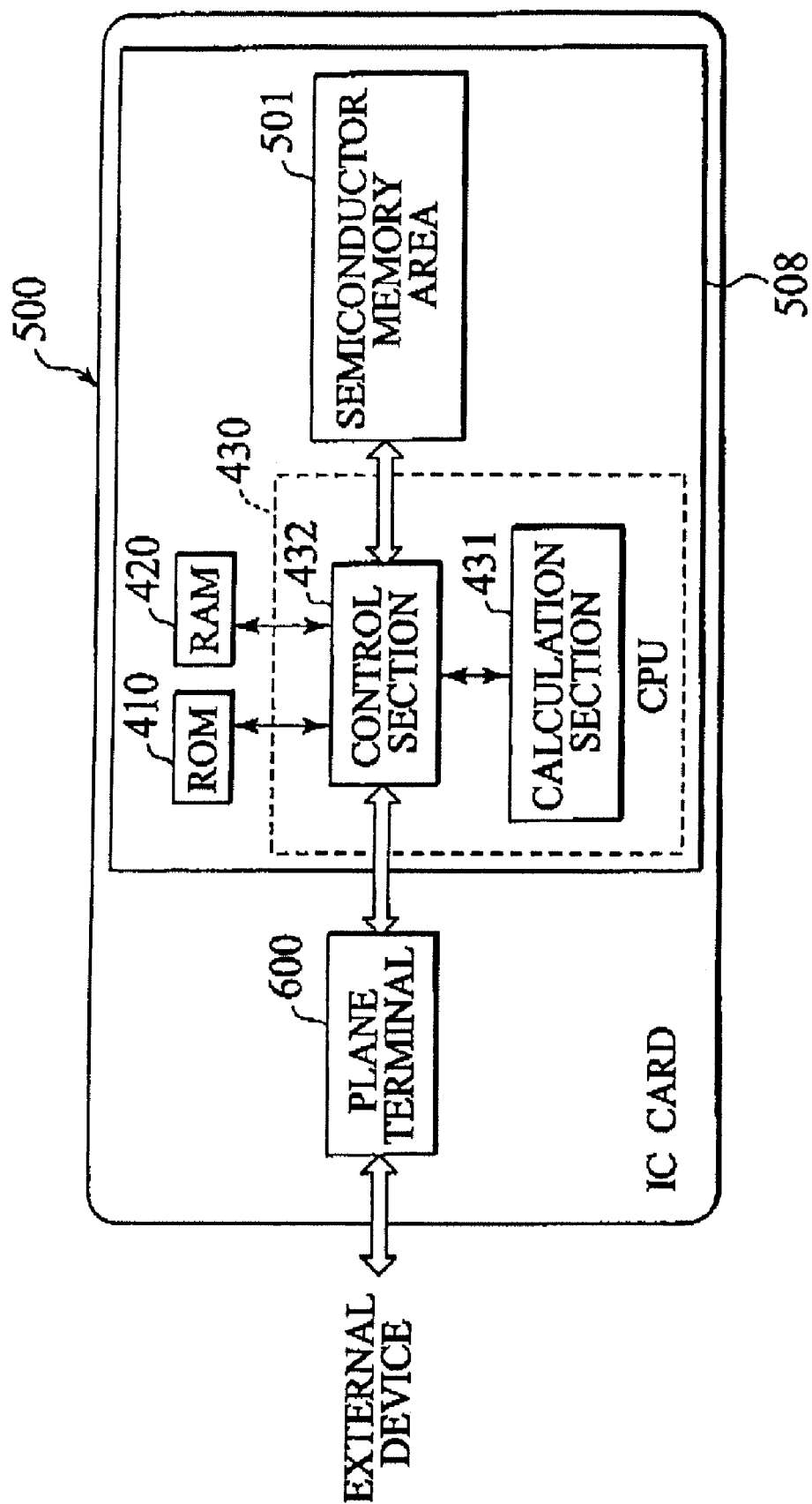
FIG. 66 is an illustrative block diagram showing the internal configuration of an IC card to which is applied the nonvolatile semiconductor memory device according to the fourth embodiment of the present invention.

Another exemplary configuration of the IC card 500 includes, as shown in FIG. 66, a system LSI chip 508 with ROM 410, RAM 420, a CPU 430, and a semiconductor memory device region 501 integrated onto one chip. Such system LSI chip 508 is embedded in the IC card 500. As shown in FIG. 66, the nonvolatile semiconductor memory device described in detail in the first through third embodiments of the present invention is applicable to the semiconductor memory device region 501 and ROM 410. In addition, it is possible for the nonvolatile semiconductor memory device to operate in page mode, byte mode, or pseudo EEPROM mode having a ROM region.

Application Example 12

Figure 67:
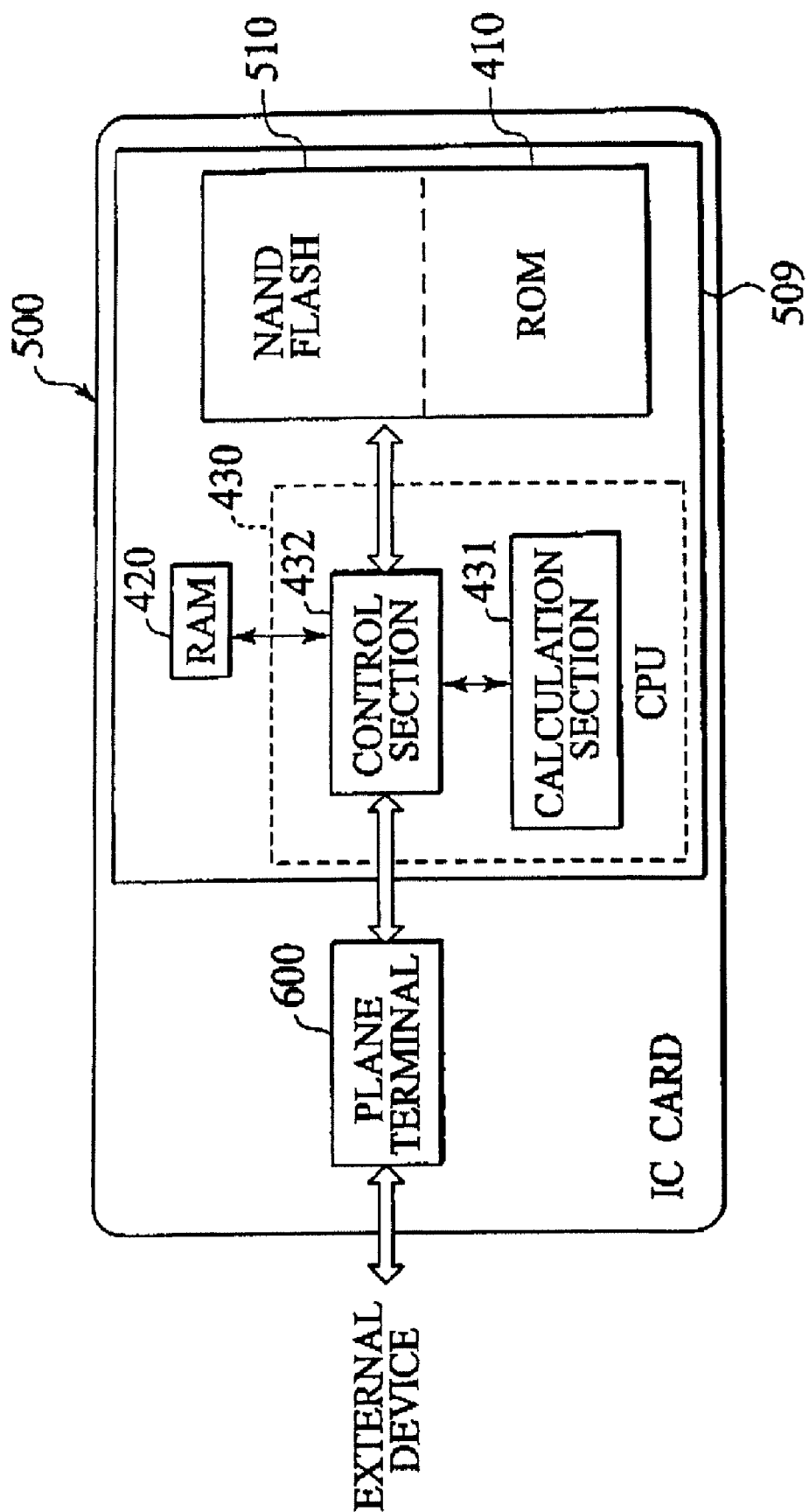
FIG. 67 is an illustrative block diagram showing the internal configuration of an IC card to which is applied the nonvolatile semiconductor memory device according to the fourth embodiment of the present invention.

Another exemplary configuration of the IC card 500, as shown in FIG. 67, has an overall EEPROM mode flash memory 510 configuration with an embedded ROM 410 in the semiconductor memory device region 50, and configures a system LSI chip 509 by integrating the EEPROM mode flash memory 510, RAM 420, and CPU 430 all onto one chip. Such system LSI chip 509 is embedded in the IC card 500.

Application Example 13

Figure 68:
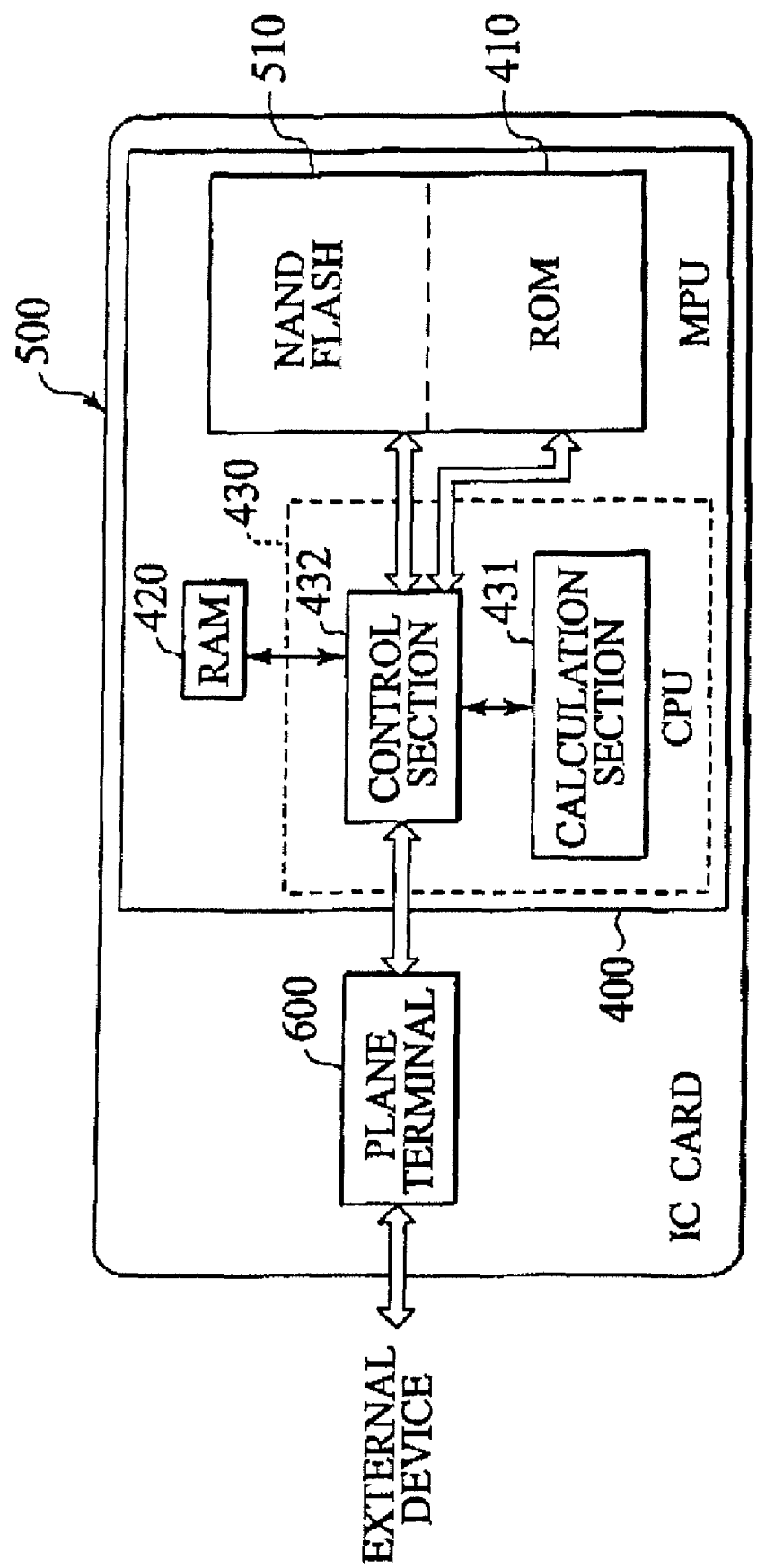
FIG. 68 is an illustrative block diagram showing the internal configuration of an IC card to which is applied the nonvolatile semiconductor memory device according to the fourth embodiment of the present invention.

Another exemplary configuration of the IC card 500, as shown in FIG. 68, has an overall EEPROM mode flash memory 510 configuration with an embedded ROM 410 in the semiconductor memory device 50 shown in FIG. 65. Such EEPROM flash memory 510 is embedded in the MPU 400 as with FIG. 65.

Other implementations are readily discernable to one of those skilled in the art when the present description is read in view of the description in U.S. Pat. No. 6,002,605, which is incorporated herein by reference in its entirely.

Other Embodiments

As described above, it is clear that the present invention includes various examples or the like which are not described herein. Accordingly, the technical scope of the present invention is determined by the appended claims valid based on the above description.

Various modifications will become possible for those skilled in the art after receiving the teachings of the present disclosure without departing from the scope thereof.

What is claimed is:

1. A nonvolatile semiconductor memory embedded in a card operable so as to receive and transfer a predetermined signal from an external device, and the nonvolatile semiconductor memory comprising:
   a plurality of word lines disposed in a row direction;
   a plurality of bit lines disposed in a column direction perpendicular to the word lines;
   memory cell transistors having a source region, a drain region, a gate electrode and a charge storage layer, provided in the column direction and an electronic storage condition of the memory cell transistor configured to be controlled by one of the plurality of the word lines connected to the memory cell;
   a plurality of first select transistors, each including a gate electrode, selecting the memory cell transistors provided in the column direction, arranged in the column direction and adjacent to the memory cell transistors at a first end of the memory cell transistors; and
   a first select gate line connected to each of the gate electrodes of the first select transistors, wherein
   the plurality of the word lines have a wiring line width which is the same as the first select gate line.

2. The nonvolatile semiconductor memory of claim 1, wherein a signal line DAT, a command line enable signal line CLE, an address line enable signal line ALE, and a ready/busy signal line R/B are connected to the card.

3. The nonvolatile semiconductor memory of claim 2, wherein the signal line DAT transfers a data signal, an address signal, or a command signal, the command line enable signal line CLE transmits a signal which indicates that the command signal is being transferred over the signal line DAT, the address line enable signal line ALE transmits a signal which indicates that the address signal is being transferred over the signal line DAT, and the ready/busy signal line R/B transmits a signal which indicates whether or not the nonvolatile semiconductor memory is ready.

4. The nonvolatile semiconductor memory of claim 1, wherein the card further comprises a controller.

5. The nonvolatile semiconductor memory of claim 4, wherein the controller controls the nonvolatile semiconductor memory and transfers a prescribed signal with the external device.

6. The nonvolatile semiconductor memory of claim 4, wherein the controller comprises an input and an output interface units (I/F), a microprocessor unit (MPU), and a buffer RAM.

7. The nonvolatile semiconductor memory of claim 6, wherein the output interface unit comprises an error correction code unit (ECC).

8. The nonvolatile semiconductor memory of claim 7, wherein the input interface unit transfers the prescribed signal to the external device, and the output interface unit transfers the prescribed signal to the nonvolatile semiconductor memory, the microprocessor unit (MPU) converts a logic address to a physical address, the buffer RAM temporarily stores data, and the error correction code unit (ECC) generates an error correction code.

9. The nonvolatile semiconductor memory of claim 6, wherein a command line CMD, and a clock signal line CLK are connected to the card.

10. The nonvolatile semiconductor memory of claim 7, wherein the card implements a system LSI chip by integrating the input and output interface units (I/F), the microprocessor unit (MPU), the buffer RAM, the error correction code unit (ECC) included in the output interface unit (I/F), and the nonvolatile semiconductor memory all onto one chip.

11. A nonvolatile semiconductor memory formed in a mixed memory loading microprocessor unit (MPU) embedded in a card, and the nonvolatile semiconductor memory comprising:
   a plurality of word lines disposed in a row direction;
   a plurality of bit lines disposed in a column direction perpendicular to the word lines;
   memory cell transistors having a source region, a drain region, a gate electrode and a charge storage layer, provided in the column direction and an electronic storage condition of the memory cell transistor configured to be controlled by one of the plurality of the word lines connected to the memory cell;
   a plurality of first select transistors, each including a gate electrode, selecting the memory cell transistors provided in the column direction, arranged in the column direction and adjacent to the memory cell transistors at a first end of the memory cell transistors; and
   a first select gate line connected to each of the gate electrodes of the first select transistors, wherein
   the plurality of the word lines have a wiring line width which is the same as the first select gate line.

12. The nonvolatile semiconductor memory of claim 11, wherein the card implements a system LSI chip by integrating an input and output interface units (I/F), the mixed memory loading microprocessor unit (MPU), a buffer RAM, and an error correction code unit (ECC) included in the output interface unit (I/F) all onto one chip.

13. A nonvolatile semiconductor memory formed in a microprocessor unit (MPU) embedded in a card comprising:
   a plurality of word lines disposed in a row direction;
   a plurality of bit lines disposed in a column direction perpendicular to the word lines;
   memory cell transistors having a source region, a drain region, a gate electrode and a charge storage layer, provided in the column direction and an electronic storage condition of the memory cell transistor configured to be controlled by one of the plurality of the word lines connected to the memory cell;
   a plurality of first select transistors, each including a gate electrode, selecting the memory cell transistors provided in the column direction, arranged in the column direction and adjacent to the memory cell transistors at a first end of the memory cell transistors; and
   a first select gate line connected to each of the gate electrodes of the first select transistors, wherein
   the plurality of the word lines have a wiring line width which is the same as the first select gate line.

14. The nonvolatile semiconductor memory of claim 13, wherein the microprocessor unit (MPU) further comprises, a ROM, a RAM, and a CPU.

15. The nonvolatile semiconductor memory of claim 14, the card further comprises a plane terminal coupled to the microprocessor unit (MPU).

16. The nonvolatile semiconductor memory of claim 14, wherein the card is connected to an external device via the plane terminal.

17. The nonvolatile semiconductor memory of claim 14, wherein the CPU comprises a calculation section and a control section.

18. The nonvolatile semiconductor memory of claim 17, wherein the control section is coupled to the nonvolatile semiconductor memory, the ROM, and the RAM.

19. The nonvolatile semiconductor memory of claim 14, wherein the card implements a system LSI chip by integrating the ROM, the RAM, the CPU, and the nonvolatile semiconductor memory all onto one chip.

20. The nonvolatile semiconductor memory of claim 14, wherein the ROM is coupled to the nonvolatile semiconductor memory to form an overall EEPROM mode flash memory.

* * * * *

UNITED STATES PATENT AND TRADEMARK OFFICE
CERTIFICATE OF CORRECTION

PATENT NO. : 7,498,630 B2 Page 1 of 1
APPLICATION NO. : 11/559785
DATED : March 3, 2009
INVENTOR(S) : Ichige et al.

It is certified that error appears in the above-identified patent and that said Letters Patent is hereby corrected as shown below:

On the title page, the Terminal Disclaimer information has been omitted. Item (45) and the Notice information should read as follows:

-- (45) **Date of Patent: * Mar. 3, 2009**

( * ) Notice: Subject to any disclaimer, the term of this patent is extended or adjustment under 35 U.S.C. 154(b) by 0 days.

This patent is subject to a terminal disclaimer --

Signed and Sealed this

Twenty-eighth Day of April, 2009

JOHN DOLL
*Acting Director of the United States Patent and Trademark Office*